(12) United States Patent
Masuoka et al.

(10) Patent No.: US 8,395,208 B2
(45) Date of Patent: Mar. 12, 2013

(54) SEMICONDUCTOR DEVICE AND METHOD OF PRODUCING THE SAME

(75) Inventors: Fujio Masuoka, Tokyo (JP); Shintaro Arai, Tokyo (JP); Hiroki Nakamura, Tokyo (JP); Tomohiko Kudo, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 0 days.

(21) Appl. No.: 13/478,359

(22) Filed: May 23, 2012

(65) Prior Publication Data

US 2012/0299068 A1 Nov. 29, 2012

Related U.S. Application Data

(60) Division of application No. 12/699,611, filed on Feb. 3, 2010, now Pat. No. 8,211,758, and a continuation of application No. PCT/JP2009/052560, filed on Feb. 16, 2009.

(60) Provisional application No. 61/207,551, filed on Feb. 13, 2009.

(30) Foreign Application Priority Data

Feb. 15, 2008 (WO) .................. PCT/JP2008/052564

(51) Int. Cl.
*H01L 29/94* (2006.01)
*H01L 29/76* (2006.01)
*H01L 31/062* (2012.01)
*H01L 31/119* (2006.01)
*H01L 31/113* (2006.01)

(52) U.S. Cl. ... 257/329; 257/60; 257/401; 257/E21.411; 257/E21.643; 257/E21.703; 438/156; 438/173; 438/192; 438/206; 438/268

(58) Field of Classification Search ........................ None
See application file for complete search history.

(56) References Cited

U.S. PATENT DOCUMENTS 5,416,350 A 5/1995 Watanabe
(Continued)

FOREIGN PATENT DOCUMENTS

JP 61-013661 A 1/1986
(Continued)

OTHER PUBLICATIONS

International Search Report for International Application No. PCT/JP2008/052564, dated Mar. 25, 2008, 1 page.

(Continued)

*Primary Examiner* — Telly Green
*Assistant Examiner* — Khanh Duong
(74) *Attorney, Agent, or Firm* — Brinks Hofer Gilson & Lione

(57) ABSTRACT

It is an object to provide an SGT production method capable of obtaining a structure for reducing a resistance of a gate, a desired gate length, desired source and drain configurations and a desired diameter of a pillar-shaped semiconductor. The object is achieved by a semiconductor device production method which comprises the steps of: forming a pillar-shaped first-conductive-type semiconductor layer; forming a second-conductive-type semiconductor layer underneath the pillar-shaped first-conductive-type semiconductor layer; forming a gate dielectric film and a gate electrode around the pillar-shaped first-conductive-type semiconductor layer; forming a sidewall-shaped dielectric film on an upper region of a sidewall of the pillar-shaped first-conductive-type semiconductor layer and in contact with a top of the gate; forming a sidewall-shaped dielectric film on a sidewall of the gate; and forming a second-conductive-type semiconductor layer in an upper portion of the pillar-shaped first-conductive-type semiconductor layer and on the second-conductive-type semiconductor layer formed underneath the pillar-shaped first-conductive-type semiconductor layer.

3 Claims, 43 Drawing Sheets

U.S. PATENT DOCUMENTS

| | | | |
|---|---|---|---|
| 5,872,037 | A | 2/1999 | Iwamatsu et al. |
| 5,969,384 | A | 10/1999 | Hong |
| 6,107,660 | A | 8/2000 | Yang et al. |
| 6,114,725 | A | 9/2000 | Furukawa et al. |
| 6,461,900 | B1 | 10/2002 | Sundaresan et al. |
| 6,511,884 | B1 | 1/2003 | Quek et al. |
| 6,605,501 | B1 | 8/2003 | Ang et al. |
| 6,642,575 | B1 | 11/2003 | Ono et al. |
| 6,891,225 | B2 | 5/2005 | Horiguchi et al. |
| 2004/0007737 | A1 | 1/2004 | Cho et al. |
| 2009/0200604 | A1 | 8/2009 | Chidambarrao et al. |

FOREIGN PATENT DOCUMENTS

| | | |
|---|---|---|
| JP | 02-071556 A | 3/1990 |
| JP | 02-188966 A | 7/1990 |
| JP | 03-145761 A | 6/1991 |
| JP | 2000-068516 A | 3/2000 |
| JP | 2003-179160 A | 6/2003 |

OTHER PUBLICATIONS

International Search Report for International Application No. PCT/JP2009/052560, dated Mar. 10, 2009, 1 page.

Written Opinion of the International Searching Authority for International Application No. PCT/JP2008/052564, dated Mar. 25, 2008, 5 pages.

Written Opinion of the International Searching Authority for International Application No. PCT/JP2009/052560, dated Mar. 10, 2009, 5 pages.

Wolf, Stanley, Silicon Processing for the VLSI Era, Lattice Press, 2000, $2^{nd}$ Edition, pp. 368-387.

Office Action from co-pending U.S. Appl. No. 12/704,000, dated Dec. 1, 2011, 14 pages.

FIG. 1

| STEP | THE NAME OF THE STEP | STEP | THE NAME OF THE STEP | STEP | THE NAME OF THE STEP |
|---|---|---|---|---|---|
| 1 | FORMATION OF LOTS | 61 | DEPOSITION OF NITRIDE FILM | 121 | DIMENSION MEASUREMENT |
| 2 | FORMATION OF LASER MARK | 62 | MEASUREMENT OF THICKNESS OF NITRIDE FILM | 122 | OVERLAY ERROR MEASUREMENT |
| 3 | PRE-PAD OXIDATION CLEANING | 63 | ETCHING FOR SPACER | 123 | VERIFICATION |
| 4 | PAD OXIDATION | 64 | REMOVAL OF ORGANIC SUBSTANCES | 124 | DRY ETCHING |
| 5 | MEASUREMENT OF THICKNESS OF PAD OXIDE FILM | 65 | MEASUREMENT OF SPACER CONFIGURATION | 125 | REMOVAL OF RESIST BY PLASMA STRIPPING |
| 6 | IMPURITY IMPLANTATION FOR WELL | 66 | | 126 | VERIFICATION |
| 7 | ACTIVATION OF IMPURITY | 67 | LITHOGRAPHIC EXPOSURE USING GATE MASK | 127 | SPUTTERING OF COPPER/TANTALUM/TANTALUM NITRIDE |
| 8 | DEPOSITION OF NITRIDE FILM | 68 | OVERLAY ERROR MEASUREMENT | 128 | FILLING OF COPPER |
| 9 | MEASUREMENT OF THICKNESS OF NITRIDE FILM | 69 | DIMENSION MEASUREMENT | 129 | UNDER-SURFACE TREATMENT |
| 10 | DEPOSITION OF SILICON OXIDE FILM | 70 | VERIFICATION | 130 | VERIFICATION |
| 11 | MEASUREMENT OF THICKNESS OF SILICON OXIDE FILM | 71 | ETCHING FOR GATE | 131 | HEAT TREATMENT |
| 12 | LITHOGRAPHIC EXPOSURE FOR PILLAR SHAP | 72 | ETCHING FOR GATE | 132 | CHEMICAL MECHANICAL POLISHING OF COPPER |
| 13 | | 73 | ETCHING FOR GATE | 133 | VERIFICATION |
| 14 | DIMENSION MEASUREMENT | 74 | REMOVAL OF ORGANIC SUBSTANCES | 134 | DEPOSITION OF NITRIDE FILM |
| 15 | VERIFICATION | 75 | POST-ETCHING DIMENSION MEASUREMENT | 135 | DEPOSITION OF INTERLAYER DIELECTRIC FILM |
| 16 | ETCHING OF HARD MASK FOR PILLAR | 76 | REMOVAL OF NITRIDE FILM | 136 | MEASUREMENT OF THICKNESS OF INTERLAYER DIELECTRIC FILM |
| 17 | ETCHING OF HARD MASK FOR PILLAR | 77 | PRE-NITRIDE FILM DEPOSITION CLEANING | 137 | LITHOGRAPHIC EXPOSURE USING PAD-VIA MASK |
| 18 | ETCHING OF HARD MASK FOR PILLAR | 78 | DEPOSITION OF NITRIDE FILM | 138 | |
| 19 | POST-ETCHING CLEANING | 79 | MEASUREMENT OF THICKNESS OF NITRIDE FILM | 139 | DIMENSION MEASUREMENT |
| 20 | PRE-POLYSILICON DEPOSITION CLEANING | 80 | ETCHING FOR SPACER | 140 | OVERLAY-ERROR MEASUREMENT |
| 21 | DEPOSITION OF POLYSILICON | 81 | REMOVAL OF ORGANIC SUBSTANCES | 141 | VERIFICATION |
| 22 | MEASUREMENT OF THICKNESS OF POLYSILICON FILM | 82 | MEASUREMENT OF SPACER CONFIGURATION | 142 | ETCHING FOR PAD-VIA |
| 23 | CHEMICAL MECHANICAL POLISHING OF POLYSILICON FILM | 83 | IMPLANTATION OF N+ IMPURITY | 143 | |
| 24 | MEASUREMENT OF THICKNESS OF POLYSILICON FILM | 84 | ACTIVATION OF IMPURITY | 144 | REMOVAL OF RESIST BY PLASMA STRIPPING |
| 25 | REMOVAL OF OXIDE FILM | 85 | STRIPPING OF OXIDE FILMS | 145 | POST-ETCHING CLEANING |
| 26 | PRE-SACRIFICIAL OXIDATION CLEANING | 86 | DEPOSITION OF NICKEL | 146 | DIMENSION MEASUREMENT |
| 27 | SACRIFICIAL OXIDATION | 87 | FORMATION OF METAL-SEMICONDUCTOR COMPOUND | 147 | MEASUREMENT OF THICKNESS OF OXIDE FILM |
| 28 | MEASUREMENT OF THICKNESS OF SACRIFICIAL OXIDE FILM | 88 | SELECTIVE PEELING OF NICKEL | 148 | VERIFICATION |
| 29 | REMOVAL OF OXIDE FILM | 89 | DEPOSITION OF NITRIDE FILM | 149 | PRE-METALLIZATION CLEANING |
| 30 | DRY ETCHING OF NITRIDE FILM | 90 | DEPOSITION OF DIELECTRIC FILM FOR BEFORE METALLIZATION | 150 | REPLACEMENT OF WAFER CONTAINER |
| 31 | DRY ETCHING OF OXIDE FILM | 91 | MEASUREMENT OF THICKNESS OF DIELECTRC FILM BEFORE METALLIZATION | 151 | DEPOSITION OF ALUMINUM |
| 32 | DRY ETCHING OF SILICON | 92 | CHEMICAL MECHANICAL POLISHING OF DIELECTRIC FILM BEFORE METALLIZATION | 152 | UNDER-SURFACE TREATMENT |

FIG. 1 Continued

| # | Description | # | Description | # | Description |
|---|---|---|---|---|---|
| 33 | REMOVAL OF ORGANIC SUBSTANCES | 93 | MEASUREMENT OF THICKNESS OF DELECTIEC FILM BEFORE METALLIZATION | 153 | LITHOGRAPHIC EXPOSURE FOR PAD ALUMINUM |
| 34 | SEM INSPECTION | 94 | MEASUREMENT OF THICKNESS OF NITRIDE FILM | 154 | |
| 35 | CHECKUP OF STEP HEIGHT | 95 | LITHOGRAPHIC EXPOSURE USING CONTACT MASK | 155 | OVERLAY-ERROR MEASUREMENT |
| 36 | PRE-SACRIFICIAL OXIDATION CLEANING | 96 | | 156 | DIMENSION MEASUREMENT |
| 37 | SACRIFICIAL OXIDATION | 97 | DIMENSION MEASUREMENT | 157 | VERIFICATION |
| 38 | MEASUREMENT OF THICKNESS OF SACRIFICIAL OXIDE FILM | 98 | OVERLAY ERROR MEASUREMENT | 158 | ETCHING OF PAD ALUMINUM |
| 39 | LITHOGRAPHIC EXPOSURE FOR SOURCE REGION | 99 | VERIFICATION | 159 | |
| 40 | | 100 | ETCHING FOR CONTACT | 160 | |
| 41 | OVERLAY ERROR MEASUREMENT | 101 | ETCHING FOR CONTACT | 161 | REMOVAL OF RESIST BY PLASMA STRIPPING |
| 42 | DIMENSION MEASUREMENT | 102 | REMOVAL OF RESIST BY PLASMA PEELING | 162 | POST-METAL-ETCHING CLEANING |
| 43 | VERIFICATION | 103 | POST-CONTACT ETCHING CLEANING | 163 | OPTICAL INSPECTION |
| 44 | ETCHING OF SOURCE REGION | 104 | MEASUREMENT OF DIMENSIONS OF CONTACT | 164 | SEM INSPECTION |
| 45 | | 105 | MEASUREMENT OF THICKNESS OF OXIDE FILM | 165 | MEASUREMENT OF THICKNESS OF OXIDE FILM |
| 46 | REMOVAL OF ORGANIC SUBSTANCES | 106 | VERIFICATION | 166 | DEPOSITION OF DIELECTRIC FILM |
| 47 | SEM INSPECTION | 107 | REPLACEMENT OF WAFER CONTAINER | 167 | MEASUREMENT OF THICKNESS OF DIELECTRIC FILM |
| 48 | CHECKUP OF STEP HEIGHT | 108 | SPUTTERING OF COPPER/TANTALUM/TANTALUM NITRIDE | 168 | LITHOGRAPHICAL EXPOSURE FOR THE DIELECTRIC FILM |
| 49 | IMPLANTATION OF N+ IMPURITY | 109 | FILLING OF COPPER | 169 | |
| 50 | ACTIVATION OF IMPURITY | 110 | UNDER-SURFACE TREATMENT | 170 | OPTICAL INSPECTION |
| 51 | REMOVAL OF OXIDE FILM | 111 | VERIFICATION | 171 | ETCHING OF DIELECTRIC FILM |
| 52 | PRE-GATE FORMATION CLEANING | 112 | HEAT TREATMENT | 172 | |
| 53 | FORMATION OF GATE OXIDE FILM | 113 | CHEMICAL MECHANICAL POLISHING OF COPPER | 173 | REMOVAL OF RESIST BY PLASMA STRIPPING |
| 54 | MEASUREMENT OF THICKNESS OF GATE OXIDE FILM | 114 | VERIFICATION | 174 | CLEANING OF DIELECTRIC FILM |
| 55 | DEPOSITION OF POLYSILICON | 115 | DEPOSITION OF SILICON CARBIDE | 175 | VERIFICATION |
| 56 | MEASUREMENT OF THICKNESS OF POLYSILICON FILM | 116 | DEPOSITION OF LOW-DIELECTRIC FILM | 176 | HEAT TREATMENT |
| 57 | CHEMICAL MECHANICAL POLISHING OF POLYSILICON | 117 | MEASUREMENT OF THICKNESS OF LOW-DIELECTRIC FILM | | |
| 58 | ETCHING OF POLYSILICON | 118 | VERIFICATION | | |
| 59 | PRE-OXIDATION CLEANING | 119 | LITHOGRAPHIC EXPOSURE USING FIRST METAL MASK | | |

SEMICONDUCTOR DEVICE AND METHOD OF PRODUCING THE SAME

RELATED APPLICATIONS

This application is a divisional patent application of U.S. application Ser. No. 12/699,611, filed Feb. 3, 2010, now U.S. Pat. No. 8,211,758, which claims the benefit of the filing date of Provisional U.S. patent application Ser. No. 61/207,591 filed on Feb. 13, 2009. U.S. application Ser. No. 12/699,611 is a continuation application of PCT/JP2009/052560 filed on Feb. 16, 2009 which claims priority under 35 U.S.C. §365(a) to PCT/JP2008/052564 filed on Feb. 15, 2008. The entire contents of these applications are hereby incorporated by reference.

TECHNICAL FIELD

The present invention relates to a semiconductor device and a production method therefor.

BACKGROUND ART

A degree of integration in a semiconductor integrated circuit, particularly in an integrated circuit using a MOS transistor, has been increasing year by year. Along with the increase in the degree of integration, miniaturization of the MOS transistor used therein has progressed to a nano region. The progress in miniaturization of the MOS transistor gives rise to a problem, such as difficulty in suppressing a leak current, which poses an impediment to sufficiently reducing a circuit occupancy area while meeting a requirement of ensuring a necessary amount of current. With a view to solving this problem, there has been proposed a surrounding gate transistor (SGT) having a structure in which a source, a gate and a drain are arranged in a direction perpendicular to a substrate, wherein the gate is formed to surround a pillar-shaped semiconductor layer (see, for example, the following Patent Documents 1 to 3).

Patent Document 1 JP 2-71556A
Patent Document 2 JP 2-188966A
Patent Document 3 JP 3-145761A In the SGT, a channel region is provided around a side surface of the pillar-shaped semiconductor, so that a large gate width is achieved within a small occupancy area. This means that it is necessary to allow a large ON-current to flow through the small occupancy area. However, if the source, drain and gate have a high resistance, it becomes difficult to apply a desired voltage for allowing the flow of a large ON-current, to the source, drain and gate. Therefore, it is required to provide an SGT production method including a design technique for reducing the resistance of the source, drain and gate. As another condition for allowing the flow of a large ON-current, it is also required to reduce a resistance of a contact.

In a conventional MOS transistor, a gate is formed by depositing a gate material, transferring a gate pattern to a resist on a substrate by lithography, and etching the gate material. In other words, in the conventional MOS transistor, a gate length is designed based on a gate pattern. In the SGT, a current flows in a direction perpendicular to the substrate, because the side surface of the pillar-shaped semiconductor serves as a channel region. Thus, in the SGT, a gate length is not designed based on a gate pattern but based on a production method, so that the gate length and a variation therein are determined by a production method.

In the SGT, as measures for suppressing an increase in leak current occurring along with miniaturization, it is required to reduce a diameter of the pillar-shaped semiconductor. It is also required to provide a production method capable of optimizing the source and drain to suppress short-channel effects so as to reduce a leak current.

As with the conventional MOS transistor, the SGT also has a need for reducing a production cost. For this purpose, it is required to reduce the number of production steps. It is therefore an object of the present invention to provide an SGT production method capable of obtaining a structure for reducing a resistance of a gate, a desired gate length, desired source and drain configurations and a desired diameter of a pillar-shaped semiconductor.

SUMMARY OF THE INVENTION

In order to achieve the above object, according to a first aspect of the present invention, there is provided a method of producing a semiconductor device, which comprises the steps of: forming a planar semiconductor layer on a substrate and then forming a pillar-shaped first-conductive-type semiconductor layer on the planar semiconductor layer; forming a second-conductive-type semiconductor layer in a portion of the planar semiconductor layer underneath the pillar-shaped first-conductive-type semiconductor layer; forming a gate dielectric film and a gate electrode around the pillar-shaped first-conductive-type semiconductor layer; forming a sidewall-shaped dielectric film on an upper region of a sidewall of the pillar-shaped first-conductive-type semiconductor layer and in contact with a top of the gate electrode; forming a sidewall-shaped dielectric film on a sidewall of the gate electrode; forming a second-conductive-type semiconductor layer in an upper portion of the pillar-shaped first-conductive-type semiconductor layer; forming a metal-semiconductor compound on the second-conductive-type semiconductor layer formed in the portion of the planar semiconductor layer underneath the pillar-shaped first-conductive-type semiconductor layer; forming a metal-semiconductor compound on the second-conductive-type semiconductor layer formed in the upper portion of the pillar-shaped first-conductive-type semiconductor layer; forming a metal-semiconductor compound on the gate electrode; forming a contact on the second-conductive-type semiconductor layer formed in the portion of the planar semiconductor layer underneath the pillar-shaped first-conductive-type semiconductor layer; and forming a contact on the second-conductive-type semiconductor layer formed in the upper portion of the pillar-shaped first-conductive-type semiconductor layer.

Preferably, in the method of the present invention, a distance between a central axis of the pillar-shaped first-conductive-type semiconductor layer and a lateral end of the planar semiconductor layer is greater than a sum of: a distance between the central axis and the sidewall of the pillar-shaped first-conductive-type semiconductor layer; a thickness of the gate dielectric film; a thickness of the gate electrode; and a thickness of the sidewall-shaped dielectric film formed on the sidewall of the gate electrode.

Preferably, in the method of the present invention, a thickness of the gate electrode is greater than that of the sidewall-shaped dielectric film formed on the upper region of the sidewall of the pillar-shaped first-conductive-type semiconductor layer and in contact with the top of the gate electrode.

Preferably, in the method of the present invention, the planar semiconductor layer, the first-conductive-type semiconductor layer, and each of the second-conductive-type semiconductor layers, are a planar silicon layer, a first-conductive-type silicon layer, and a second-conductive-type silicon layer, respectively.

Alternatively, in the method of the present invention, the planar semiconductor layer, the first-conductive-type semiconductor layer, and each of the second-conductive-type semiconductor layers, may be a planar silicon layer, a p-type silicon layer or a non-doped silicon layer, and an n-type silicon layer, respectively.

Alternatively, in the method of the present invention, the planar semiconductor layer, the first-conductive-type semiconductor layer, and each of the second-conductive-type semiconductor layers, may be a planar silicon layer, an n-type silicon layer or a non-doped silicon layer, and a p-type silicon layer, respectively.

Preferably, an embodiment of the present invention may include: forming, on the substrate, an initial silicon layer for forming therefrom the pillar-shaped first-conductive-type silicon layer and the planar silicon layer, and then forming a pad oxide film on the initial silicon layer; implanting an impurity into the initial silicon layer through the pad oxide film to adjust a threshold, and then subjecting the initial silicon layer to annealing to activate and diffuse the impurity so as to promote uniform distribution of the impurity in the initial silicon layer; and forming a silicon nitride film for use as a mask during formation of the pillar-shaped first-conductive-type silicon layer.

Preferably, an embodiment of the present invention may include: forming, on the substrate, an initial silicon layer for forming therefrom the pillar-shaped first-conductive-type silicon layer and the planar silicon layer, and then forming a pad oxide film on the initial silicon layer; forming a silicon nitride film for use as a first hard mask during formation of the pillar-shaped first-conductive-type silicon layer; forming a silicon oxide film on the silicon nitride film; applying a resist onto the silicon oxide film, forming a pattern having an inverted shape of a top view of the pillar-shaped first-conductive-type silicon layer, using the resist by lithography, and forming a hole in the silicon oxide film to penetrate through the silicon oxide film at a position for forming the pillar-shaped first-conductive-type silicon layer; forming an amorphous silicon or polysilicon film to fill the hole formed in the silicon oxide film; polishing and removing a portion of the amorphous silicon or polysilicon film on the silicon oxide film by chemical mechanical polishing; removing the silicon oxide film by etching, to form an amorphous silicon or polysilicon film-based mask serving as a second hard mask; sacrificially oxidizing the amorphous silicon or polysilicon film-based mask to reduce a size of the amorphous silicon or polysilicon film-based mask; and etching the amorphous silicon or polysilicon film-based mask to remove the sacrificial silicon oxide film on a surface thereof.

Alternatively, an embodiment of the present invention may include: forming, on the substrate, an initial silicon layer for forming therefrom the pillar-shaped first-conductive-type silicon layer and the planar silicon layer, and then forming a pad oxide film on the initial silicon layer; forming a silicon nitride film for use as a first hard mask during formation of the pillar-shaped first-conductive-type silicon layer; forming a silicon oxide film on the silicon nitride film; applying a resist onto the silicon oxide film, forming a pattern having an inverted shape of a top view of the pillar-shaped first-conductive-type silicon layer, using the resist by lithography, and forming a hole in the silicon oxide film to penetrate through the silicon oxide film at a position for forming the pillar-shaped first-conductive-type silicon layer; and depositing an oxide film and etching back the oxide film to reduce a diameter of the hole penetrating through the silicon oxide film; forming an amorphous silicon or polysilicon film to fill the hole formed in the silicon oxide film; polishing and removing a portion of the amorphous silicon or polysilicon film on the silicon oxide film by chemical mechanical polishing; and removing the silicon oxide film by etching, to form an amorphous silicon or polysilicon film-based mask serving as a second hard mask.

Preferably, an embodiment of the present invention may include: dry-etching a silicon nitride film and a pad oxide film deposited on an initial silicon layer, using a amorphous silicon or polysilicon film-based mask serving as the second hard mask, to form a silicon nitride film-based mask serving as the first hard mask; forming the pillar-shaped first-conductive-type silicon layer by dry etching using the first hard mask and the second hard mask; and, when the amorphous silicon or polysilicon film-based mask serving as the second hard mask is fully etched away to cause a change in plasma emission intensity detectable by a dry etching apparatus, performing a dry-etching end-point detection process by detecting the change in the plasma emission intensity, to control a height dimension of the pillar-shaped first-conductive-type silicon layer.

Preferably, in the method of the present invention, a thickness of the amorphous silicon or polysilicon film-based mask is less than a height dimension of the pillar-shaped first-conductive-type silicon layer.

Preferably, an embodiment of the present invention may include: sacrificially oxidizing the pillar-shaped first-conductive-type silicon layer fabricated on the planar silicon layer to form a sacrificial oxide film as a means for reducing irregularities in a region of the sidewall of the pillar-shaped first-conductive-type silicon layer serving as a channel region, removing a silicon surface implanted with a foreign substance comprising carbon during the dry etching, and protecting the pillar-shaped first-conductive-type silicon layer from contaminations comprising by-products to be produced during dry etching in a subsequent step; applying a resist onto the planar silicon layer, and forming a pattern for the second-conductive-type silicon layer to be formed in the portion of the planar silicon layer underneath the pillar-shaped first-conductive-type silicon layer, using the resist by lithography; and dry-etching the planar silicon layer to form the portion of the planar silicon layer underneath the pillar-shaped first-conductive-type silicon layer, and then removing the resist.

Preferably, an embodiment of the present invention may include introducing a second-conductive-type impurity into a surface of the portion of the planar silicon layer underneath the pillar-shaped first-conductive-type silicon layer on which there is a silicon nitride film-based mask by an impurity doping process comprising impurity implantation, using the sacrificial oxide film formed during the sacrificial oxidation of the pillar-shaped first-conductive-type silicon layer, as a screen oxide film.

Preferably, in the method of the present invention, a diameter of the pillar-shaped first-conductive-type silicon layer is less than that of the silicon nitride film-based mask serving as the first hard mask.

Preferably, in the method of the present invention, an implantation angle during the impurity implantation for use in forming the second-conductive-type silicon layer in the portion of the planar silicon layer underneath the pillar-shaped first-conductive-type silicon layer is in the range of 0 to 6 degrees.

Preferably, in the method of the present invention, the second-conductive-type silicon layer is formed in the portion of the planar silicon layer underneath the pillar-shaped firstconductive-type silicon layer, without implanting the impurity into the upper portion of the pillar-shaped first-conductive-type silicon layer.

Preferably, an embodiment of the present invention may include: removing a sacrificial oxide film by etching from a pillar-shaped first-conductive-type semiconductor layer with a silicon nitride film-based mask and a sacrificial oxide film formed on the planar semiconductor layer and a planar semiconductor layer having a second-conductive-type semiconductor layer formed therein, forming a gate dielectric film such as a silicon oxide film or a silicon nitride film, and forming an amorphous silicon or polysilicon film as a material of the gate electrode to allow the pillar-shaped first-conductive-type silicon layer to be buried therein; and polishing the amorphous silicon or polysilicon film by chemical mechanical polishing to flatten an upper surface of the gate electrode, wherein the silicon nitride film-based mask serving as the first hard mask is used as a stopper for the chemical mechanical polishing to control an amount of chemical mechanical polishing with high repeatability.

Preferably, an embodiment of the present invention may include: etching back the flattened gate electrode material consisting of the amorphous silicon or polysilicon film to allow the resulting gate electrode material of the amorphous silicon or polysilicon film to have a desired gate length of the gate electrode; and oxidizing an upper surface of the etched-back amorphous silicon or polysilicon film to form a silicon oxide film thereon, wherein the silicon oxide film serves as a means to protect the upper surface of the amorphous silicon or polysilicon film from a wet or dry treatment to be performed in a subsequent step, so as to suppress a change in the gate length, or a variation in the gate length and damage of the gate dielectric film from the side of the upper surface thereof.

Preferably, an embodiment of the present invention may include: forming a silicon nitride film to have a film thickness greater than a desired film thickness of the gate electrode: etching back the silicon nitride film to form a silicon nitride film-based sidewall, wherein a film thickness of the silicon nitride film-based sidewall which determines a film thickness of the gate electrode to be formed is controlled by adjusting a film thickness of the silicon nitride film to be formed in the sub-step of forming a silicon nitride film, and conditions for the etching-back in the sub-step of etching back the silicon nitride film, so as to allow the gate electrode to have the desired film thickness; applying a bottom antireflective coating (BARC) layer and a resist, and forming a pattern for a gate line, using the resist by lithography; and etching the BARC layer and the amorphous silicon or polysilicon film, using the resist as a mask to form the gate electrode and the gate line; removing the silicon nitride film-based mask and the silicon nitride film-based sidewall on an upper portion of the pillar-shaped first-conductive-type silicon layer by dry etching or wet etching; and forming a silicon nitride film and etching back the silicon nitride film to expose an upper surface of the second-conductive-type silicon layer formed in the portion of the planar silicon layer underneath the pillar-shaped first-conductive-type silicon layer, and a top surface of the pillar-shaped first-conductive-type silicon layer, while forming a silicon nitride film-based sidewall serving as the sidewall-shaped dielectric film, on the upper region of the sidewall of the pillar-shaped first-conductive-type silicon layer and in contact with the top of the gate electrode, through the gate dielectric film, and forming a silicon nitride film-based sidewall serving as the sidewall-shaped dielectric film on the sidewall of the gate electrode; introducing a second-conductive-type impurity into an upper portion of the pillar-shaped first-conductive-type silicon layer through an impurity doping process comprising impurity implantation, to form the second-conductive-type silicon layer in the upper portion of the pillar-shaped first-conductive-type silicon layer; and subjecting each of the upper surface of the second-conductive-type silicon layer formed in the portion of the planar silicon layer underneath the pillar-shaped first-conductive-type silicon layer, and an upper surface of the second-conductive-type silicon layer formed in the upper portion of the pillar-shaped first-conductive-type silicon layer, to sputtering of a metal such as nickel (Ni) or cobalt (Co), and a heat treatment, and removing an unreacted metal film, to form the metal-semiconductor compound on each of the second-conductive-type silicon layer formed in the portion of the planar silicon layer underneath the pillar-shaped first-conductive-type silicon layer and the second-conductive-type silicon layer formed in the upper portion of the pillar-shaped first-conductive-type silicon layer. In this case, the silicon nitride film-based sidewalls serve as means to isolate the gate electrode from each of the second-conductive-type silicon layer formed in the portion of the planar silicon layer underneath the pillar-shaped first-conductive-type silicon layer and the second-conductive-type silicon layer formed in the upper portion of the pillar-shaped first-conductive-type silicon layer, so as to prevent short-circuiting between the gate electrode and each of the second-conductive-type silicon layer formed in the portion of the planar silicon layer underneath the pillar-shaped first-conductive-type silicon layer and the second-conductive-type silicon layer formed in the upper portion of the pillar-shaped first-conductive-type silicon layer, due to the metal-semiconductor compounds, and the silicon nitride film-based sidewall covering the upper region of the sidewall of the pillar-shaped first-conductive-type silicon layer serves as a means to control formation of a metal-semiconductor compound from the side of the sidewall of the pillar-shaped first-conductive-type silicon layer.

Preferably, an embodiment of the present invention may include: forming a film comprising a silicon nitride film to serve as a contact stopper; forming a silicon oxide film to serve as an interlayer film and then flattening the silicon oxide film by chemical mechanical polishing; forming three contact holes on respective ones of the second-conductive-type silicon layer formed in the portion of the planar silicon layer underneath the pillar-shaped first-conductive-type silicon layer, a gate line extending from the gate electrode, and the second-conductive-type silicon layer formed in the upper portion of the pillar-shaped first-conductive-type silicon layer, by etching.

Preferably, an embodiment of the present invention may include: etching respective portions of the interlayer film for the contact hole on a top of the second-conductive-type silicon layer formed in the upper portion of the pillar-shaped first-conductive-type silicon layer and the contact hole on the gate line, and then etching a portion of the interlayer film for the contact hole on the portion of the second-conductive-type silicon layer formed in the portion of the planar silicon layer underneath the pillar-shaped first-conductive-type silicon layer, whereafter respective portions of the contact stopper corresponding to the contact hole on the top of the second-conductive-type silicon layer formed in the upper portion of the pillar-shaped first-conductive-type silicon layer, the contact hole on the gate line, and the contact hole on the portion of the second-conductive-type silicon layer formed in the portion of the planar silicon layer underneath the pillar-shaped first-conductive-type silicon layer, are etched away.

Alternatively, an embodiment of the present invention may include etching a portion of the interlayer film for the contact hole on the portion of the second-conductive-type silicon layer formed in the portion of the planar silicon layer underneath the pillar-shaped first-conductive-type silicon layer, and then etching respective portions of the interlayer film for the contact hole on a top of the second-conductive-type silicon layer formed in the upper portion of the pillar-shaped first-conductive-type silicon layer and the contact hole on the gate line, whereafter respective portions of the contact stopper corresponding to the contact hole on the top of the second-conductive-type silicon layer formed in the upper portion of the pillar-shaped first-conductive-type silicon layer, the contact hole on the gate line, and the contact hole on the portion of the second-conductive-type silicon layer formed in the portion of the planar silicon layer underneath the pillar-shaped first-conductive-type silicon layer, are etched away.

Alternatively, an embodiment of the present invention may include etching a portion of the interlayer film for the contact hole on a top of the second-conductive-type silicon layer formed in the upper portion of the pillar-shaped first-conductive-type silicon layer, and then etching respective portions of the interlayer film for the contact hole on the gate line and the contact hole on the portion of the second-conductive-type silicon layer formed in the portion of the planar silicon layer underneath the pillar-shaped first-conductive-type silicon layer, whereafter respective portions of the contact stopper corresponding to the contact hole on the top of the second-conductive-type silicon layer formed in the upper portion of the pillar-shaped first-conductive-type silicon layer, the contact hole on the gate line, and the contact hole on the portion of the second-conductive-type silicon layer formed in the portion of the planar silicon layer underneath the pillar-shaped first-conductive-type silicon layer, are etched away.

Alternatively, an embodiment of the present invention may include etching respective portions of the interlayer film for the contact hole on the gate line and the contact hole on the portion of the second-conductive-type silicon layer formed in the portion of the planar silicon layer underneath the pillar-shaped first-conductive-type silicon layer, and then etching a portion of the interlayer film for the contact hole on a top of the second-conductive-type silicon layer formed in the upper portion of the pillar-shaped first-conductive-type silicon layer, whereafter respective portions of the contact stopper corresponding to the contact hole on the top of the second-conductive-type silicon layer formed in the upper portion of the pillar-shaped first-conductive-type silicon layer, the contact hole on the gate line, and the contact hole on the portion of the second-conductive-type silicon layer formed in the portion of the planar silicon layer underneath the pillar-shaped first-conductive-type silicon layer, are etched away.

According to a second aspect of the present invention, there is provided a semiconductor device which comprises: a planar semiconductor layer formed on a substrate, wherein the planar semiconductor layer has a second-conductive-type semiconductor layer formed therein and a metal-semiconductor compound formed on the second-conductive-type semiconductor layer; a pillar-shaped first-conductive-type semiconductor layer formed on the planar semiconductor layer, wherein the pillar-shaped first-conductive-type semiconductor layer has a second-conductive-type semiconductor layer formed in an upper portion thereof and a metal-semiconductor compound formed on the second-conductive-type semiconductor layer; a gate dielectric film formed around the pillar-shaped first-conductive-type semiconductor layer; a gate electrode formed to surround the gate dielectric film, the gate electrode having a metal-semiconductor compound formed thereon; and a sidewall-shaped dielectric film formed on each of an upper region of a sidewall of the pillar-shaped first-conductive-type semiconductor layer and in contact with a top of the gate electrode, and a sidewall of the gate electrode.

Preferably, in the semiconductor device of the present invention, a distance between a central axis of the pillar-shaped first-conductive-type semiconductor layer and a lateral end of the planar semiconductor layer is greater than a sum of: a distance between the central axis and the sidewall of the pillar-shaped first-conductive-type semiconductor layer; a thickness of the gate dielectric film; a thickness of the gate electrode; and a thickness of the sidewall-shaped dielectric film formed on the sidewall of the gate electrode.

Preferably, in the semiconductor device of the present invention, a thickness of the gate electrode is greater than that of the sidewall-shaped dielectric film formed on the upper region of the sidewall of the pillar-shaped first-conductive-type semiconductor layer and in contact with the top of the gate electrode.

The semiconductor device production method according to the first aspect of the present invention comprises the steps of: forming a planar semiconductor layer on a substrate and then forming a pillar-shaped first-conductive-type semiconductor layer on the planar semiconductor layer; forming a second-conductive-type semiconductor layer in a portion of the planar semiconductor layer underneath the pillar-shaped first-conductive-type semiconductor layer; forming a gate dielectric film and a gate electrode around the pillar-shaped first-conductive-type semiconductor layer; forming a sidewall-shaped dielectric film on an upper region of a sidewall of the pillar-shaped first-conductive-type semiconductor layer and in contact with a top of the gate electrode; forming a sidewall-shaped dielectric film on a sidewall of the gate electrode; forming a second-conductive-type semiconductor layer in an upper portion of the pillar-shaped first-conductive-type semiconductor layer; forming a metal-semiconductor compound on the second-conductive-type semiconductor layer formed in the portion of the planar semiconductor layer underneath the pillar-shaped first-conductive-type semiconductor layer; forming a metal-semiconductor compound on the second-conductive-type semiconductor layer formed in the upper portion of the pillar-shaped first-conductive-type semiconductor layer; forming a metal-semiconductor compound on the gate electrode; forming a contact on the second-conductive-type semiconductor layer formed in the portion of the planar semiconductor layer underneath the pillar-shaped first-conductive-type semiconductor layer; and forming a contact on the second-conductive-type semiconductor layer formed in the upper portion of the pillar-shaped first-conductive-type semiconductor layer. This makes it possible to provide an SGT production method capable of obtaining a structure for reducing a resistance of a gate, a desired gate length, desired source and drain configurations and a desired diameter of a pillar-shaped semiconductor.

In a preferred embodiment of the present invention, a distance between a central axis of the pillar-shaped first-conductive-type semiconductor layer and a lateral end of the planar semiconductor layer is greater than a sum of: a distance between the central axis and the sidewall of the pillar-shaped first-conductive-type semiconductor layer; a thickness of the gate dielectric film; a thickness of the gate electrode; and a thickness of the sidewall-shaped dielectric film formed on the sidewall of the gate electrode. This makes it possible to form a metal-semiconductor compound on the second-conductive-type semiconductor layer formed in the portion of the planar semiconductor layer underneath the pillar-shaped first-conductive-type semiconductor layer, so that a resistance of the second-conductive-type semiconductor layer formed in the portion of the planar semiconductor layer underneath the pillar-shaped first-conductive-type semiconductor layer can be reduced.

In a preferred embodiment of the present invention, a thickness of the gate electrode is greater than that of the sidewall-shaped dielectric film formed on the upper region of the sidewall of the pillar-shaped first-conductive-type semiconductor layer and in contact with the top of the gate electrode. This makes it possible to form a metal-semiconductor compound on the gate electrode, so that a resistance of the gate electrode can be reduced.

In a preferred embodiment of the present invention, an embodiment of the present invention may include: forming, on the substrate, an initial silicon layer for forming therefrom the pillar-shaped first-conductive-type silicon layer and the planar silicon layer, and then forming a pad oxide film on the initial silicon layer; implanting an impurity into the initial silicon layer through the pad oxide film to adjust a threshold, and then subjecting the initial silicon layer to annealing to activate and diffuse the impurity so as to promote uniform distribution of the impurity in the initial silicon layer; and forming a silicon nitride film for use as a mask during formation of the pillar-shaped first-conductive-type silicon layer. In this case, the pad oxide film for reducing a stress between a silicon layer and a silicon nitride film to be formed in the next step can be used as a screen oxide film during impurity injection. This makes it possible to reduce the number of production steps so as to reduce a production cost.

In a preferred embodiment of the present invention, an embodiment of the present invention may include: forming, on the substrate, an initial silicon layer for forming therefrom the pillar-shaped first-conductive-type silicon layer and the planar silicon layer, and then forming a pad oxide film on the initial silicon layer; forming a silicon nitride film for use as a first hard mask during formation of the pillar-shaped first-conductive-type silicon layer; forming a silicon oxide film on the silicon nitride film; applying a resist on the silicon oxide film, forming a pattern having an inverted shape of a top view of the pillar-shaped first-conductive-type silicon layer, using the resist by lithography, and forming a hole in the silicon oxide film to penetrate through the silicon oxide film at a position for forming the pillar-shaped first-conductive-type silicon layer; forming an amorphous silicon or polysilicon film to fill the hole formed in the silicon oxide film; polishing and removing a portion of the amorphous silicon or polysilicon film on the silicon oxide film by chemical mechanical polishing; removing the silicon oxide film by etching, to form an amorphous silicon or polysilicon film-based mask serving as a second hard mask; sacrificially oxidizing the amorphous silicon or polysilicon film-based mask to reduce a size of the amorphous silicon or polysilicon film-based mask; and etching the amorphous silicon or polysilicon film-based mask to remove the sacrificial silicon oxide film on a surface thereof. This makes it possible to reduce a diameter of the pillar-shaped first-conductive-type semiconductor layer to be subsequently formed, to suppress short-channel effects in a transistor so as to reduce a leak current.

Alternatively, an embodiment of the present invention may include: forming, on the substrate, an initial silicon layer for forming therefrom the pillar-shaped first-conductive-type silicon layer and the planar silicon layer, and then forming a pad oxide film on the initial silicon layer; forming a silicon nitride film for use as a first hard mask during formation of the pillar-shaped first-conductive-type silicon layer; forming a silicon oxide film on the silicon nitride film; applying a resist onto the silicon oxide film, forming a pattern having an inverted shape of a top view of the pillar-shaped first-conductive-type silicon layer, using the resist by lithography, and forming a hole in the silicon oxide film to penetrate through the silicon oxide film at a position for forming the pillar-shaped first-conductive-type silicon layer; depositing an oxide film and etching back the oxide film to reduce a diameter of the hole penetrating through the silicon oxide film; forming an amorphous silicon or polysilicon film to fill the hole formed in the silicon oxide film; polishing and removing a portion of the amorphous silicon or polysilicon film on the silicon oxide film by chemical mechanical polishing; and removing the silicon oxide film by etching, to form an amorphous silicon or polysilicon film-based mask serving as a second hard mask. This also makes it possible to reduce a diameter of the pillar-shaped first-conductive-type semiconductor layer to be subsequently formed, to suppress short-channel effects in a transistor so as to reduce a leak current.

A preferred embodiment of the present invention may include: dry-etching a silicon nitride film and the a oxide film deposited on an initial silicon layer, using a amorphous silicon or polysilicon film-based mask serving as the second hard mask, to form a silicon nitride film-based mask serving as the first hard mask; and forming the pillar-shaped first-conductive-type silicon layer by dry etching using the first hard mask and the second hard mask. In this case, when the amorphous silicon or polysilicon film-based mask serving as the second hard mask is fully etched away to cause a change in plasma emission intensity detectable by a dry etching apparatus, a dry-etching end-point detection process can be performed by detecting the change in the plasma emission intensity, to control a height dimension of the pillar-shaped first-conductive-type silicon layer.

In a preferred embodiment of the present invention, a thickness of the amorphous silicon or polysilicon film-based mask is less than a height dimension of the pillar-shaped first-conductive-type silicon layer. This makes it possible to effectively perform the dry-etching end-point detection process.

A preferred embodiment of the present invention may include: sacrificially oxidizing the pillar-shaped first-conductive-type silicon layer fabricated on the planar silicon layer to form a sacrificial oxide film as a means for reducing irregularities in a region of the sidewall of the pillar-shaped first-conductive-type silicon layer serving as a channel region, removing a silicon surface implanted with a foreign substance comprising carbon during the dry etching, and protecting the pillar-shaped first-conductive-type silicon layer from contaminations comprising by-products to be produced during dry etching in a subsequent step; applying a resist onto the planar layer, and forming a pattern for the second-conductive-type silicon layer to be formed in the portion of the planar silicon layer underneath the pillar-shaped first-conductive-type silicon layer, using the resist by lithography; and dry-etching the planar silicon layer to form the portion of the planar silicon layer underneath the pillar-shaped first-conductive-type silicon layer, and then removing the resist. In this case, the oxide film formed by the sacrificial oxidation is used as a protective film for the pillar-shaped first-conductive-type semiconductor layer. This makes it possible to reduce the number of production steps so as to reduce a production cost.

A preferred embodiment of the present invention may include: introducing a second-conductive-type impurity into a surface of the portion of the planar silicon layer underneath the pillar-shaped first-conductive-type silicon layer on which there is a silicon nitride film-based mask by an impurity doping process comprising impurity implantation, using the sacrificial oxide film formed during the sacrificial oxidation of the pillar-shaped first-conductive-type silicon layer, as a screen oxide film. In this case, the oxide film formed by the sacrificial oxidation is used as not only a protective film for the pillar-shaped first-conductive-type semiconductor layer but also a screen oxide film during impurity implantation. This makes it possible to reduce the number of production steps so as to reduce a production cost.

In a preferred embodiment of the present invention, a diameter of the pillar-shaped first-conductive-type silicon layer is less than that of the silicon nitride film-based mask serving as the first hard mask. This makes it possible to prevent implantation of an imparity from the side of the sidewall of the pillar-shaped first-conductive-type silicon layer during the impurity implantation.

In a preferred embodiment of the present invention, an implantation angle during the impurity implantation for use in forming the second-conductive-type silicon layer in the portion of the planar silicon layer underneath the pillar-shaped first-conductive-type silicon layer is in the range of 0 to 6 degrees. This makes it possible to prevent implantation of an imparity from the side of the sidewall of the pillar-shaped first-conductive-type silicon layer during the impurity implantation.

In a preferred embodiment of the present invention, the second-conductive-type silicon layer is formed in the portion of the planar silicon layer underneath the pillar-shaped first-conductive-type silicon layer, without implanting the impurity into the upper portion of the pillar-shaped first-conductive-type silicon layer. This makes it possible to impurity implantation conditions for the upper portion of the pillar-shaped first-conductive-type silicon layer and the portion of the planar silicon layer underneath the pillar-shaped first-conductive-type silicon layer, to suppress short-channel effects in a transistor so as to reduce a leak current.

A preferred embodiment of the present invention may include: removing a sacrificial oxide film by etching from a pillar-shaped first-conductive-type semiconductor layer with a silicon nitride film-based mask and a sacrificial oxide film formed on the planar semiconductor layer and a planar semiconductor layer having a second-conductive-type semiconductor layer formed therein, forming a gate dielectric film such as a silicon oxide film or a silicon nitride film, and forming an amorphous silicon or polysilicon film as a material of the gate electrode to allow the pillar-shaped first-conductive-type silicon layer to be buried therein; and polishing the amorphous silicon or polysilicon film by chemical mechanical polishing to flatten an upper surface of the gate electrode material. In this case, the silicon nitride film-based mask serving as the first hard mask can be used as a stopper for the chemical mechanical polishing to control an amount of chemical mechanical polishing with high repeatability.

A preferred embodiment of the present invention may include: etching back the flattened gate electrode material consisting of the amorphous silicon or polysilicon film to allow the resulting gate electrode material of the amorphous silicon or polysilicon film to have a desired gate length of the gate electrode; and oxidizing an upper surface of the etched-back amorphous silicon or polysilicon film to form a silicon oxide film thereon. In this case, the silicon oxide film can serve as a means to protect the upper surface of the amorphous silicon or polysilicon film from a wet or dry treatment to be performed in a subsequent step, so as to suppress a change in the gate length, or a variation in the gate length and damage of the gate dielectric film from the side of the upper surface thereof.

A preferred embodiment of the present invention may include: forming a silicon nitride film to have a film thickness greater than a desired film thickness of the gate electrode; etching back the silicon nitride film to form a silicon nitride film-based sidewall, wherein a film thickness of the silicon nitride film-based sidewall which determines a film thickness of the gate electrode to be formed is controlled by adjusting a film thickness of the silicon nitride film to be formed in the sub-step of forming a silicon nitride film, and conditions for the etching-back in the sub-step of etching back the silicon nitride film, so as to allow the gate electrode to have the desired film thickness; applying a bottom antireflective coating (BARC) layer and a resist, and forming a pattern for a gate line, using the resist by lithography; and etching the BARC layer and the amorphous silicon or polysilicon film, using the resist as a mask to form the gate electrode and the gate line; removing the silicon nitride film-based mask and the silicon nitride film-based sidewall on an upper portion of the pillar-shaped first-conductive-type silicon layer by dry etching or wet etching; and forming a silicon nitride film and etching back the silicon nitride film to expose an upper surface of the second-conductive-type silicon layer formed in the portion of the planar silicon layer underneath the pillar-shaped first-conductive-type silicon layer, and a top surface of the pillar-shaped first-conductive-type silicon layer, while forming a silicon nitride film-based sidewall serving as the sidewall-shaped dielectric film, on the upper region of the sidewall of the pillar-shaped first-conductive-type silicon layer and in contact with the top of the gate electrode, through the gate dielectric film, and forming a silicon nitride film-based sidewall serving as the sidewall-shaped dielectric film on the sidewall of the gate electrode; introducing a second-conductive-type impurity into an upper portion of the pillar-shaped first-conductive-type silicon layer through an impurity doping process comprising impurity implantation, to form the second-conductive-type silicon layer in the upper portion of the pillar-shaped first-conductive-type silicon layer; and subjecting each of the upper surface of the second-conductive-type silicon layer formed in the portion of the planar silicon layer underneath the pillar-shaped first-conductive-type silicon layer, and an upper surface of the second-conductive-type silicon layer formed in the upper portion of the pillar-shaped first-conductive-type silicon layer, to sputtering of a metal such as nickel (Ni) or cobalt (Co), and a heat treatment, and removing an unreacted metal film, to form the metal-semiconductor compound on each of the second-conductive-type silicon layer formed in the portion of the planar silicon layer underneath the pillar-shaped first-conductive-type silicon layer and the second-conductive-type silicon layer formed in the upper portion of the pillar-shaped first-conductive-type silicon layer. In this case, the silicon nitride film-based sidewalls can serve as means to isolate the gate electrode from each of the second-conductive-type silicon layer formed in the portion of the planar silicon layer underneath the pillar-shaped first-conductive-type silicon layer and the second-conductive-type silicon layer formed in the upper portion of the pillar-shaped first-conductive-type silicon layer, so as to prevent short-circuiting between the gate electrode and each of the second-conductive-type silicon layer formed in the portion of the planar silicon layer underneath the pillar-shaped first-conductive-type silicon layer and the second-conductive-type silicon layer formed in the upper portion of the pillar-shaped first-conductive-type silicon layer, due to the metal-semiconductor compounds, and the silicon nitride film-based sidewall covering the upper region of the sidewall of the pillar-shaped first-conductive-type silicon layer can serve as a means to control formation of a metal-semiconductor compound from the side of the sidewall of the pillar-shaped first-conductive-type silicon layer.

A preferred embodiment of the present invention may include: forming a film comprising a silicon nitride film to serve as a contact stopper; forming a silicon oxide film to serve as an interlayer film and then flattening the silicon oxide film by chemical mechanical polishing; forming three contact holes on respective ones of the second-conductive-type silicon layer formed in the portion of the planar silicon layer underneath the pillar-shaped first-conductive-type silicon layer, a gate line extending from the gate electrode, and the second-conductive-type silicon layer formed in the upper portion of the pillar-shaped first-conductive-type silicon layer, by etching. This makes it possible to reduce a resistance of each of the contacts.

A preferred embodiment of the present invention may include: etching respective portions of the interlayer film for the contact hole on a top of the second-conductive-type silicon layer formed in the upper portion of the pillar-shaped first-conductive-type silicon layer and the contact hole on the gate line, and then etching a portion of the interlayer film for the contact hole on the portion of the second-conductive-type silicon layer formed in the portion of the planar silicon layer underneath the pillar-shaped first-conductive-type silicon layer, whereafter respective portions of the contact stopper corresponding to the contact hole on the top of the second-conductive-type silicon layer formed in the upper portion of the pillar-shaped first-conductive-type silicon layer, the contact hole on the gate line, and the contact hole on the portion of the second-conductive-type silicon layer formed in the portion of the planar silicon layer underneath the pillar-shaped first-conductive-type silicon layer, are etched away. This makes it possible to optimize etching conditions for the contact hole on the contact hole on the top of the second-conductive-type silicon layer formed in the upper portion of the pillar-shaped first-conductive-type silicon layer and the contact hole on the gate line, while optimizing etching conditions for the contact hole on the portion of the second-conductive-type silicon layer formed in the portion of the planar silicon layer underneath the pillar-shaped first-conductive-type silicon layer.

Alternatively, a preferred embodiment of the present invention may include: may include etching a portion of the interlayer film for the contact hole on the portion of the second-conductive-type silicon layer formed in the portion of the planar silicon layer underneath the pillar-shaped first-conductive-type silicon layer, and then etching respective portions of the interlayer film for the contact hole on a top of the second-conductive-type silicon layer formed in the upper portion of the pillar-shaped first-conductive-type silicon layer and the contact hole on the gate line, whereafter respective portions of the contact stopper corresponding to the contact hole on the top of the second-conductive-type silicon layer formed in the upper portion of the pillar-shaped first-conductive-type silicon layer, the contact hole on the gate line, and the contact hole on the portion of the second-conductive-type silicon layer formed in the portion of the planar silicon layer underneath the pillar-shaped first-conductive-type silicon layer, are etched away. This makes it possible to optimize etching conditions for the contact hole on the contact hole on the top of the second-conductive-type silicon layer formed in the upper portion of the pillar-shaped first-conductive-type silicon layer and the contact hole on the gate line, while optimizing etching conditions for the contact hole on the portion of the second-conductive-type silicon layer formed in the portion of the planar silicon layer underneath the pillar-shaped first-conductive-type silicon layer.

Alternatively, A preferred embodiment of the present invention may include: etching a portion of the interlayer film for the contact hole on a top of the second-conductive-type silicon layer formed in the upper portion of the pillar-shaped first-conductive-type silicon layer, and then etching respective portions of the interlayer film for the contact hole on the gate line and the contact hole on the portion of the second-conductive-type silicon layer formed in the portion of the planar silicon layer underneath the pillar-shaped first-conductive-type silicon layer, whereafter respective portions of the contact stopper corresponding to the contact hole on the top of the second-conductive-type silicon layer formed in the upper portion of the pillar-shaped first-conductive-type silicon layer, the contact hole on the gate line, and the contact hole on the portion of the second-conductive-type silicon layer formed in the portion of the planar silicon layer underneath the pillar-shaped first-conductive-type silicon layer, are etched away. This makes it possible to optimize etching conditions for the contact hole on the contact hole on the top of the second-conductive-type silicon layer formed in the upper portion of the pillar-shaped first-conductive-type silicon layer, while optimizing etching conditions for and the contact hole on the gate line and the contact hole on the portion of the second-conductive-type silicon layer formed in the portion of the planar silicon layer underneath the pillar-shaped first-conductive-type silicon layer.

Alternatively, A preferred embodiment of the present invention may include: etching respective portions of the interlayer film for the contact hole on the gate line and the contact hole on the portion of the second-conductive-type silicon layer formed in the portion of the planar silicon layer underneath the pillar-shaped first-conductive-type silicon layer, and then etching a portion of the interlayer film for the contact hole on a top of the second-conductive-type silicon layer formed in the upper portion of the pillar-shaped first-conductive-type silicon layer, whereafter respective portions of the contact stopper corresponding to the contact hole on the top of the second-conductive-type silicon layer formed in the upper portion of the pillar-shaped first-conductive-type silicon layer, the contact hole on the gate line, and the contact hole on the portion of the second-conductive-type silicon layer formed in the portion of the planar silicon layer underneath the pillar-shaped first-conductive-type silicon layer, are etched away. This makes it possible to optimize etching conditions for the contact hole on the contact hole on the top of the second-conductive-type silicon layer formed in the upper portion of the pillar-shaped first-conductive-type silicon layer, while optimizing etching conditions for and the contact hole on the gate line and the contact hole on the portion of the second-conductive-type silicon layer formed in the portion of the planar silicon layer underneath the pillar-shaped first-conductive-type silicon layer.

The semiconductor device according to the second aspect of the present invention comprises: a planar semiconductor layer formed on a substrate, wherein the planar semiconductor layer has a second-conductive-type semiconductor layer formed therein and a metal-semiconductor compound formed on the second-conductive-type semiconductor layer; a pillar-shaped first-conductive-type semiconductor layer formed on the planar semiconductor layer, wherein the pillar-shaped first-conductive-type semiconductor layer has a second-conductive-type semiconductor layer formed in an upper portion thereof and a metal-semiconductor compound formed on the second-conductive-type semiconductor layer; a gate dielectric film formed around the pillar-shaped first-conductive-type semiconductor layer; a gate electrode formed to surround the gate dielectric film, the gate electrode having a metal-semiconductor compound formed thereon; and a sidewall-shaped dielectric film formed on each of an upper region of a sidewall of the pillar-shaped first-conductive-type semiconductor layer and in contact with a top of the gate electrode, and a sidewall of the gate electrode. Thus, different voltages can be applied to respective ones of the second-conductive-type semiconductor layer formed in a portion of the planar semiconductor layer underneath the pillar-shaped first-conductive-type semiconductor layer, the gate electrode and the second-conductive-type semiconductor layer formed in the upper portion of the pillar-shaped first-conductive-type semiconductor layer. This makes it possible to reduce a resistance of each of the second-conductive-type semiconductor layer formed in a portion of the planar semiconductor layer underneath the pillar-shaped first-conductive-type semiconductor layer, the gate electrode and the second-conductive-type semiconductor layer formed in the upper portion of the pillar-shaped first-conductive-type semiconductor layer.

In a preferred embodiment of the present invention, a distance between a central axis of the pillar-shaped first-conductive-type semiconductor layer and a lateral end of the planar semiconductor layer is greater than a sum of: a distance between the central axis and the sidewall of the pillar-shaped first-conductive-type semiconductor layer; a thickness of the gate dielectric film; a thickness of the gate electrode; and a thickness of the sidewall-shaped dielectric film formed on the sidewall of the gate electrode. This makes it possible to form a metal-semiconductor compound on the second-conductive-type semiconductor layer formed in the portion of the planar semiconductor layer underneath the pillar-shaped first-conductive-type semiconductor layer, so that a resistance of the second-conductive-type semiconductor layer formed in the portion of the planar semiconductor layer underneath the pillar-shaped first-conductive-type semiconductor layer can be reduced.

In a preferred embodiment of the present invention, a thickness of the gate electrode is greater than that of the sidewall-shaped dielectric film formed on the upper region of the sidewall of the pillar-shaped first-conductive-type semiconductor layer and in contact with the top of the gate electrode. This makes it possible to form a metal-semiconductor compound on the gate electrode, so that a resistance of the gate electrode can be reduced.

BRIEF DESCRIPTION OF THE DRAWINGS

FIG. 1 is a table showing steps of a semiconductor production method according to one embodiment of the present invention.

DETAILED DESCRIPTION OF THE PREFERRED EMBODIMENTS

Figure 35A:
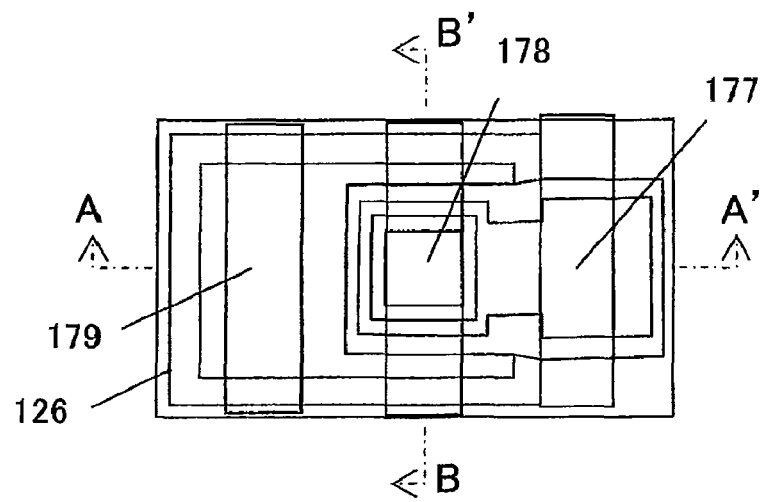
FIG. 35(a) is a top plan view showing one of the steps of the semiconductor production method according to the embodiment
Figure 35B:
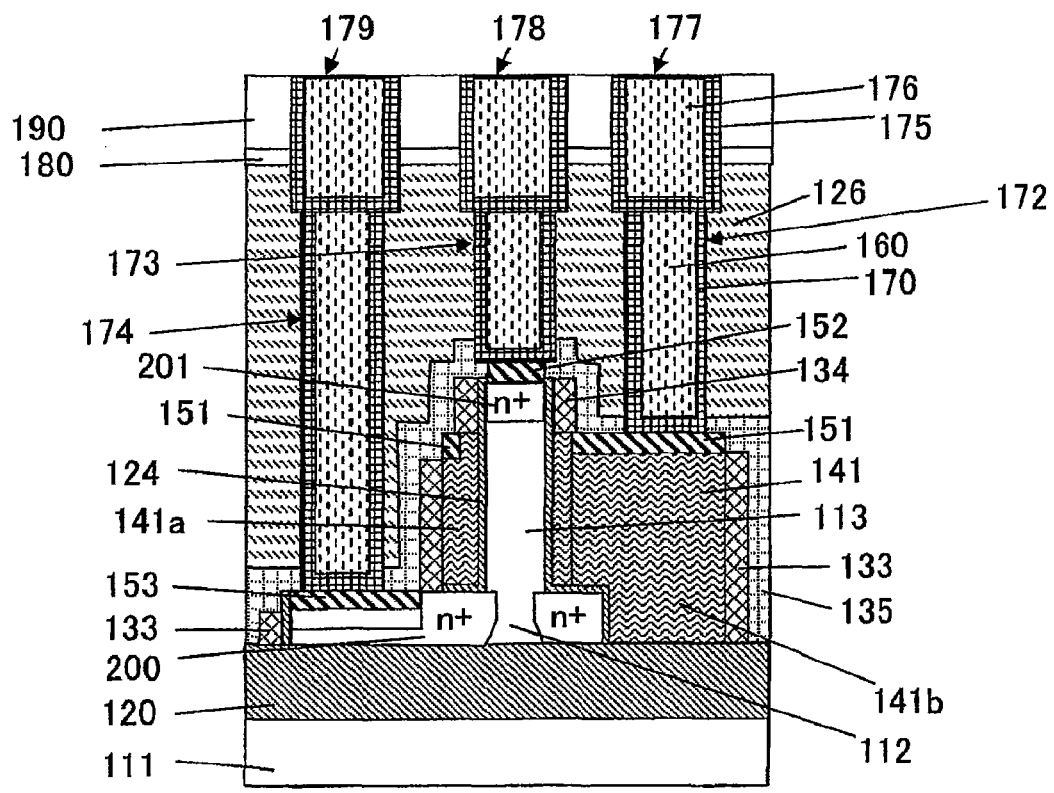
FIG. 35(b) is a sectional view showing the step of the semiconductor production method according to the embodiment, taken along the line A-A' in FIG. 35(a).

FIG. 35(a) is a top plan view of an NMOS SGT formed using the present invention, and FIG. 35(b) is a sectional view taken along the line A-A' in FIG. 35(a). With reference to FIGS. 35(a) and 35(b), the NMOS SGT formed using the present invention will now be described.

A planar silicon layer 112 is formed on a substrate which comprises a buried oxide (BOX) layer 120 formed on a Si layer 111, and a pillar-shaped silicon layer 113 is formed on the planar silicon layer 112. A gate dielectric film 124 and a gate electrode 141 are formed around the pillar-shaped silicon layer 113. An N$^+$ source diffusion layer 200 is formed in a portion of the planar silicon layer 112 underneath the pillar-shaped silicon layer 113, and an N$^+$ drain diffusion layer 201 is formed in an upper portion of the pillar-shaped silicon layer 113. A contact 174 is formed on the N$^+$ source diffusion layer 200, and a contact 173 is formed on the N$^+$ drain diffusion layer 201. A contact 172 is formed on a gate line 141b extending from the gate electrode 141a.

Figure 36:
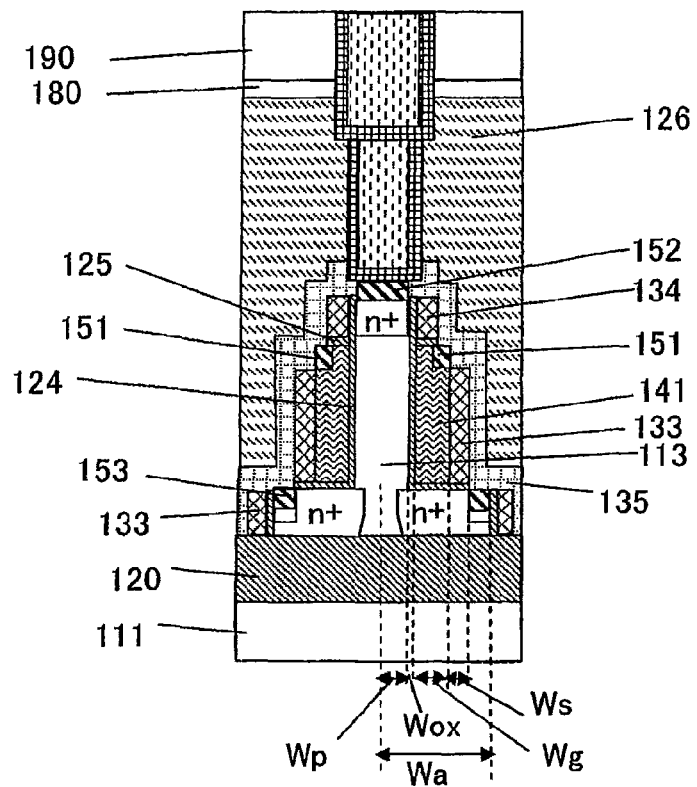
FIG. 36 is an explanatory sectional view showing a product in FIGS. 35(a) and 35(b).

FIG. 36 is a sectional view taken along the line B-B' in FIG. 35(a). In order to reduce a resistance of a source region, it is necessary to form a silicide 153 on the source region. In this regard, as a prerequisite to allowing a silicide to be formed on the planar silicon layer 112, the following conditional formula (1) must be satisfied:

$$Wa > Wp + Wox + Wg + Ws \quad (1),$$

wherein: Wa is a distance between a central axis of the silicon pillar 113 and a lateral end of the planar silicon layer 112; Wp is a distance between the central axis and a sidewall of the silicon pillar 113; Wox is a thickness of the gate oxide film 124; Wg is a width of the gate electrode 141; and Ws is a width of a nitride film-based sidewall 133, i.e., a width of a dielectric film.

Figure 37:
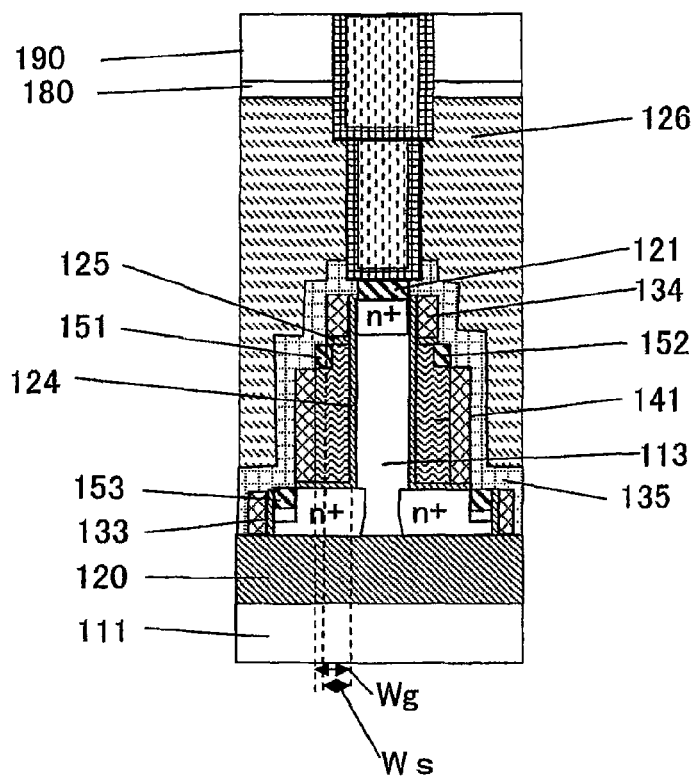
FIG. 37 is an explanatory sectional view showing a product in FIGS. 35(a) and 35(b).

FIG. 37 is a sectional view taken along the line B-B' in FIG. 35(a). In order to reduce a resistance of the gate electrode 141, it is necessary to form a silicide 151 on the gate electrode 141. As a prerequisite to allowing a silicide to be formed on the gate electrode 141, the following conditional formula (2) must be satisfied:

$$Wg > Ws \quad (2),$$

wherein Wg is the width of the gate electrode 141, and Ws is a width of a nitride film-based sidewall 134, i.e., a width of a dielectric film. A structure satisfying the above conditions can be used to reduce a parasitic resistance of the source, drain and gate so as to increase an ON-current.

Under a condition that the N$^+$ source diffusion layer is connected to a GND potential, and the N$^+$ drain diffusion layer is connected to a power supply potential Vcc, a potential ranging from zero to Vcc is applied to the gate electrode to allow the SGT to operate as a transistor. In the above structure, the N$^+$ diffusion layer formed in the upper portion of the pillar-shaped silicon layer may serve as an N$^+$ source diffusion layer, and the N$^+$ diffusion layer formed in the portion of the planar silicon layer underneath the pillar-shaped silicon layer may serve as an N$^+$ drain diffusion layer With reference to FIGS. 1 to 35(b), an SGT production method according to one embodiment of the present invention will be described below. In FIGS. 1 to 35(b), the same elements or components are defined by a common reference numeral or code. FIG. 1 shows steps of the SGT production method according to this embodiment. FIGS. 2(a) to 35(b) show the SGT production method according to this embodiment, on a step-by-step basis, wherein the figure suffixed with (a) is a top plan view, and the figure suffixed with (b) is a sectional view taken along the line A-A' in the figure suffixed with (a).

Figure 2A:
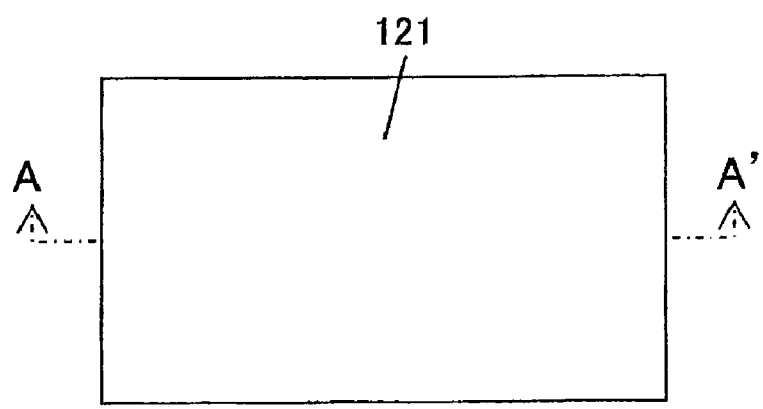
FIG. 2(a) is a top plan view showing one of the steps of the semiconductor production method according to the embodiment
Figure 2B:
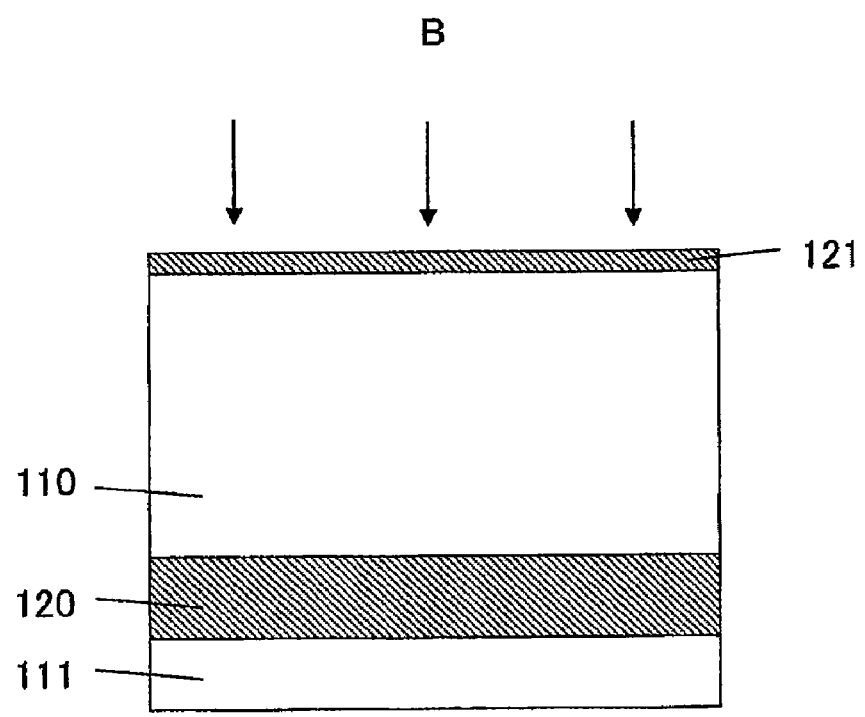
FIG. 2(b) is a sectional view showing the step of the semiconductor production method according to the embodiment, taken along the line A-A' in FIG. 2(a).

Referring to FIGS. 2(a) and 2(b), an SOI substrate is prepared which comprises a BOX layer 120 formed on a Si layer 111, and a silicon layer 110 formed on the BOX layer 120. A pad oxide film 121 is formed on the SOI layer 110. Before forming the pad oxide film (pad oxidation), an operation of forming a lot, an operation of forming a laser mark, and a pre-pad-oxidation cleaning operation, may be performed. Further, after the pad oxidation, a thickness measurement operation for the pad oxide film may be performed (Steps 1, 2, 3, 4, 5 in FIG. 1).

Referring to FIGS. 2(a) and 2(b), an impurity is implanted into the SOI layer through the pad oxide film 121 to adjust a threshold. Subsequently, the SOI layer is subjected to annealing to activate and diffuse the impurity so as to promote uniform distribution of the impurity in the SOI layer. The pad oxide film formed to reduce a stress between the silicon and a silicon nitride film to be formed in the next step is also used as a screen oxide film during the impurity implantation, which makes it possible to reduce the number of production step so as to reduce a production cost (Steps 6, 7 in FIG. 1).

Figure 3A:
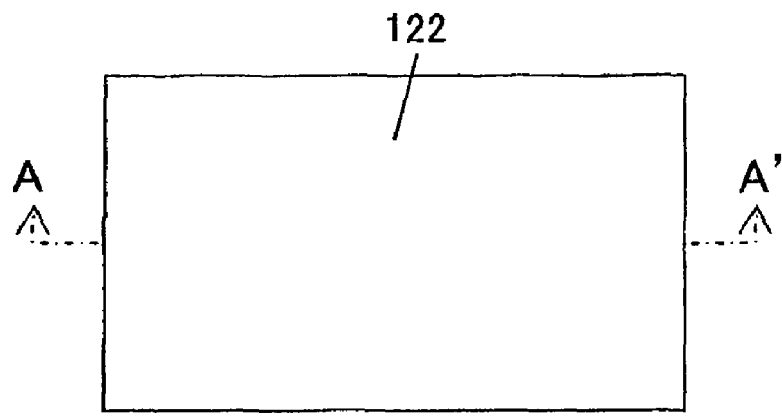
FIG. 3(a) is a top plan view showing one of the steps of the semiconductor production method according to the embodiment
Figure 3B:
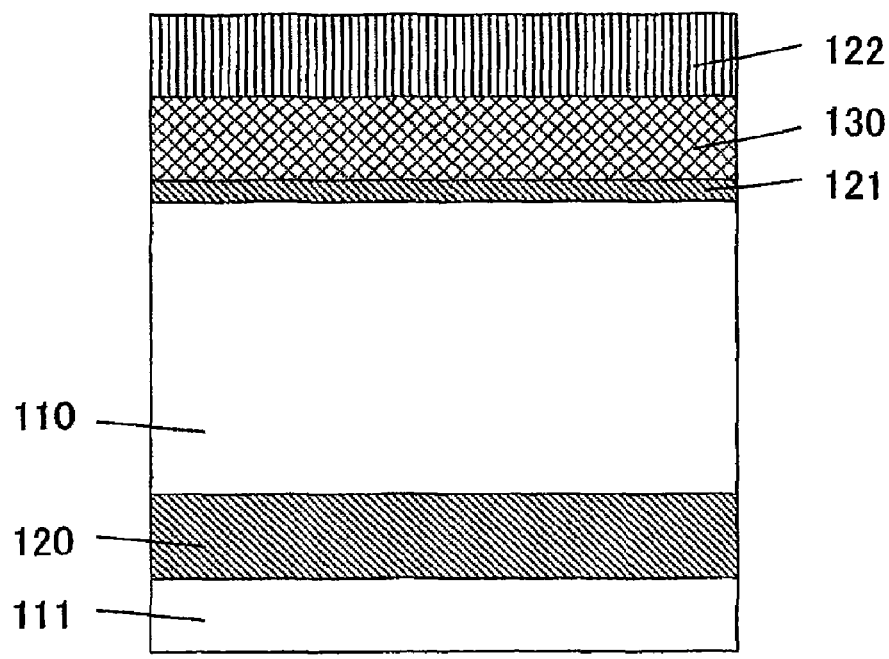
FIG. 3(b) is a sectional view showing the step of the semiconductor production method according to the embodiment, taken along the line A-A' in FIG. 3(a).

Referring to FIGS. 3(a) and 3(b), a silicon nitride film 130 serving as a first hard mask is formed, and then a silicon oxide film 122 is formed. After forming the silicon nitride film, a thickness measurement operation for the nitride film may be performed. Further, after forming the silicon oxide film, a thickness measurement operation for the silicon oxide film may be performed (Steps 8, 9, 10, 11 in FIG. 1).

Figure 4A:
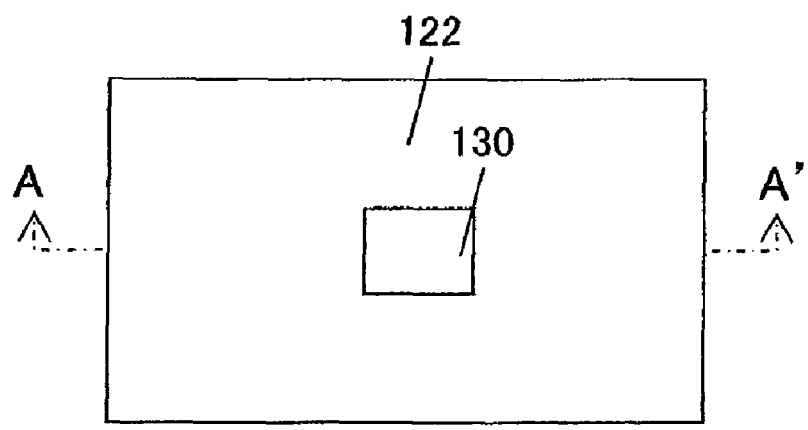
FIG. 4(a) is a top plan view showing one of the steps of the semiconductor production method according to the embodiment
Figure 4B:
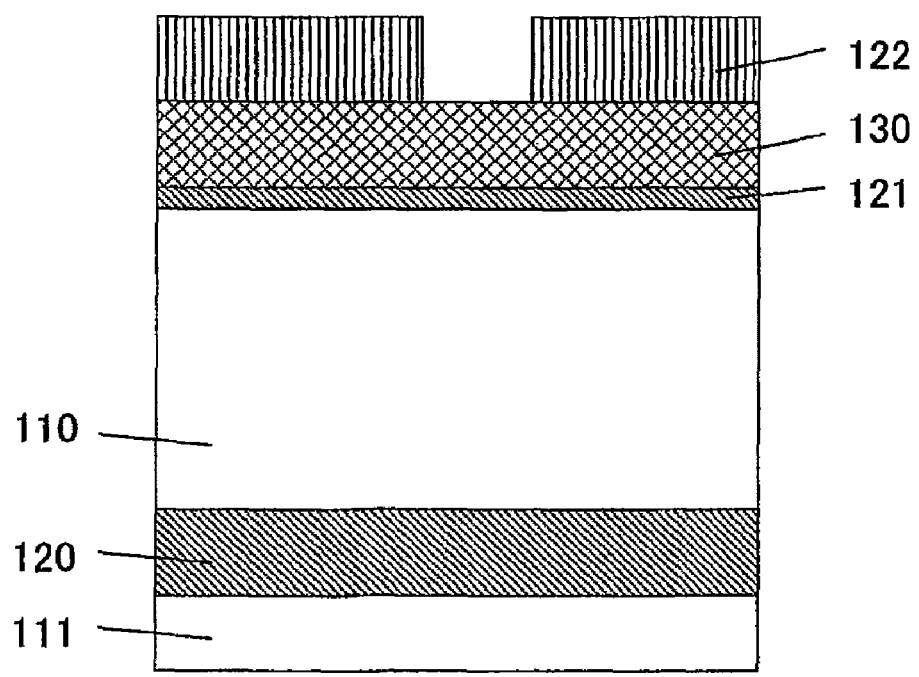
FIG. 4(b) is a sectional view showing the step of the semiconductor production method according to the embodiment, taken along the line A-A' in FIG. 4(a).

Referring to FIGS. 4(a) and 4(b), a resist is applied, and a pattern having an inverted shape of a top view of a pillar-shaped silicon layer is formed using the resist by lithography.

Then, a hole is formed in the silicon oxide film 122 by dry etching, in such a manner that it penetrates through the silicon oxide film 122 at a position for forming the pillar-shaped silicon layer. After the lithography, a dimension measurement operation and a verification operation may be performed. Further, after the etching, a post-etching cleaning operation may be performed (Steps 12, 13, 14, 15, 16, 17, 18, 19 in FIG. 1).

Figure 38A:
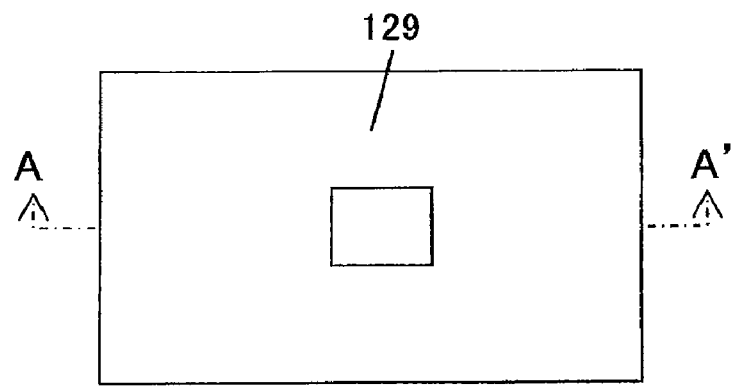
FIG. 38(a) is a top plan view showing a step in one modification of the semiconductor production method according to the embodiment.
Figure 38B:
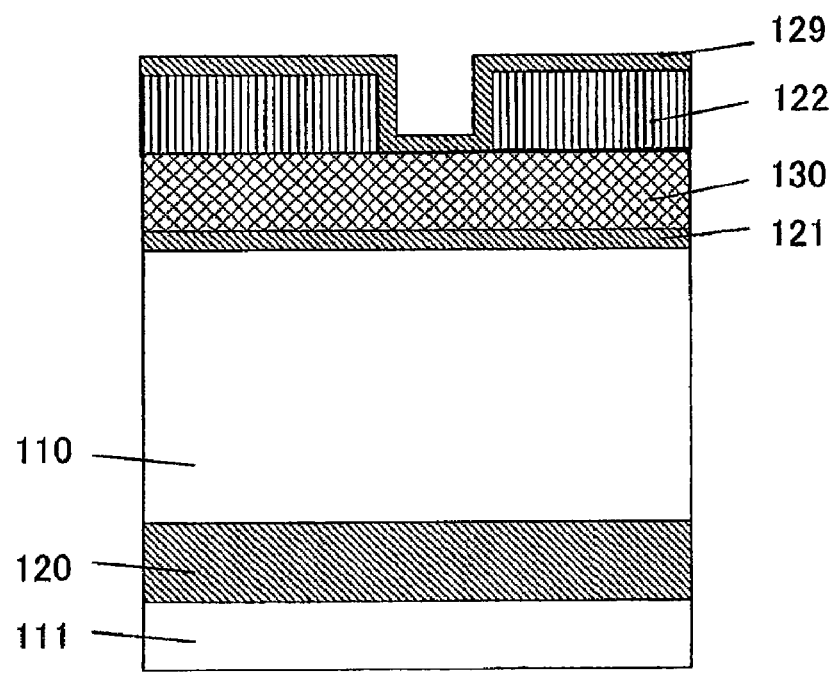
FIG. 38(b) is a sectional view showing the step in the modification of the semiconductor production method according to the embodiment, taken along the line A-N in FIG. 38(a).
Figure 39A:
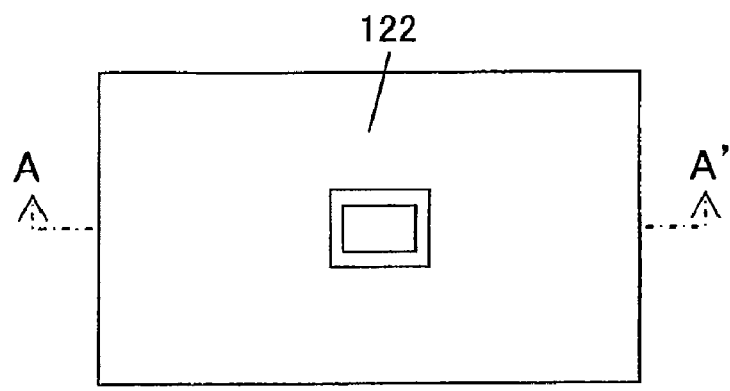
FIG. 39(a) is a top plan view showing a step in the modification of the semiconductor production method according to the embodiment.
Figure 39B:
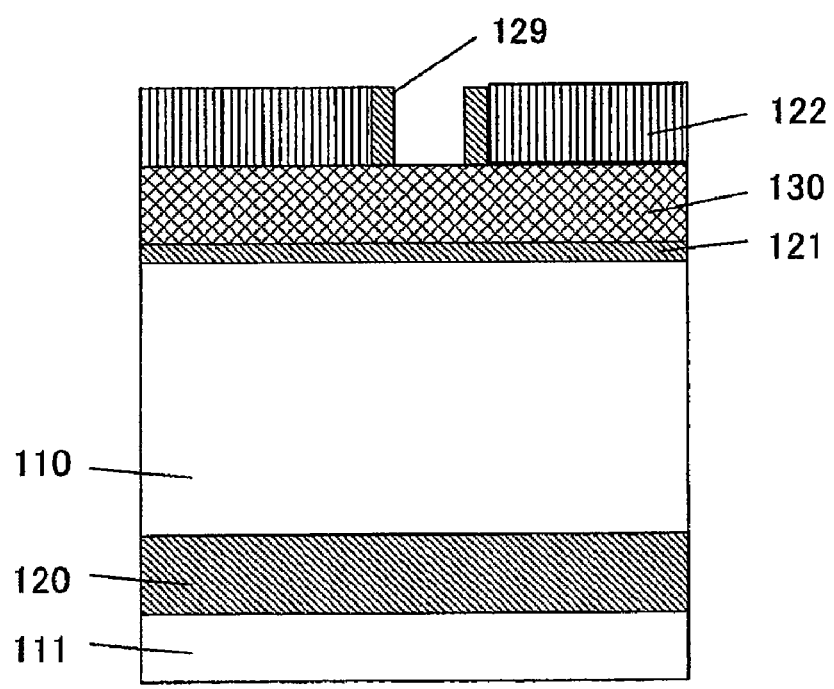
FIG. 39(b) is a sectional view showing a step in the modification of the semiconductor production method according to the embodiment, taken along the line A-A' in FIG. 39(a).

Subsequently, a diameter of the hole penetrating through the silicon oxide film 122 may be reduced by depositing an oxide film 129 as shown in FIGS. 38(a) and 38(b), and etching back the oxide film 129 as shown in FIGS. 39(a) and 39(b).

Figure 5A:
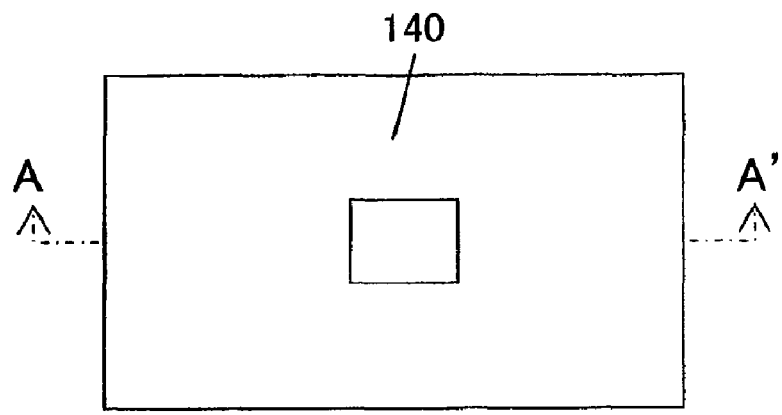
FIG. 5(a) is a top plan view showing one of the steps of the semiconductor production method according to the embodiment
Figure 5B:
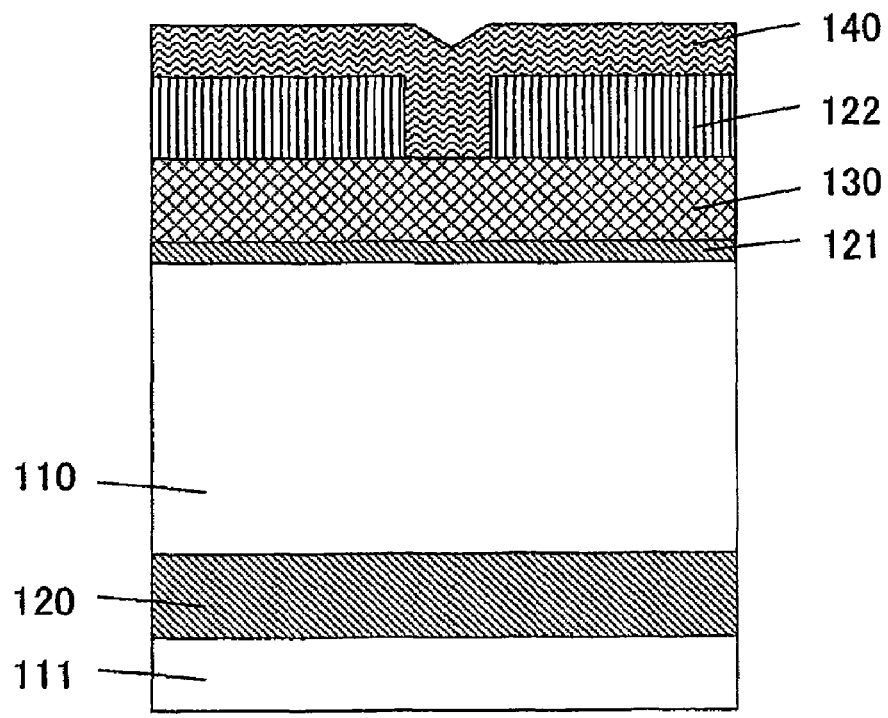
FIG. 5(b) is a sectional view showing the step of the semiconductor production method according to the embodiment, taken along the line A-A' in FIG. 5(a).

Referring to FIGS. 5(a) and 5(b), an amorphous silicon or polysilicon film 140 is formed to fill the hole formed in the silicon oxide film 122. Before depositing the amorphous silicon or polysilicon, a pre-deposition cleaning operation may be performed. Further, after the deposition, a thickness measurement operation for the amorphous silicon or polysilicon film may be performed (Steps 20, 21, 22 in FIG. 1).

Figure 6A:
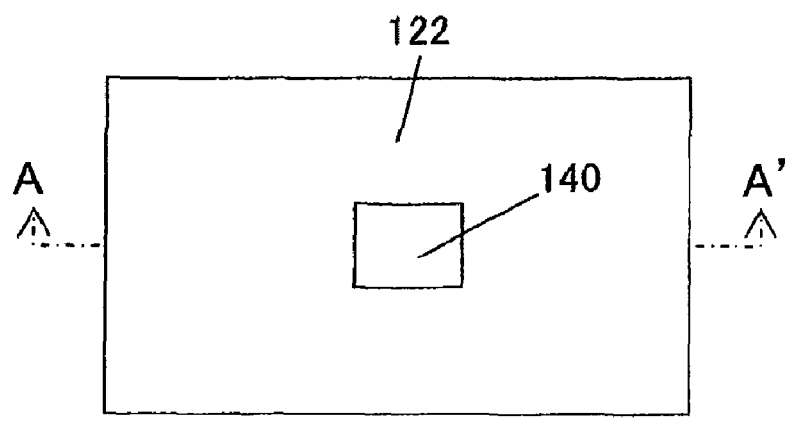
FIG. 6(a) is a top plan view showing one of the steps of the semiconductor production method according to the embodiment
Figure 6B:
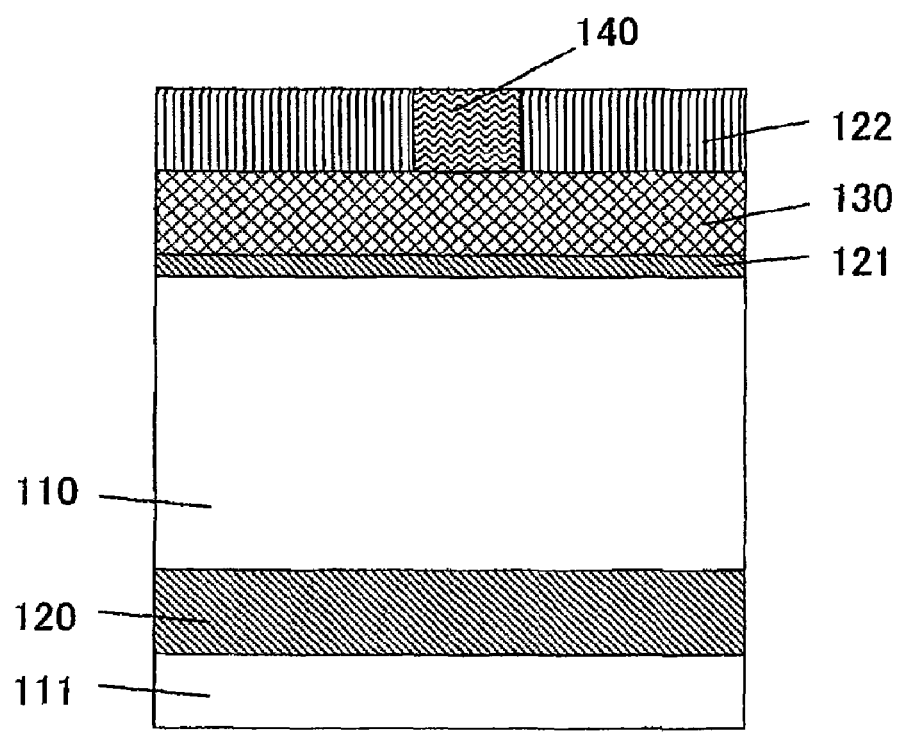
FIG. 6(b) is a sectional view showing the step of the semiconductor production method according to the embodiment, taken along the line A-A' in FIG. 6(a).

Referring to FIGS. 6(a) and 6(b), a portion of the amorphous silicon or polysilicon film 140 formed on the silicon oxide film 122 is polished and removed by chemical mechanical polishing (CMP). After the polishing, a thickness measurement operation for the amorphous silicon or polysilicon film may be performed (Steps 23, 24 in FIG. 1).

Figure 7A:
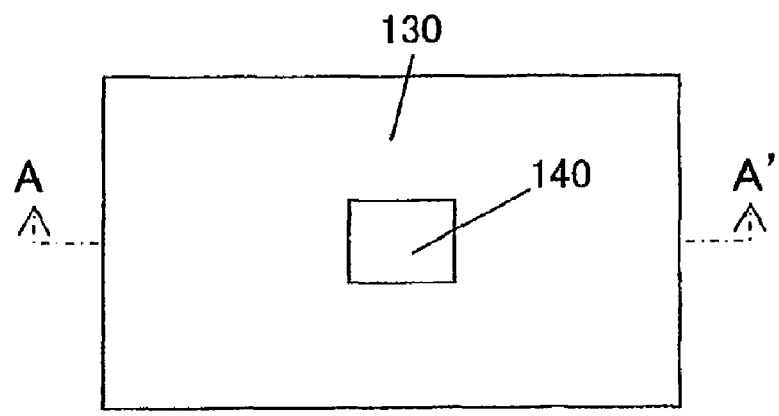
FIG. 7(a) is a top plan view showing one of the steps of the semiconductor production method according to the embodiment
Figure 7B:
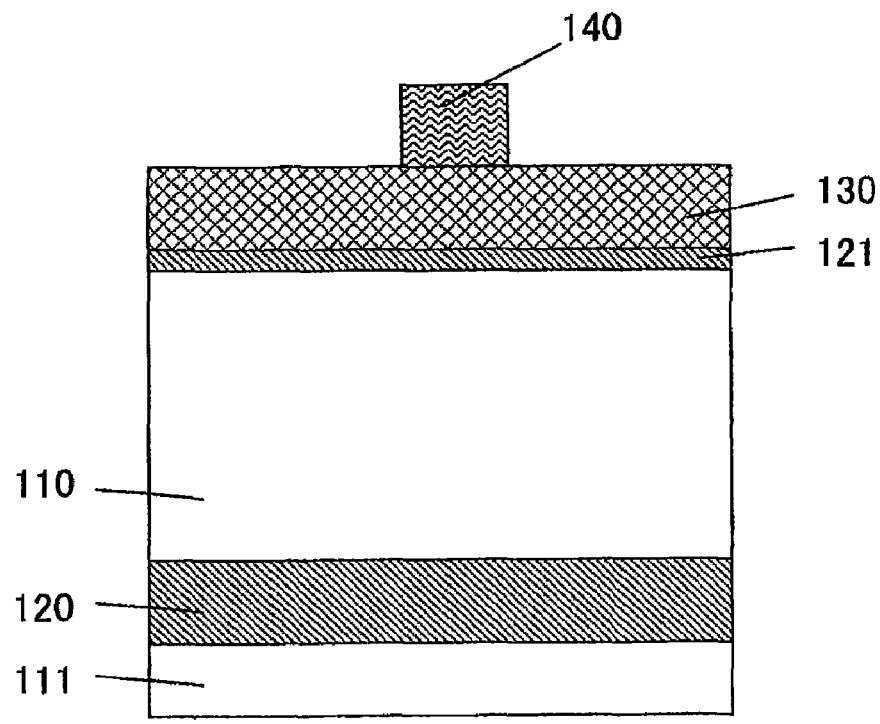
FIG. 7(b) is a sectional view showing the step of the semiconductor production method according to the embodiment, taken along the line A-A' in FIG. 7(a).

Referring to FIGS. 7(a) and 7(b), the silicon oxide film 122 is removed by wet etching using hydrofluoric acid or the like, or dry etching, to form an amorphous silicon or polysilicon film-based mask 140 serving as a second hard mask to be used during dry etching for the pillar-shaped silicon layer in a subsequent step (Step 25 in FIG. 1).

Figure 8A:
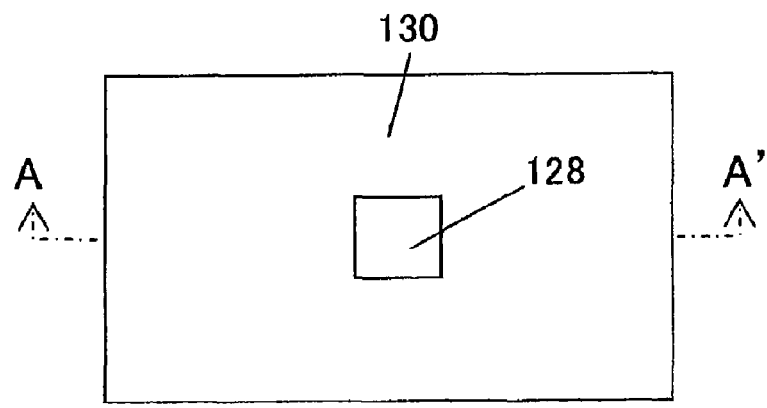
FIG. 8(a) is a top plan view showing one of the steps of the semiconductor production method according to the embodiment
Figure 8B:
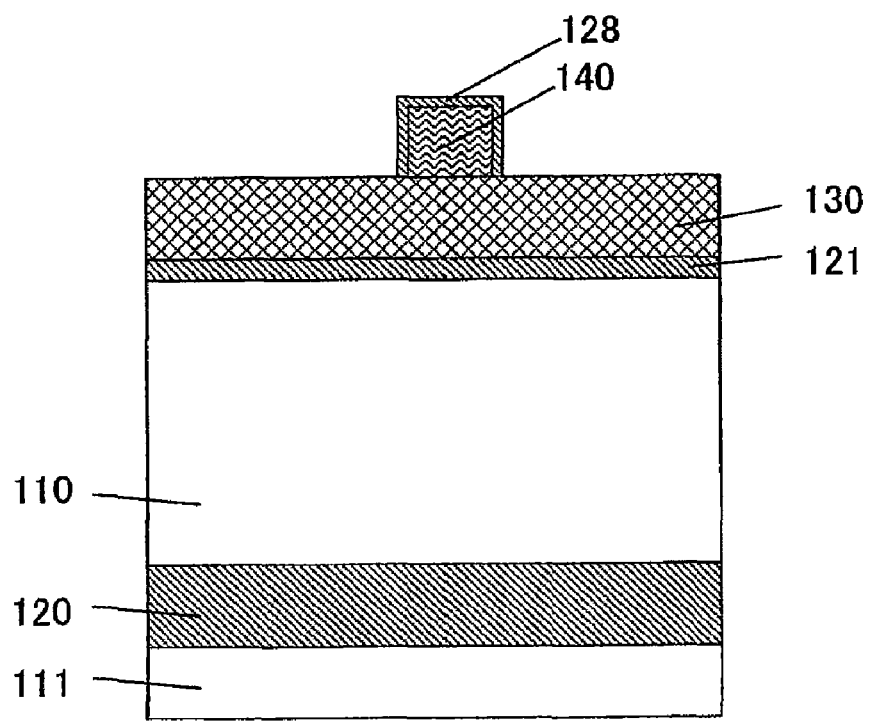
FIG. 8(b) is a sectional view showing the step of the semiconductor production method according to the embodiment, taken along the line A-A' in FIG. 8(a).

Referring to FIGS. 8(a) and 8(b), the amorphous silicon or polysilicon film-based mask 140 is sacrificially oxidized to form a silicon oxide film 128 thereon to reduce a size of the amorphous silicon or polysilicon film-based mask. Before the sacrificial oxidation, a pre-sacrificial-oxidation cleaning operation may be performed. Further, after the oxidation, a thickness measurement operation for the sacrificial oxide film may be performed (Steps 26, 27, 28 in FIG. 1). Based on the sacrificial oxidation, a size of the pillar-shaped silicon layer to be formed in the step illustrated in FIGS. 11(a) and 11(b) can be reduced. This capability to reduce a diameter of the pillar-shaped silicon layer makes it possible to suppress short-channel effects so as to reduce a leak current.

Figure 9A:
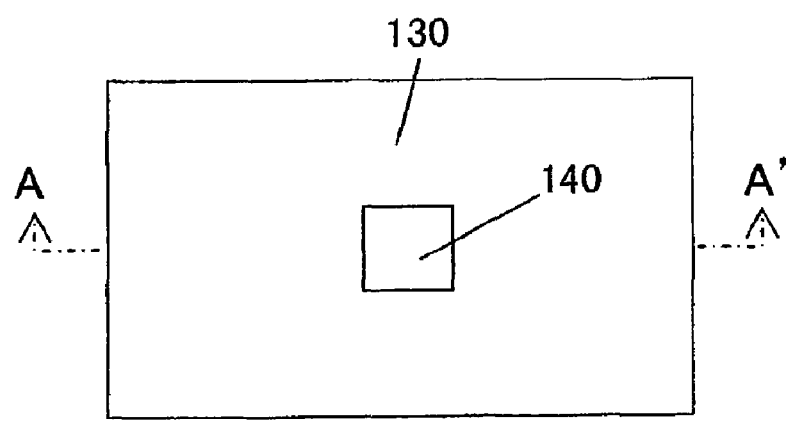
FIG. 9(a) is a top plan view showing one of the steps of the semiconductor production method according to the embodiment
Figure 9B:
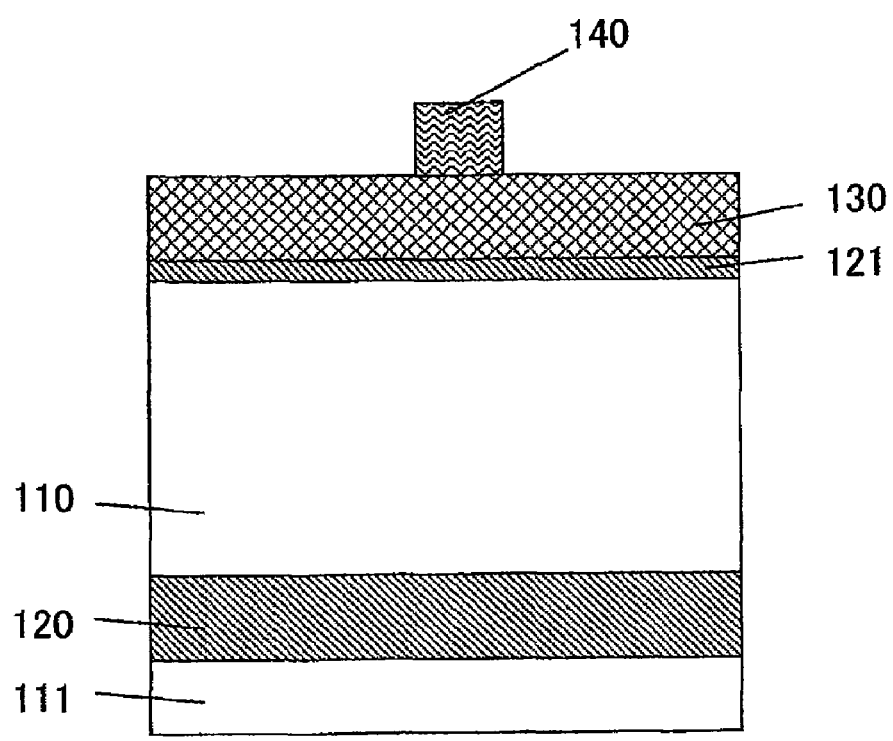
FIG. 9(b) is a sectional view showing the step of the semiconductor production method according to the embodiment, taken along the line A-A' in FIG. 9(a).

Referring to FIGS. 9(a) and 9(b), the silicon oxide film 128 on a surface of the amorphous silicon or polysilicon film-based mask 140 is removed by wet etching using hydrofluoric acid or the like, or dry etching (Step 29 in FIG. 1).

Figure 10A:
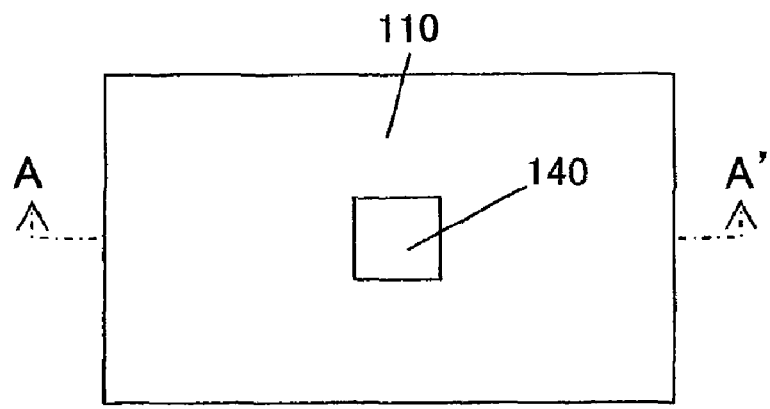
FIG. 10(a) is a top plan view showing one of the steps of the semiconductor production method according to the embodiment
Figure 10B:
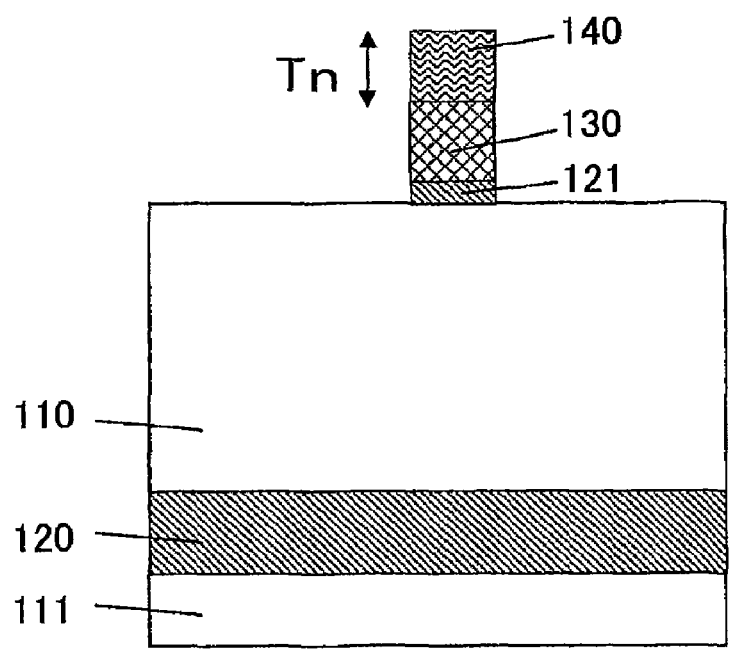
FIG. 10(b) is a sectional view showing the step of the semiconductor production method according to the embodiment, taken along the line A-A' in FIG. 10(a).

Referring to FIGS. 10(a) and 10(b), the silicon nitride film (first hard mask) 130 and the pad oxide film 121 are dry-etched using the amorphous silicon or polysilicon film-based mask (second hard mask) 140 (Steps 30, 31 in FIG. 1).

Figure 11A:
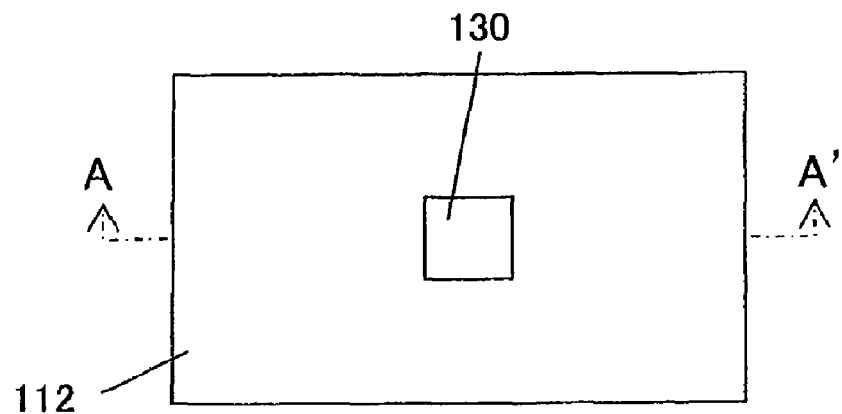
FIG. 11(a) is a top plan view showing one of the steps of the semiconductor production method according to the embodiment
Figure 11B:
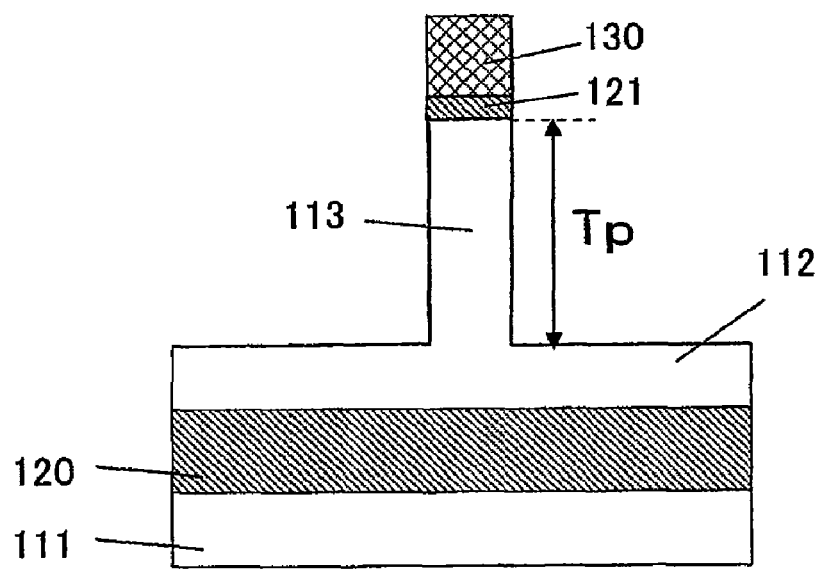
FIG. 11(b) is a sectional view showing the step of the semiconductor production method according to the embodiment, taken along the line A-A' in FIG. 11(a).

Referring to FIGS. 11(a) and 11(b), the pillar-shaped silicon layer 113 is formed by dry etching using the silicon nitride film-based mask (first hard mask) 130 and the amorphous silicon or polysilicon film-based mask (second hard mask) 140. After the etching, an organic-substance removal operation, a scanning electron microscopic (SEM) inspection operation, and a step-height verification operation, may be performed (Steps 32, 33, 34, 35 in FIG. 1). During the etching, the amorphous silicon or polysilicon film-based mask (second hard mask) 140 is also etched. When the amorphous silicon or polysilicon film-based mask 140 is fully etched away, a plasma emission intensity detectable by a dry etching apparatus is changed. Thus, an etching end-point detection can be performed by detecting the change in the plasma emission intensity. This makes it possible to stably control a height dimension of the pillar-shaped silicon layer 113 without relying on an etching rate.

As a prerequisite to the use of the end-point detection process, it is necessary that the amorphous silicon or polysilicon film-based mask 140 before the dry etching for the pillar-shaped silicon layer is formed to have a film thickness Tn (FIG. 10(b)) less than the height dimension Tp of the pillar-shaped silicon layer.

In this step, a continuous planar silicon layer 112 is formed on the buried oxide layer 120.

Figure 12A:
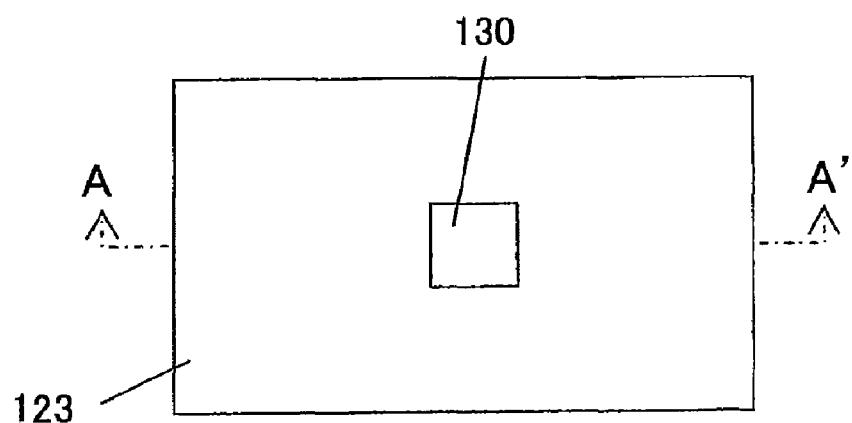
FIG. 12(a) is a top plan view showing one of the steps of the semiconductor production method according to the embodiment
Figure 12B:
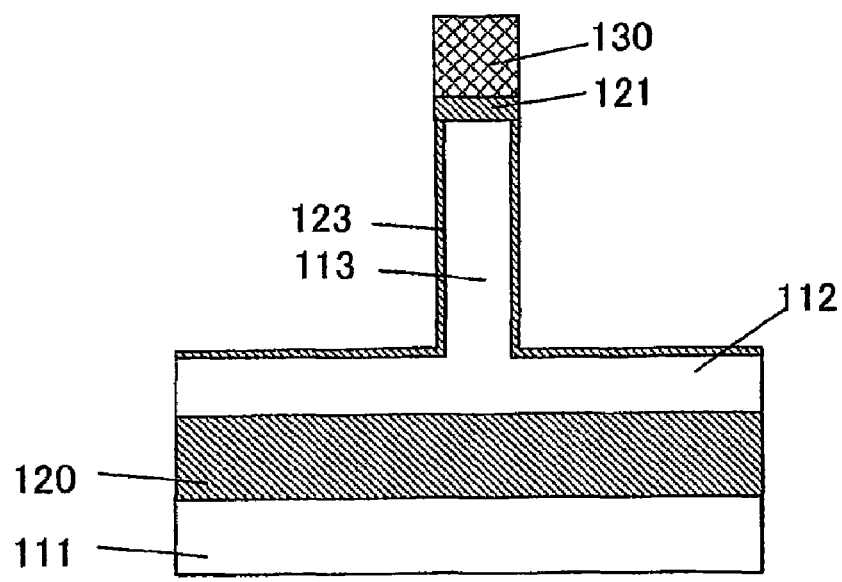
FIG. 12(b) is a sectional view showing the step of the semiconductor production method according to the embodiment, taken along the line A-A' in FIG. 12(a).

Referring to FIGS. 12(a) and 12(b), in order to reduce irregularities in a region of the sidewall of the pillar-shaped silicon layer 113 serving as a channel region, and remove a silicon surface implanted with carbon and others during the dry etching, respective surfaces of the pillar-shaped silicon layer 113 and the continuous planar silicon layer 112 are sacrificially oxidized and formed as a sacrificial oxide film 123. Before the sacrificial oxidation, a pre-sacrificial-oxidation cleaning operation may be performed. Further, after the sacrificial oxidation, a thickness measurement operation for the sacrificial oxide film may be performed (Steps 36, 37, 38 in FIG. 1).

Figure 13A:
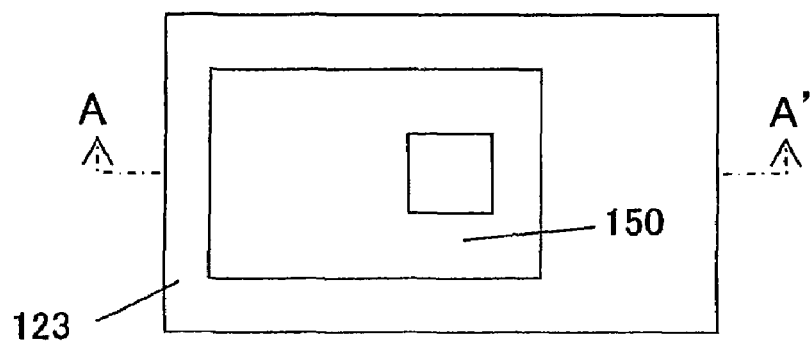
FIG. 13(a) is a top plan view showing one of the steps of the semiconductor production method according to the embodiment
Figure 13B:
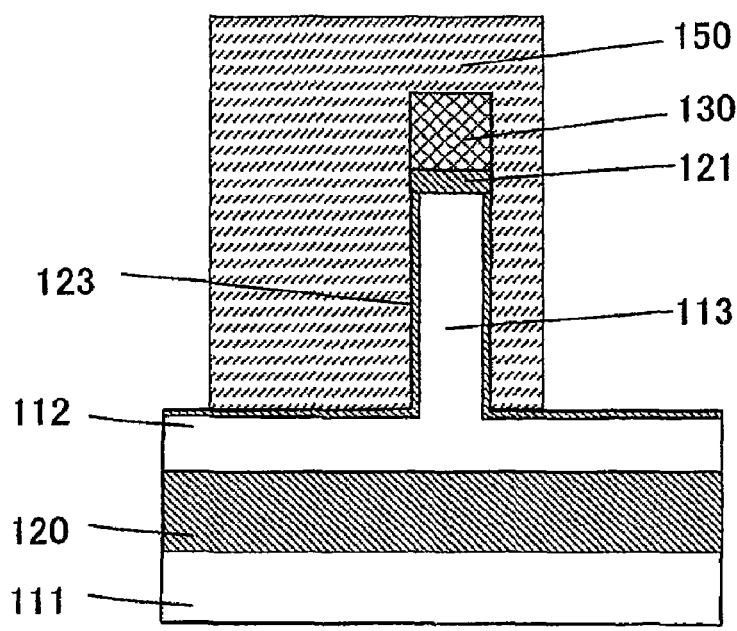
FIG. 13(b) is a sectional view showing the step of the semiconductor production method according to the embodiment, taken along the line A-A' in FIG. 13(a).

Referring to FIGS. 13(a) and 13(b), a resist 150 is applied, and a pattern for a source diffusion layer is formed using the resist by lithography. After the lithography, an overlay-error measurement operation, a dimension measurement operation and a verification operation may be performed (Steps 39, 40, 41, 42, 43 in FIG. 1). The sacrificial oxide film 123 formed on the pillar-shaped silicon layer 113 and the continuous planar silicon layer 112 by the sacrificial oxidation will protect surfaces of the silicon layers from contamination due to by-products to be produced during dry etching in the next step.

Figure 14A:
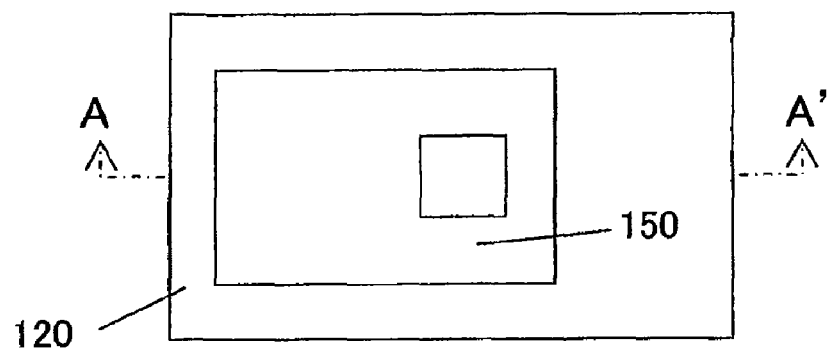
FIG. 14(a) is a top plan view showing one of the steps of the semiconductor production method according to the embodiment
Figure 14B:
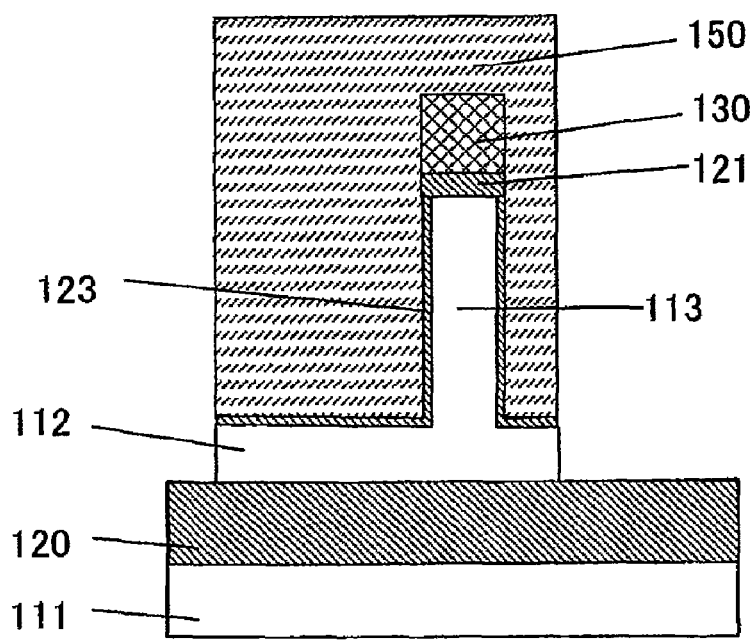
FIG. 14(b) is a sectional view showing the step of the semiconductor production method according to the embodiment, taken along the line A-A' in FIG. 14(a).

Referring to FIGS. 14(a) and 14(b), the continuous planar silicon layer 112 is dry-etched to isolate a planar silicon layer 112 from other elements (Steps 44, 45 in FIG. 1).

Figure 15A:
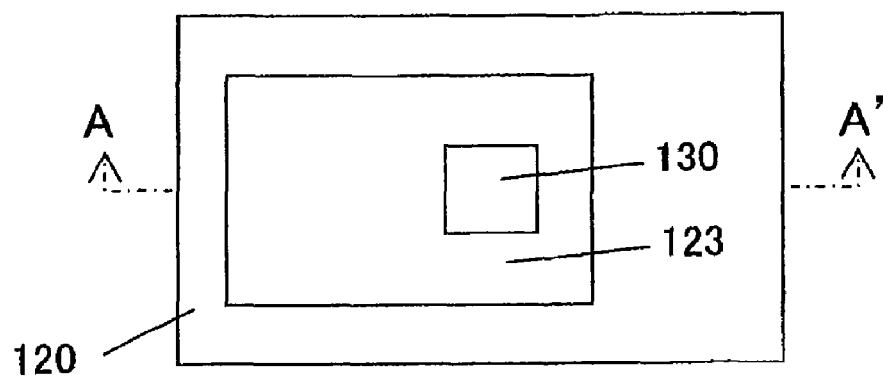
FIG. 15(a) is a top plan view showing one of the steps of the semiconductor production method according to the embodiment
Figure 15B:
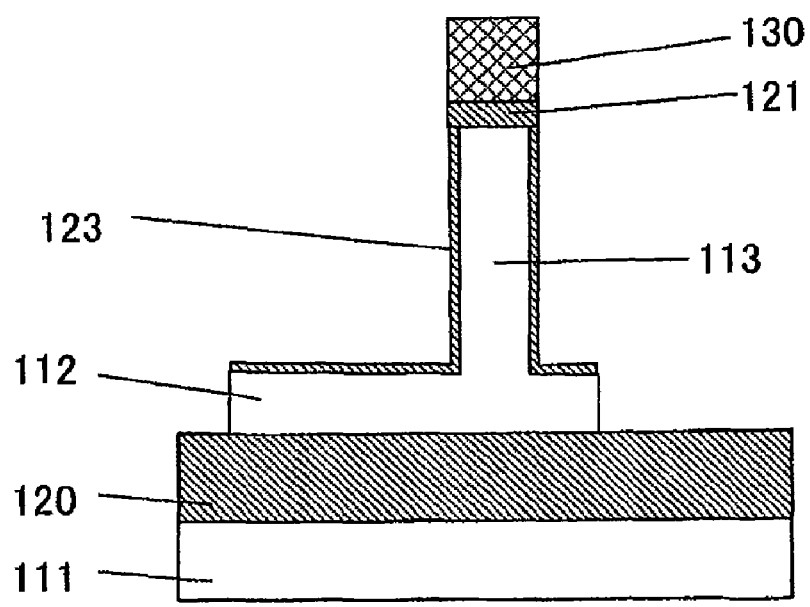
FIG. 15(b) is a sectional view showing the step of the semiconductor production method according to the embodiment, taken along the line A-A' in FIG. 15(a).

Referring to FIGS. 15(a) and 15(b), the resist is removed. After the removal, an organic-substance removal operation, an SEM inspection operation, and a step-height verification operation, may be performed (Steps 46, 47, 48 in FIG. 1).

Figure 16A:
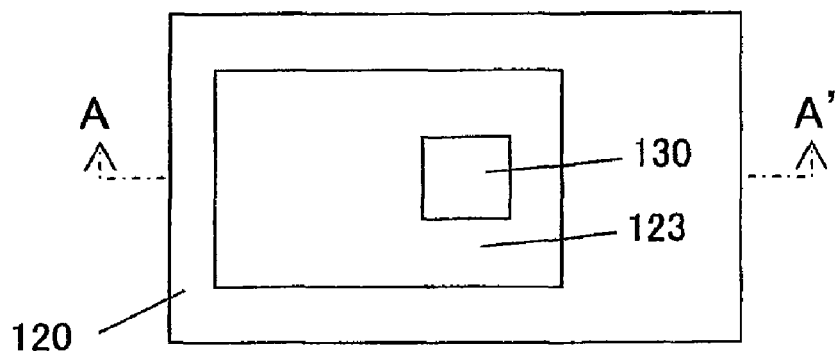
FIG. 16(a) is a top plan view showing one of the steps of the semiconductor production method according to the embodiment
Figure 16B:
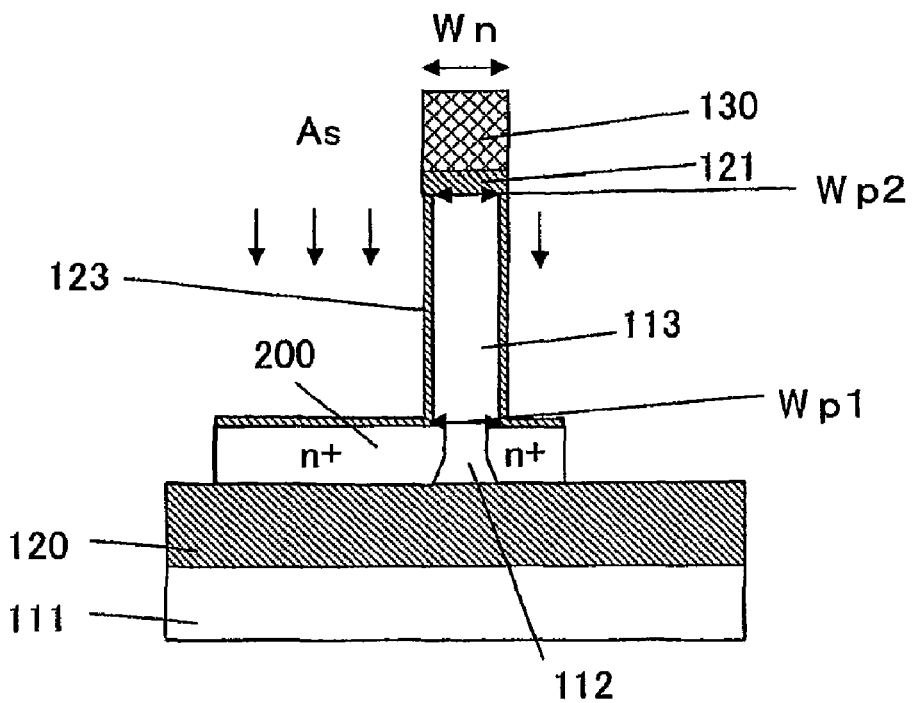
FIG. 16(b) is a sectional view showing the step of the semiconductor production method according to the embodiment, taken along the line A-A' in FIG. 16(a).

Referring to FIGS. 16(a) and 16(b), an impurity, such as phosphorus (P) or arsenic (As), is introduced into the surface of the planar silicon layer 112 by impurity implantation or the like, to form an $N^+$ source diffusion layer 200 in the planar silicon layer 112 (Steps 49, 50 in FIG. 1). In this step, the sacrificial oxide film 123 formed during the sacrificial oxidation of the pillar-shaped silicon layer 113 and the continuous planar silicon layer 112 is used as a screen oxide film, which makes it possible to reduce the number of production steps.

If an impurity is implanted from the sidewall of the pillar-shaped silicon layer 113 during the implantation, it becomes a factor causing a variation in transistor characteristics. Therefore, it is essential that a width ($Wp_1$, $Wp_2$) of the pillar-shaped silicon layer 113 is less than a width Wn of the nitride film 130, wherein $Wp_1$ is a width of a bottom of the pillar-shaped silicon layer, and $Wp_2$ is a width of a top of the pillar-shaped silicon layer.

Preferably, the impurity is implanted at a small angle, specifically, at an angle ranging from zero to 6 degrees, to prevent the impurity from being implanted from the sidewall of the pillar-shaped silicon layer 113 during the implantation.

In this step, no impurity is implanted into an upper portion of the pillar-shaped silicon layer 113 due to the presence of the silicon nitride film 130 formed on the pillar-shaped silicon layer 113. Preferably, the implantation for the $N^+$ source diffusion layer 200 is performed at an angle of zero degree. Differently, an impurity implantation for a drain diffusion layer to be formed in an upper portion of the pillar-shaped silicon layer 113 in a subsequent step is preferably performed at a certain angle, because the drain diffusion layer is formed in a self-alignment manner. As above, the respective implantation for the source diffusion layer to be formed in the planar silicon layer and the drain diffusion layer to be formed in the upper portion of the pillar-shaped silicon layer are performed separately, so that conditions for the respective implantations can be easily optimized. This makes it possible to suppress short-channel effects so as to reduce a leak current.

Figure 17A:
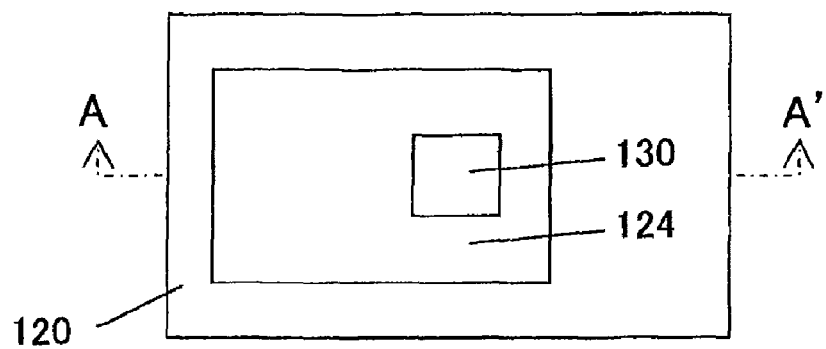
FIG. 17(a) is a top plan view showing one of the steps of the semiconductor production method according to the embodiment
Figure 17B:
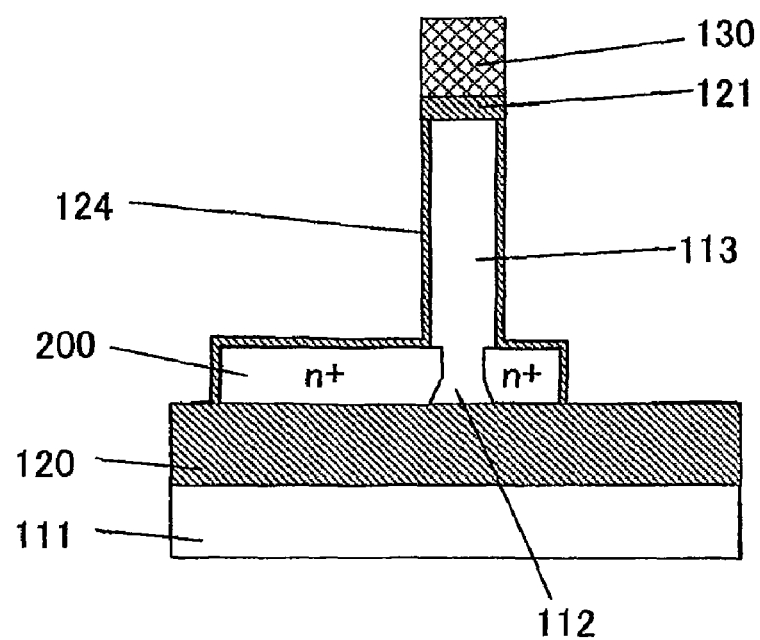
FIG. 17(b) is a sectional view showing the step of the semiconductor production method according to the embodiment, taken along the line A-A' in FIG. 17(a).

Referring to FIGS. 17(a) and 17(b), the sacrificial oxide film 123 is removed by wet etching using hydrofluoric acid or the like, and then a silicon oxide film or a silicon oxynitride is formed as a gate dielectric film 124. Before forming the gate dielectric film, a pre-gate-formation cleaning operation may be performed. Further, after forming the gate dielectric film, a thickness measurement operation for the gate dielectric film may be performed (Steps 51, 52, 53, 54 in FIG. 1).

Figure 18A:
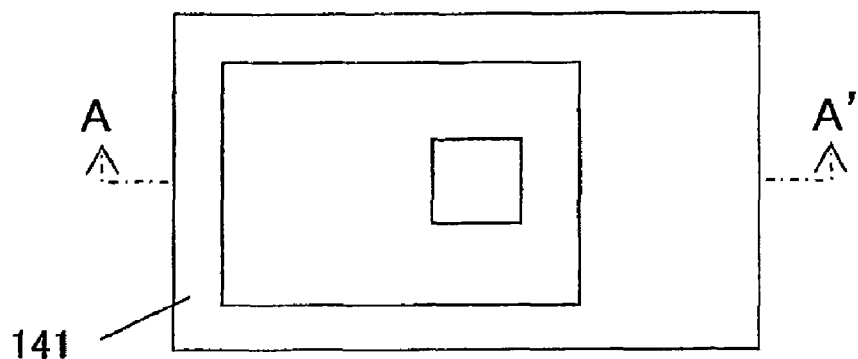
FIG. 18(a) is a top plan view showing one of the steps of the semiconductor production method according to the embodiment
Figure 18B:
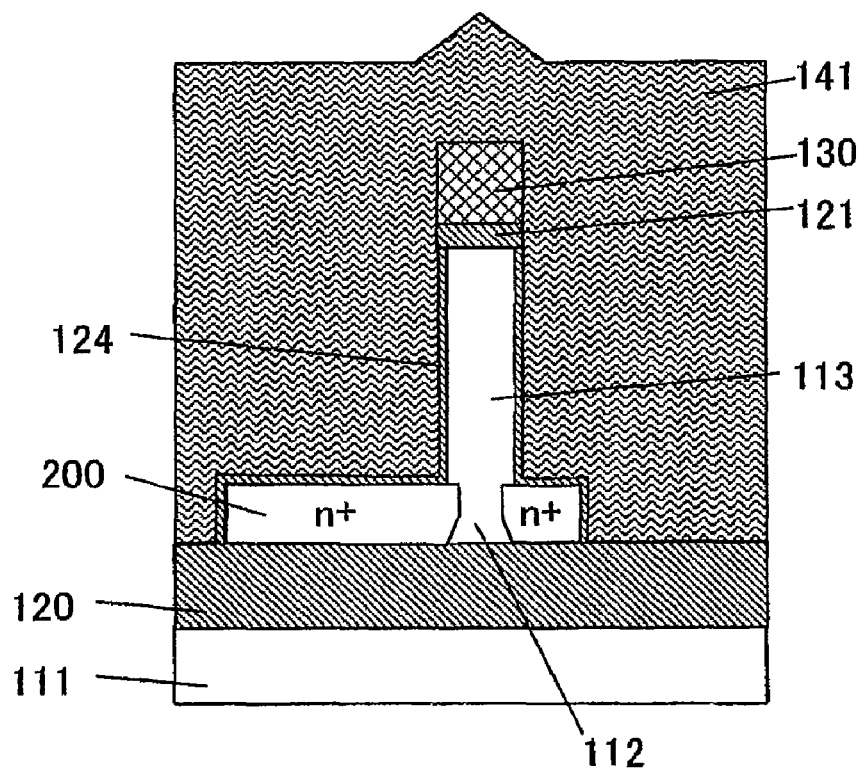
FIG. 18(b) is a sectional view showing the step of the semiconductor production method according to the embodiment, taken along the line A-A' in FIG. 18(a).

Referring to FIGS. 18(a) and 18(b), an amorphous silicon or polysilicon film 141 is formed as a gate conductive film to allow the pillar-shaped silicon layer 113 to be buried therein. After forming the gate conductive film, a thickness measurement operation for the gate conductive film may be performed (Steps 55, 56 in FIG. 1).

Figure 19A:
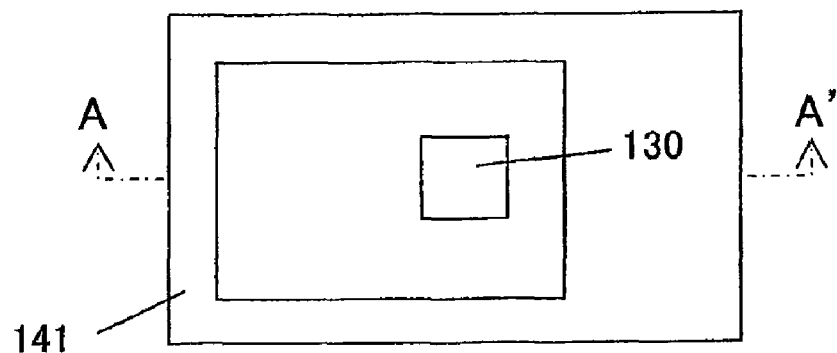
FIG. 19(a) is a top plan view showing one of the steps of the semiconductor production method according to the embodiment
Figure 19B:
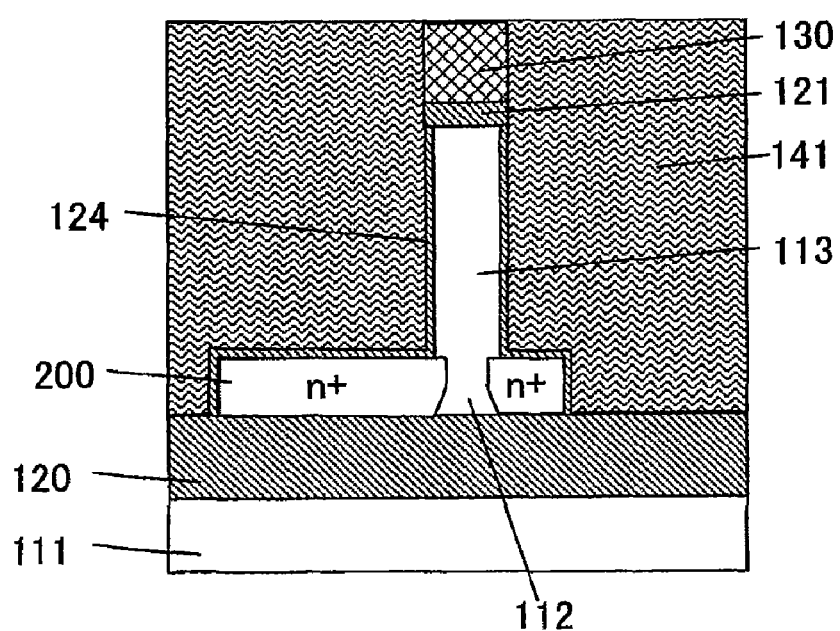
FIG. 19(b) is a sectional view showing the step of the semiconductor production method according to the embodiment, taken along the line A-A' in FIG. 19(a).

Referring to FIGS. 19(a) and 19(b), the amorphous silicon or polysilicon film 141 is polished by chemical mechanical polishing (CMP) to flatten an upper surface of the gate conductive film. The silicon nitride film (first hard mask) 130 is used as a CMP stopper during the CMP, which makes it possible to control an amount of CMP with high repeatability (Step 57 in FIG. 1).

Figure 20A:
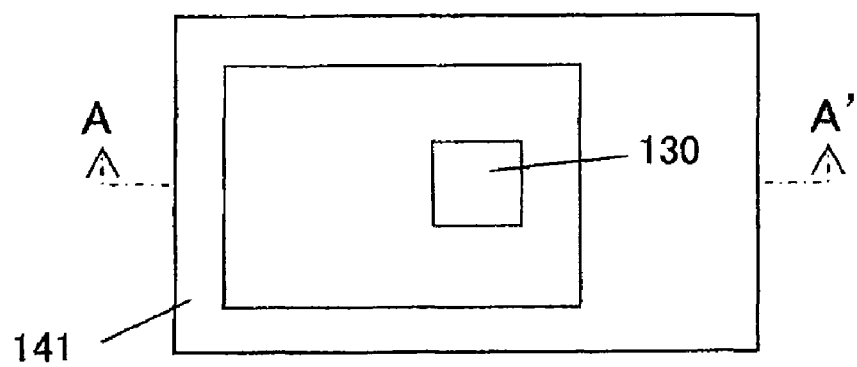
FIG. 20(a) is a top plan view showing one of the steps of the semiconductor production method according to the embodiment
Figure 20B:
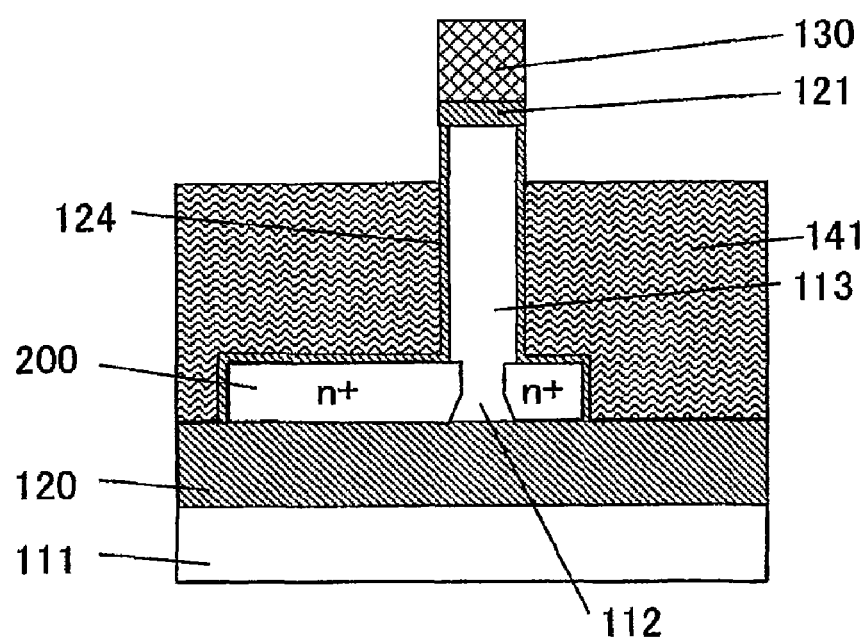
FIG. 20(b) is a sectional view showing the step of the semiconductor production method according to the embodiment, taken along the line A-A' in FIG. 20(a).

Referring to FIGS. 20(a) and 20(b), the amorphous silicon or polysilicon film 141 is etched back to set a gate length (Step 58 in FIG. 1).

Figure 21A:
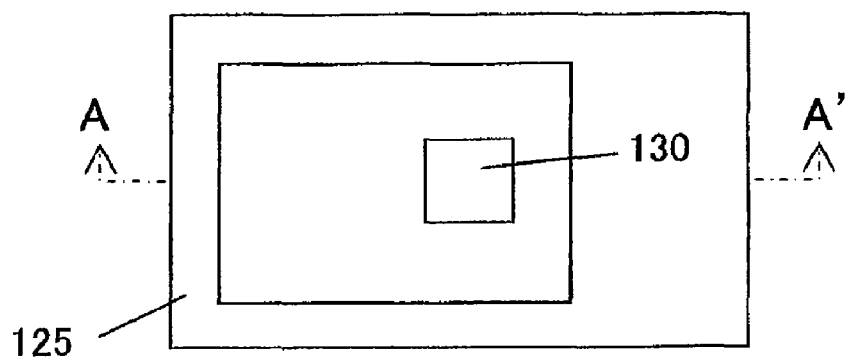
FIG. 21(a) is a top plan view showing one of the steps of the semiconductor production method according to the embodiment
Figure 21B:
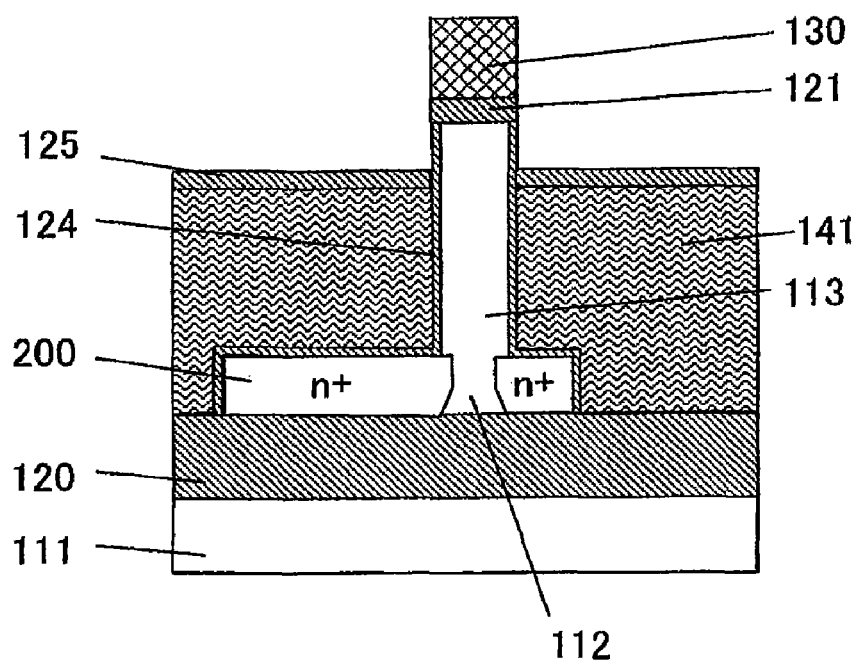
FIG. 21(b) is a sectional view showing the step of the semiconductor production method according to the embodiment, taken along the line A-A' in FIG. 21(a).

Referring to FIGS. 21(a) and 21(b), a surface of the amorphous silicon or polysilicon film 141 serving as the gate conductive film is oxidized to form a silicon oxide film 125 on an upper surface of the amorphous silicon or polysilicon film 141. Before the oxidation, a pre-oxidation cleaning operation may be performed (Steps 59, 60 in FIG. 1). The silicon oxide film 125 serves as a means to protect the upper surface of the gate from a wet or dry treatment to be performed in a subsequent step. This makes it possible to suppress a change in the gate length, i.e., damage of the gate from the side of the upper surface thereof.

Figure 22A:
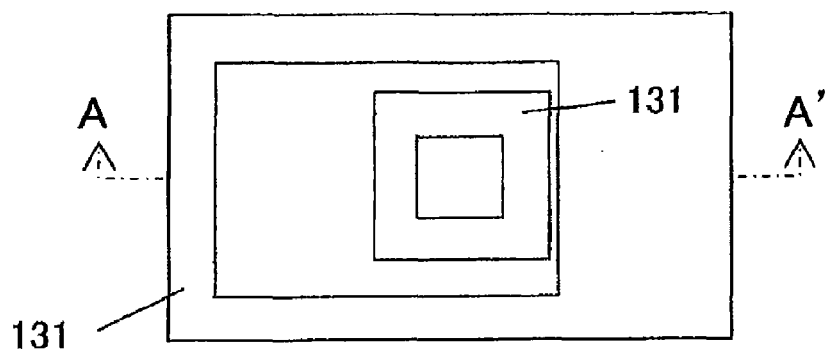
FIG. 22(a) is a top plan view showing one of the steps of the semiconductor production method according to the embodiment
Figure 22B:
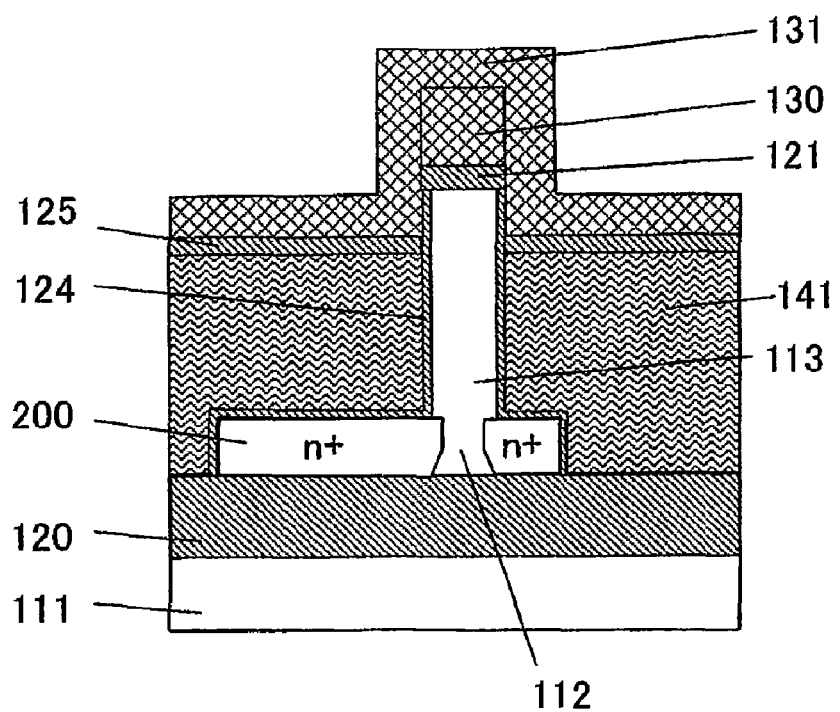
FIG. 22(b) is a sectional view showing the step of the semiconductor production method according to the embodiment, taken along the line A-A' in FIG. 22(a).

Referring to FIGS. 22(a) and 22(b), a silicon nitride film 131 is formed to have a film thickness greater than a desired film thickness of a gate electrode. After forming the silicon nitride film, a thickness measurement operation for the silicon nitride film may be performed (Steps 61, 62 in FIG. 1).

Figure 23A:
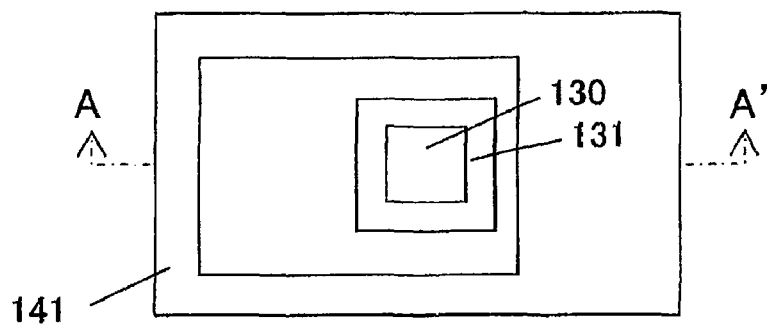
FIG. 23(a) is a top plan view showing one of the steps of the semiconductor production method according to the embodiment
Figure 23B:
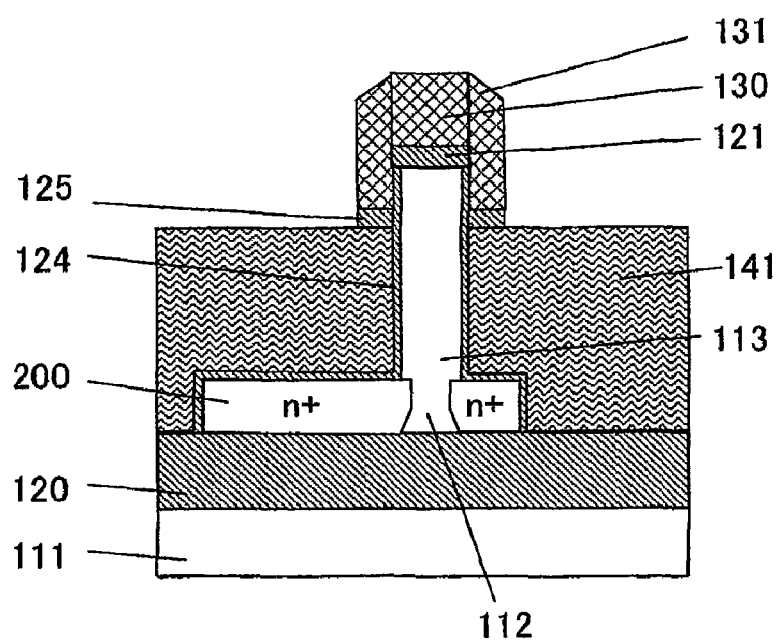
FIG. 23(b) is a sectional view showing the step of the semiconductor production method according to the embodiment, taken along the line A-A' in FIG. 23(a).

Referring to FIGS. 23(a) and 23(b), the silicon nitride film 131 is etched back to form a silicon nitride film-based sidewall 131. During the etching-back, the silicon oxide film 125 is also etched. After the etching-back, an organic-substance removal operation and a configuration measurement operation may be performed (Steps 63, 64, 65 in FIG. 1). A film thickness of a gate electrode to be formed is determined by a film thickness of the silicon nitride film-based sidewall 131. Thus, a film thickness of the silicon nitride film 131 to be formed in the preceding step, and conditions for the etching-back in this step, are adjusted to allow the gate electrode to have a desired film thickness.

Figure 24A:
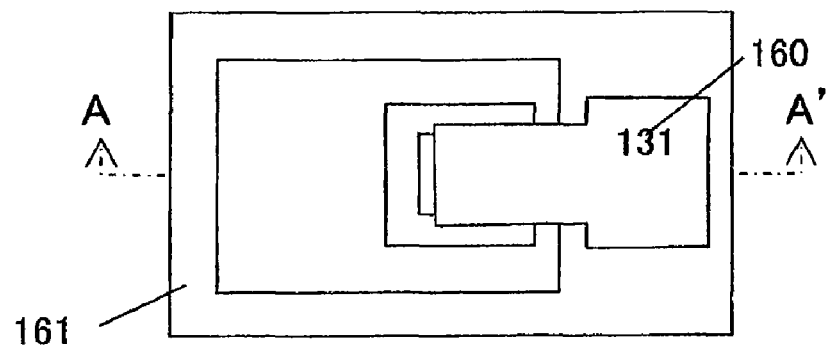
FIG. 24(a) is a top plan view showing one of the steps of the semiconductor production method according to the embodiment
Figure 24B:
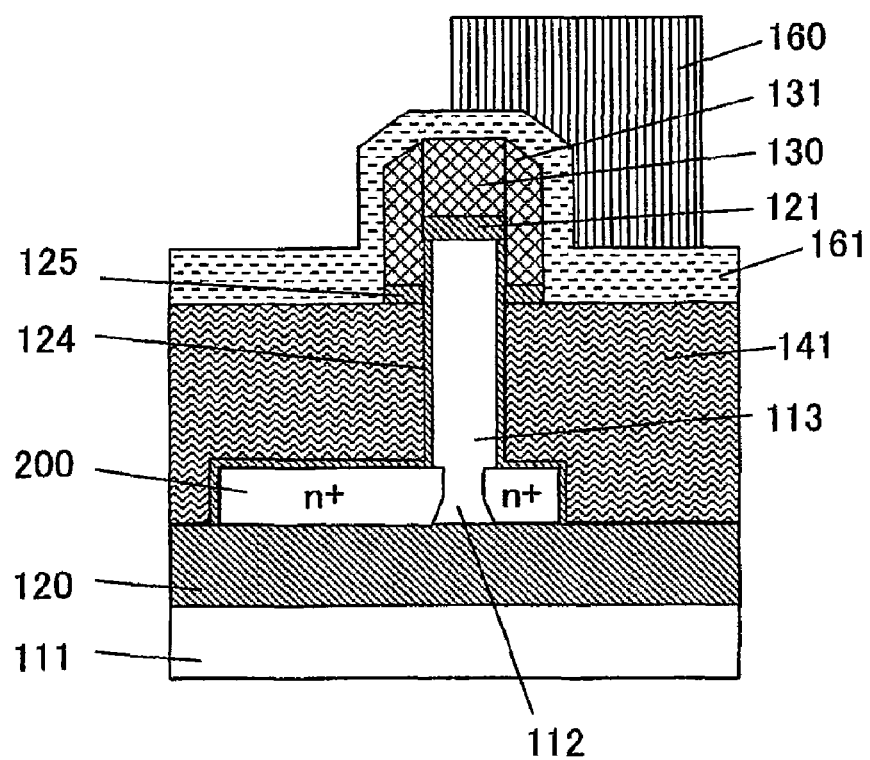
FIG. 24(b) is a sectional view showing the step of the semiconductor production method according to the embodiment, taken along the line A-A' in FIG. 24(a).

Referring to FIGS. 24(a) and 24(b), a bottom antireflective coating (BARC) layer 161 and a resist 160 are applied, and a pattern for a gate line is formed using the resist 160 by lithography. After forming the pattern, an overlay-error measurement operation, a dimension measurement operation and a verification operation may be performed (Steps 66, 67, 68, 69, 70 in FIG. 1).

Figure 25A:
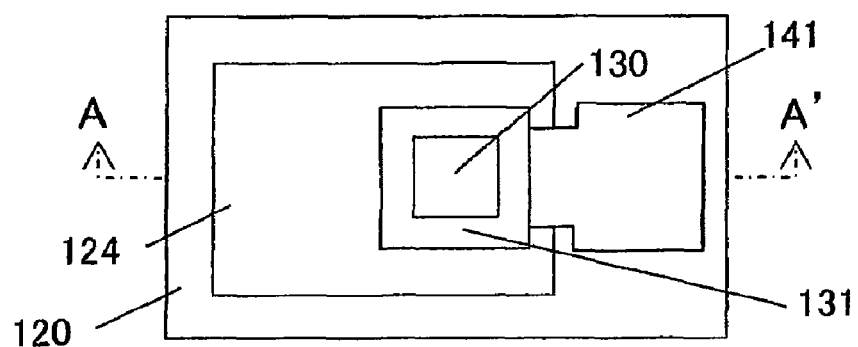
FIG. 25(a) is a top plan view showing one of the steps of the semiconductor production method according to the embodiment
Figure 25B:
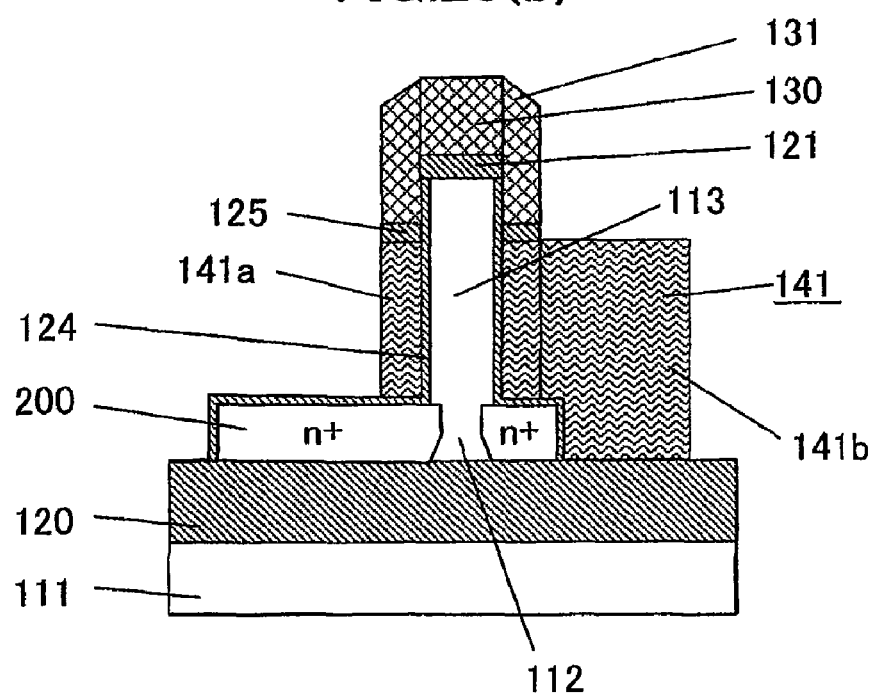
FIG. 25(b) is a sectional view showing the step of the semiconductor production method according to the embodiment, taken along the line A-A' in FIG. 25(a).

Referring to FIGS. 25(a) and 25(b), the BARC layer 161 and the amorphous silicon or polysilicon film (gate conductive film) 141 are etched using the resist 160 as a mask to form a gate electrode 141a and a gate line 141b, and then the resist and the remaining BARC layer 161 are removed. After the etching, a dimension measurement operation may be performed (Steps 71, 72, 73, 74, 75 in FIG. 1).

Figure 26A:
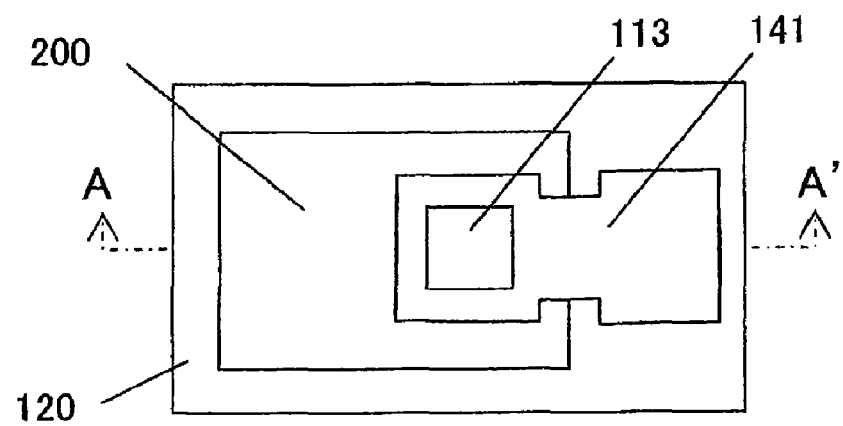
FIG. 26(a) is a top plan view showing one of the steps of the semiconductor production method according to the embodiment
Figure 26B:
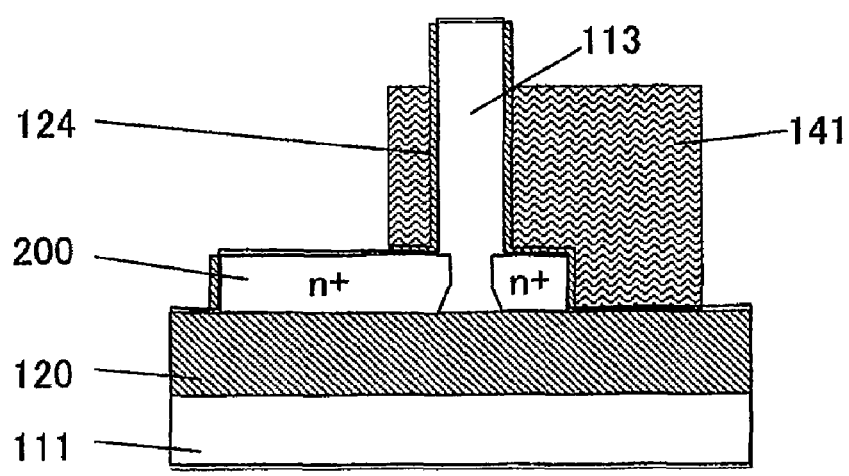
FIG. 26(b) is a sectional view showing the step of the semiconductor production method according to the embodiment, taken along the line A-A' in FIG. 26(a).

Referring to FIGS. 26(a) and 26(b), the silicon nitride film 130, the silicon nitride film-based sidewall 131 and the silicon oxide films 121, 125 on an upper portion of the pillar-shaped silicon layer 113, and a portion of the oxide film 124 on an upper surface of the planar silicon layer, are removed by dry etching or wet etching (Step 76 in FIG. 1). In this step, after removing the silicon nitride film by dry etching, the silicon oxide films may be removed by wet etching. In this case, damage of the gate dielectric film can be suppressed. In cases where the nitride film is removed by wet etching, it is desirable to perform the wet etching of the nitride film after oxidizing the gate electrode to form an oxide film on a surface of the gate electrode.

Figure 27A:
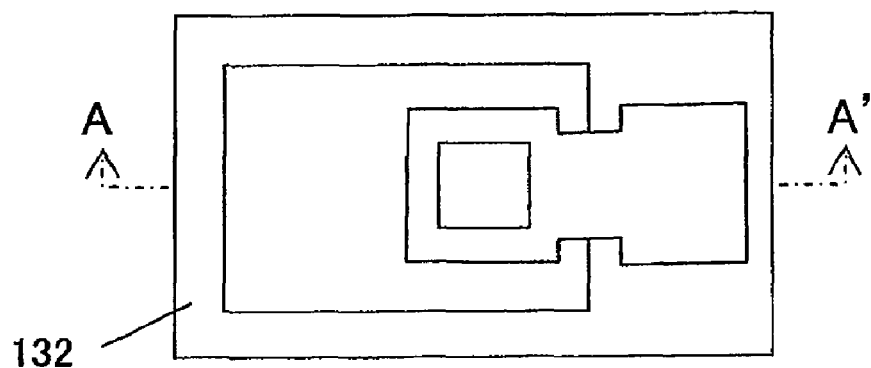
FIG. 27(a) is a top plan view showing one of the steps of the semiconductor production method according to the embodiment
Figure 27B:
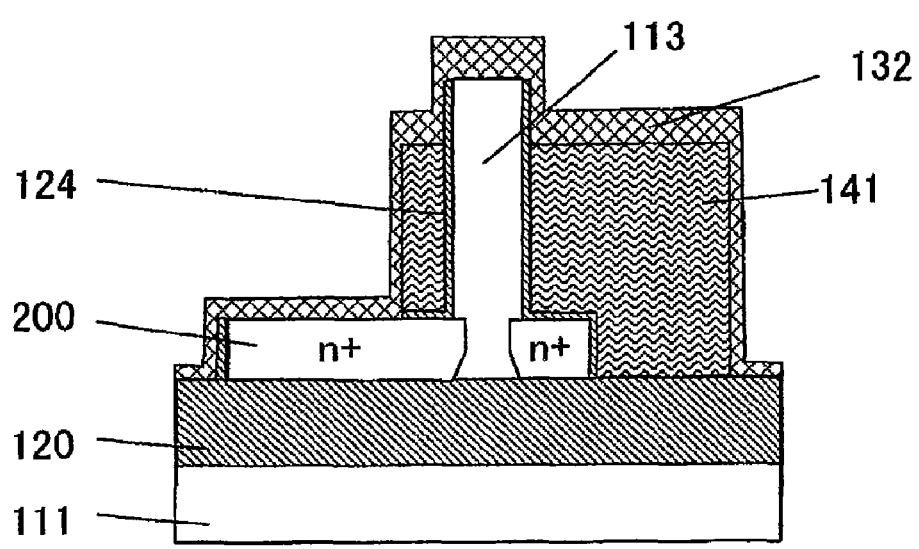
FIG. 27(b) is a sectional view showing the step of the semiconductor production method according to the embodiment, taken along the line A-A' in FIG. 27(a).

Referring to FIGS. 27(a) and 27(b), a silicon nitride film 132 is formed. Before forming the silicon nitride film, a pre-film-formation cleaning operation may be performed. Further, after the film formation, a thickness measurement operation for the silicon nitride film may be performed (Steps 77, 78, 79 in FIG. 1).

Figure 28A:
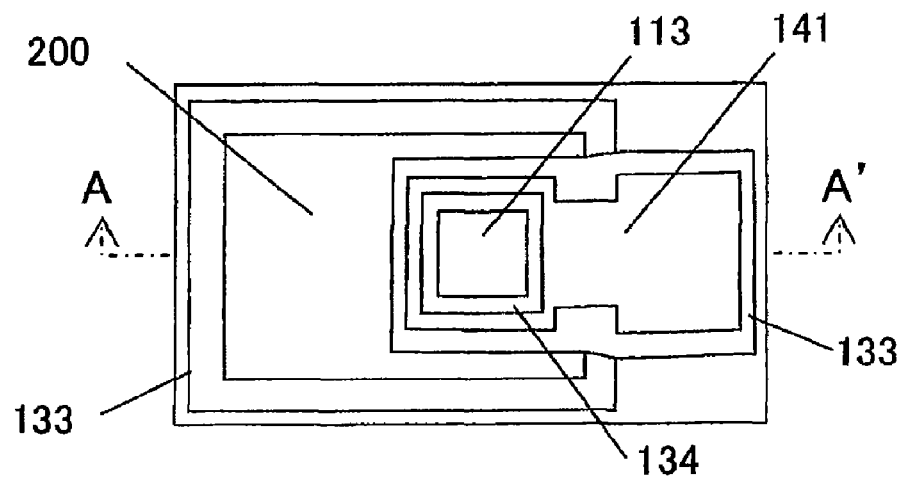
FIG. 28(a) is a top plan view showing one of the steps of the semiconductor production method according to the embodiment
Figure 28B:
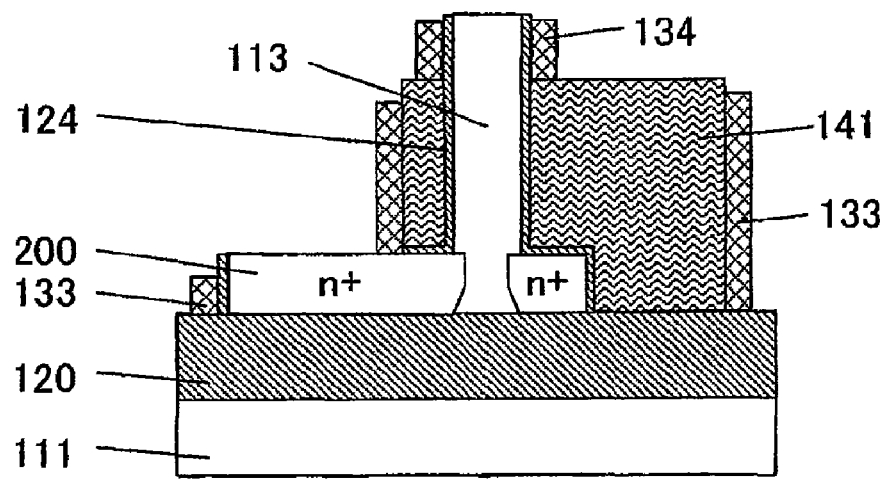
FIG. 28(b) is a sectional view showing the step of the semiconductor production method according to the embodiment, taken along the line A-A' in FIG. 28(a).

Referring to FIGS. 28(a) and 28(b), the silicon nitride film 132 is etched back to expose an upper surface of the $N^+$ source diffusion layer 200 and a top surface of the pillar-shaped silicon 113, while covering a sidewall of the gate 141 by a silicon nitride film (dielectric film-based sidewall) 133, and covering a sidewall of the pillar-shaped silicon layer 113 by a silicon nitride film (dielectric film-based sidewall) 134, and. After the etching, an organic-substance removal operation and a configuration measurement operation may be performed (Steps 80, 81, 82 in FIG. 1). The nitride films 133, 134 isolate between the gate electrode 141 and each of the source diffusion layer 200 and an $N^+$ drain diffusion layer to be subsequently formed in an upper portion of the pillar-shaped silicon layer. This makes it possible to prevent short-circuiting between the gate electrode 141 and each of the source diffusion layer 200 and the after-mentioned drain diffusion layer. Further, the nitride film 134 covering an upper region of the sidewall of the pillar-shaped silicon layer 113 makes it possible to control silicidation from the side of the sidewall of the pillar-shaped silicon layer 113.

If a silicon oxide film is used as substitute for the silicon nitride films 133, 134, it will be etched by hydrofluoric acid to be used in a cleaning/stripping operation and a pretreatment for silicidation. Thus, it is preferable to use a film insoluble in hydrofluoric acid, such as a silicon nitride film.

Figure 29A:
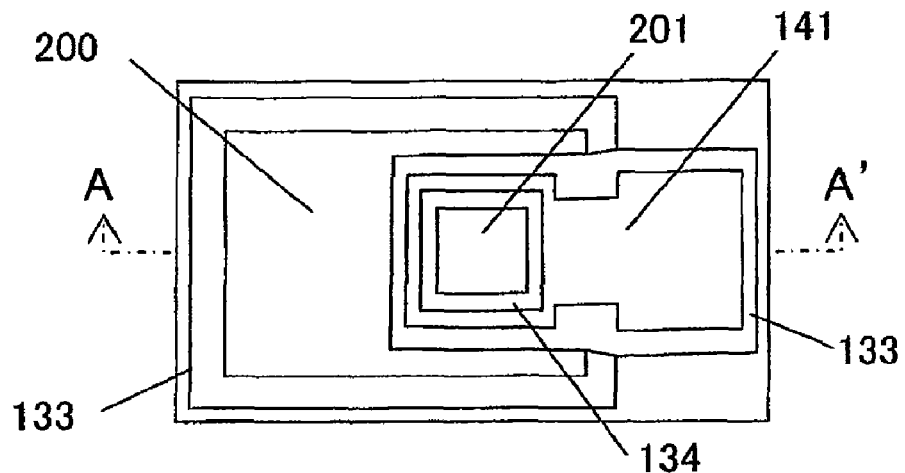
FIG. 29(a) is a top plan view showing one of the steps of the semiconductor production method according to the embodiment.
Figure 29B:
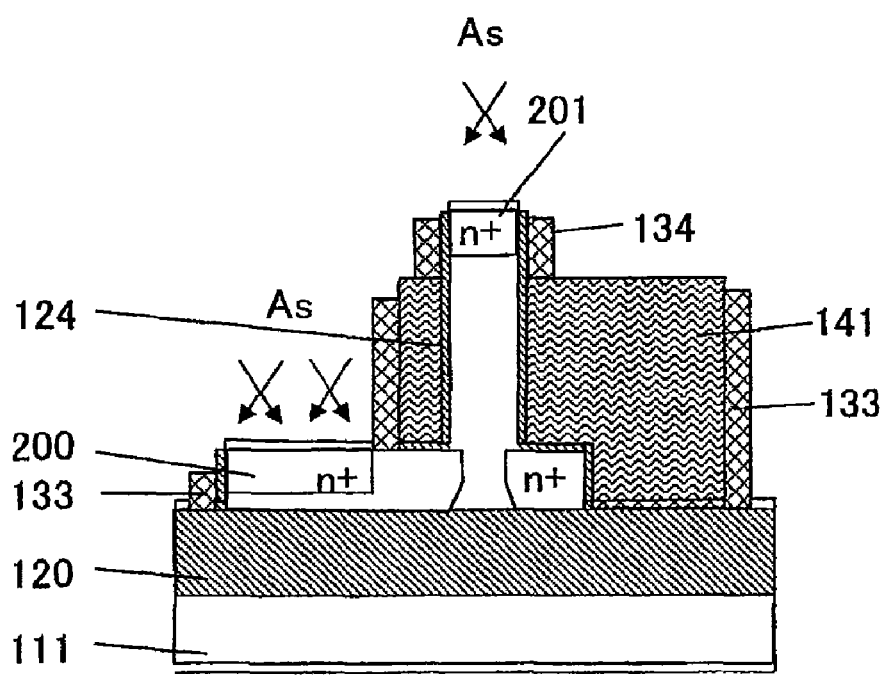
FIG. 29(b) is a sectional view showing the step of the semiconductor production method according to the embodiment, taken along the line A-A' in FIG. 29(a).

Referring to FIGS. 29(a) and 29(b), an impurity, such as P or As, is introduced into an upper portion of the pillar-shaped silicon layer 113 by impurity implantation or the like, to form an $N^+$ drain diffusion layer 201 therein (Step 83, 84 in FIG. 1).

Figure 30A:
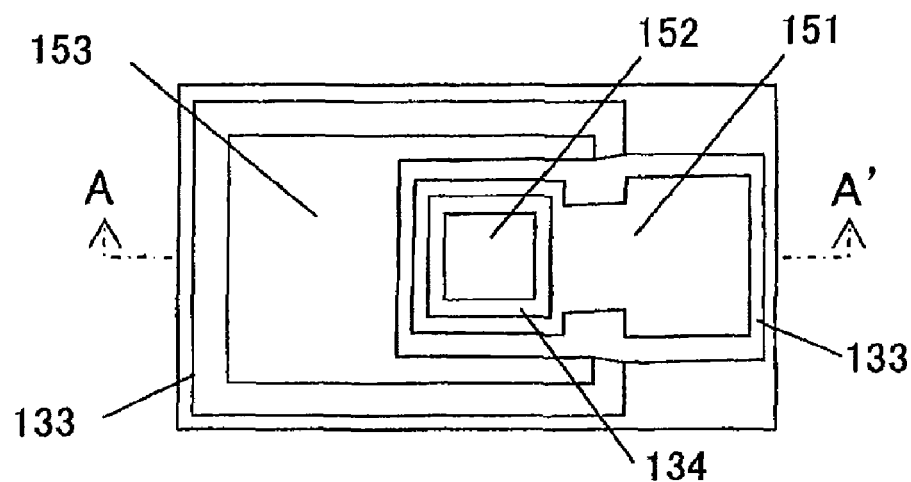
FIG. 30(a) is a top plan view showing one of the steps of the semiconductor production method according to the embodiment
Figure 30B:
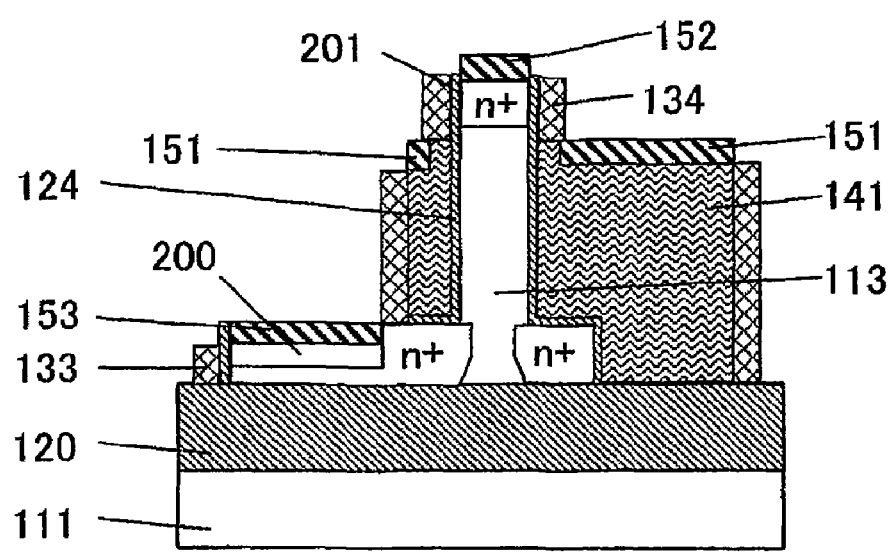
FIG. 30(b) is a sectional view showing the step of the semiconductor production method according to the embodiment, taken along the line A-A' in FIG. 30(a).

Referring to FIGS. 30(a) and 30(b), the source diffusion layer 200 and the drain diffusion layer 201 are transformed into a metal-semiconductor compound, i.e., silicided, by undergoing sputtering of a metal, such as nickel (Ni) or cobalt (Co), and a heat treatment, and then removing an unreacted metal film. In this manner, a silicide layer 152 and a silicide layer 153 are formed, the drain diffusion layer 201 and the source diffusion layer 200, respectively. Before forming the silicide layers, an oxide-film stripping operation may be performed (Steps 85, 86, 87, 88 in FIG. 1). The silicide layer 151 formed on the gate electrode 141 surrounding the pillar-shaped silicon layer makes it possible to reduce a parasitic resistance of the gate electrode 141. As a prerequisite to allowing the silicide layer 151 on the gate electrode 141, a film thickness Wg of the gate electrode 141 and a film thickness Ws of the silicon nitride film 134 may be set to satisfy the following relation: Wg>Ws, so as to allow the upper surface of the gate electrode 141 to be exposed.

Figure 31A:
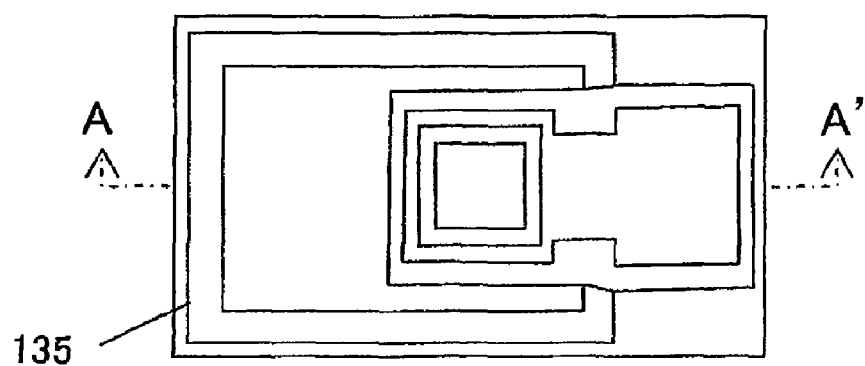
FIG. 31(a) is a top plan view showing one of the steps of the semiconductor production method according to the embodiment
Figure 31B:
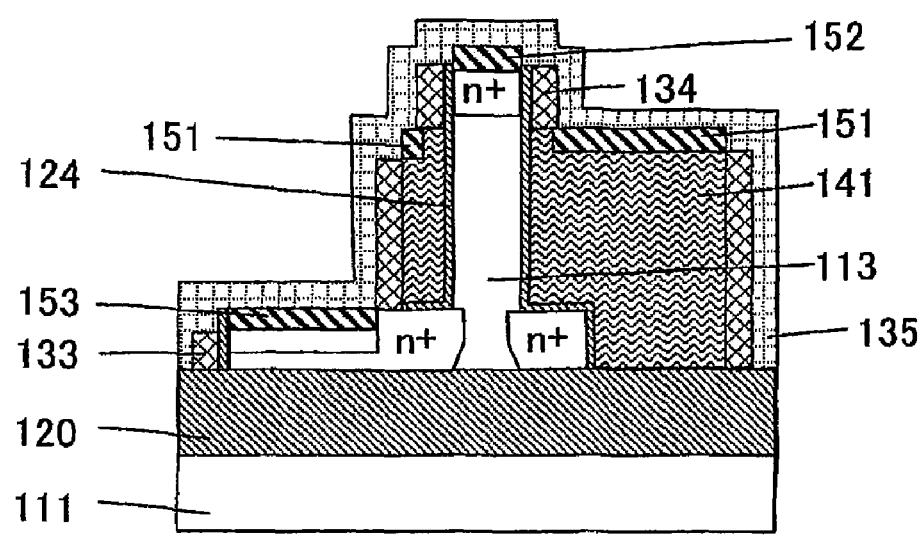
FIG. 31(b) is a sectional view showing the step of the semiconductor production method according to the embodiment, taken along the line A-A' in FIG. 31(a).

Referring to FIGS. 31(*a*) and 31(*b*), a film, such as a silicon nitride film, is formed as a contact stopper 135 (Step 89 in FIG. 1).

Figure 32A:
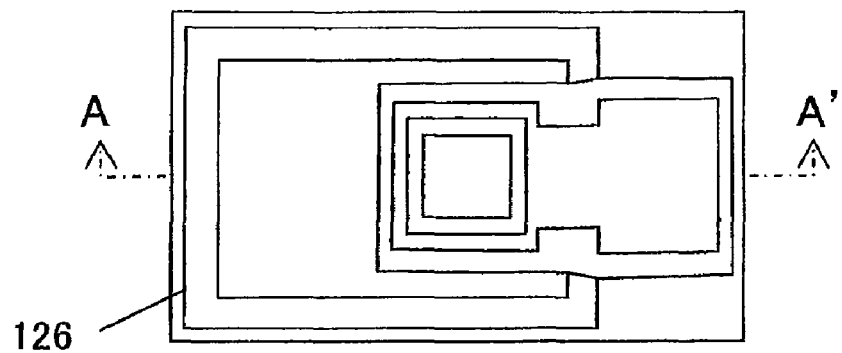
FIG. 32(a) is a top plan view showing one of the steps of the semiconductor production method according to the embodiment
Figure 32B:
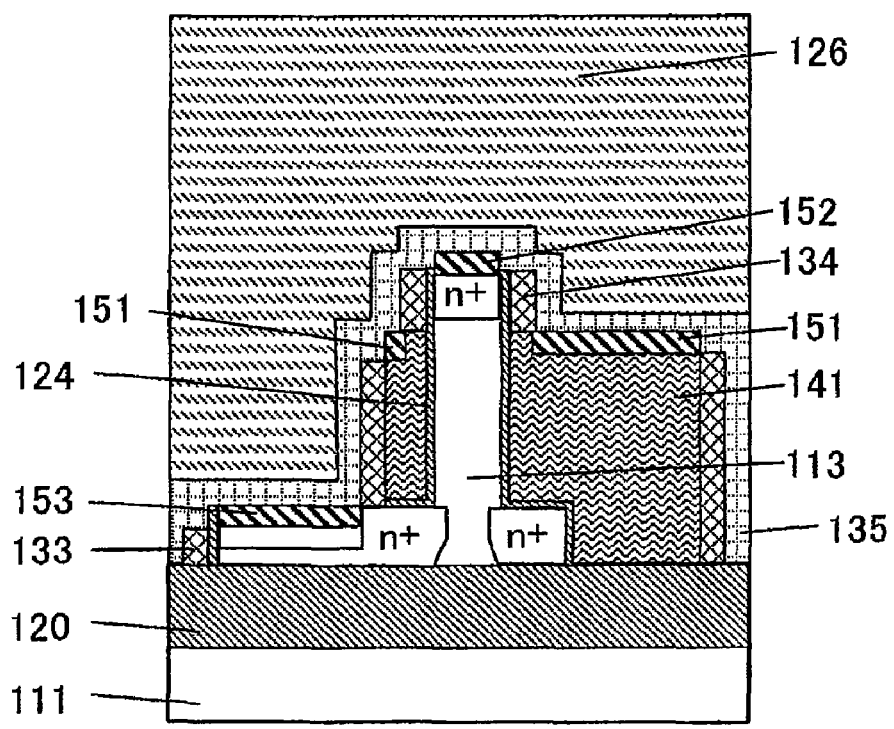
FIG. 32(b) is a sectional view showing the step of the semiconductor production method according to the embodiment, taken along the line A-A' in FIG. 32(a).

Referring to FIGS. 32(*a*) and 32(*b*), a silicon oxide film is formed as an interlayer film 126, and then flattened by CMP. After forming the silicon oxide film, a thickness measurement operation for the silicon oxide film may be performed. Further, after the CMP, a thickness measurement operation for the silicon oxide film and the silicon nitride films may be performed (Steps 90, 91, 92, 93, 94 in FIG. 1).

Figure 33A:
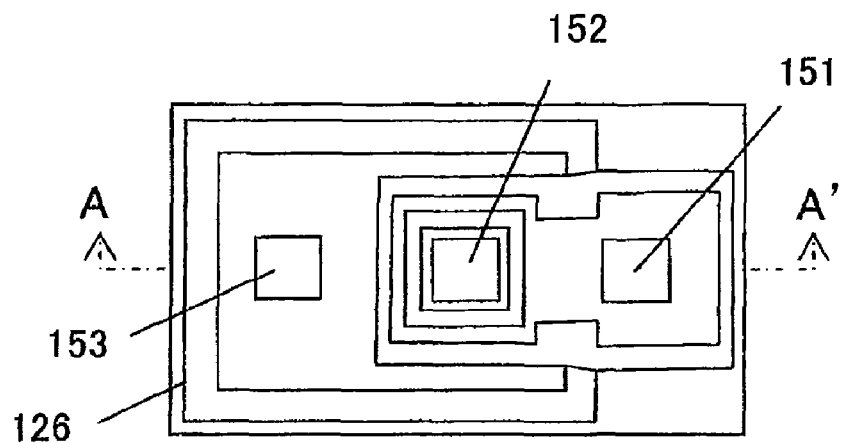
FIG. 33(a) is a top plan view showing one of the steps of the semiconductor production method according to the embodiment
Figure 33B:
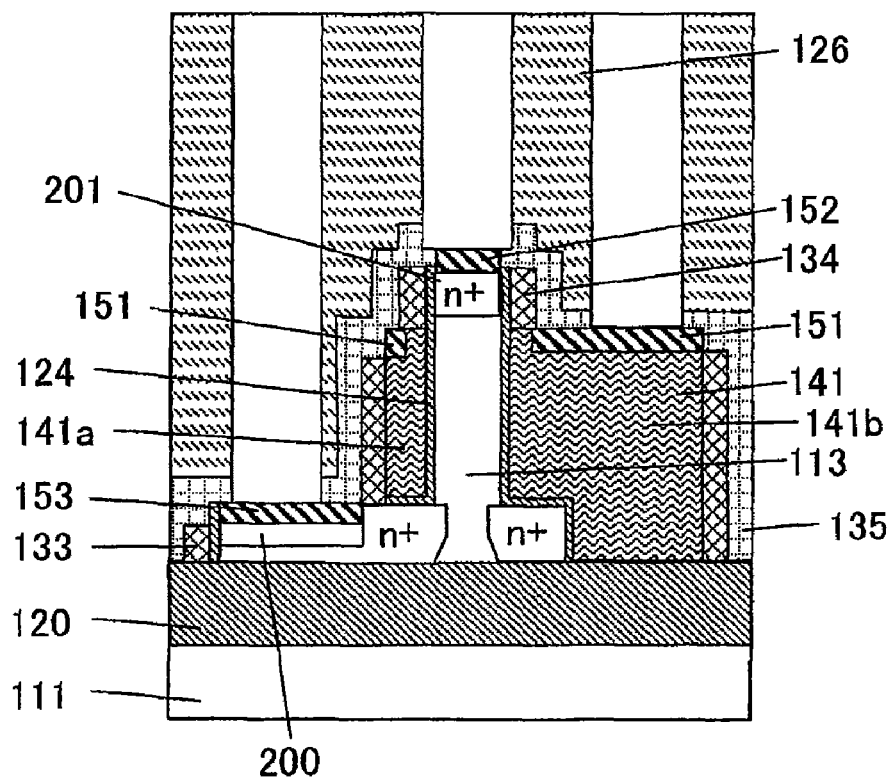
FIG. 33(b) is a sectional view showing the step of the semiconductor production method according to the embodiment, taken along the line A-A' in FIG. 33(a).

Referring to FIGS. 33(*a*) and 33(*b*), three contact holes are formed, respectively, on the drain diffusion layer 201 in the upper portion of the pillar-shaped silicon layer 113, the gate line 141*b* and the source diffusion layer 200, by etching. Before the etching for the contact holes, a lithographic exposure operation using a contact mask is performed. Then, a dimension measurement operation, an overlay-error measurement operation and a verification operation may be further performed. Further, after forming the contact holes, a plasma-based resist stripping operation is performed. After the plasma peeling, a post-contact-etching cleaning operation, a dimension measurement operation, a thickness measurement operation for the oxide film, a verification operation, and a wafer container replacement operation, may be performed (Steps 95, 96, 97, 98, 99, 100, 101, 102, 103, 104, 105, 106, 107 in FIG. 1).

Figure 40A:
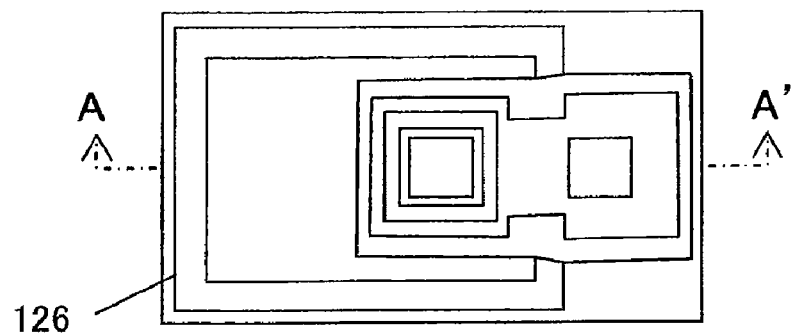
FIG. 40(a) is a top plan view showing one of the steps of the semiconductor production method according to the embodiment
Figure 40B:
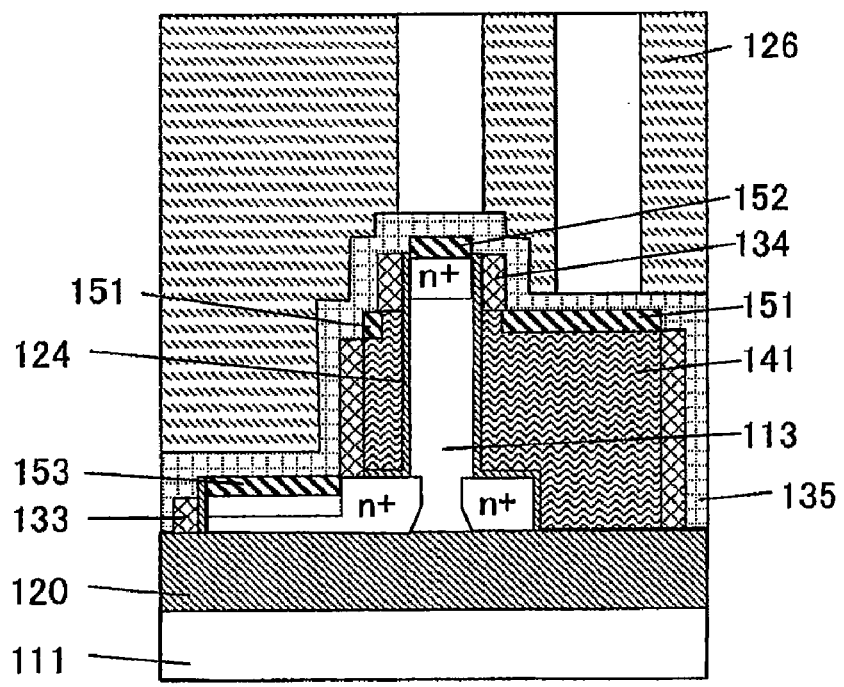
FIG. 40(b) is a sectional view showing the step of the semiconductor production method according to the embodiment, taken along the line A-A' in FIG. 40(a).
Figure 41A:
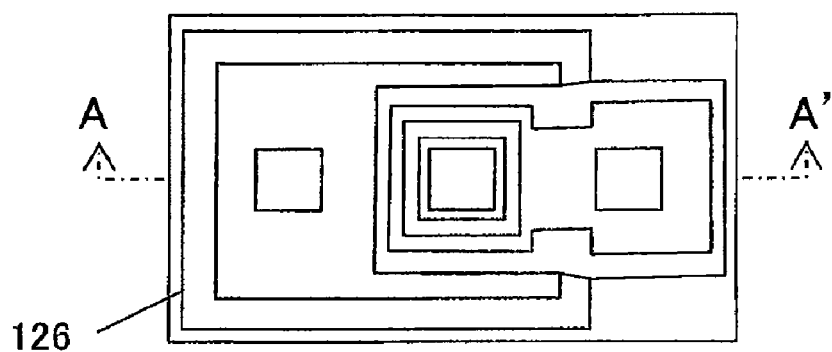
FIG. 41(a) is a top plan view showing one of the steps of the semiconductor production method according to the embodiment
Figure 41B:
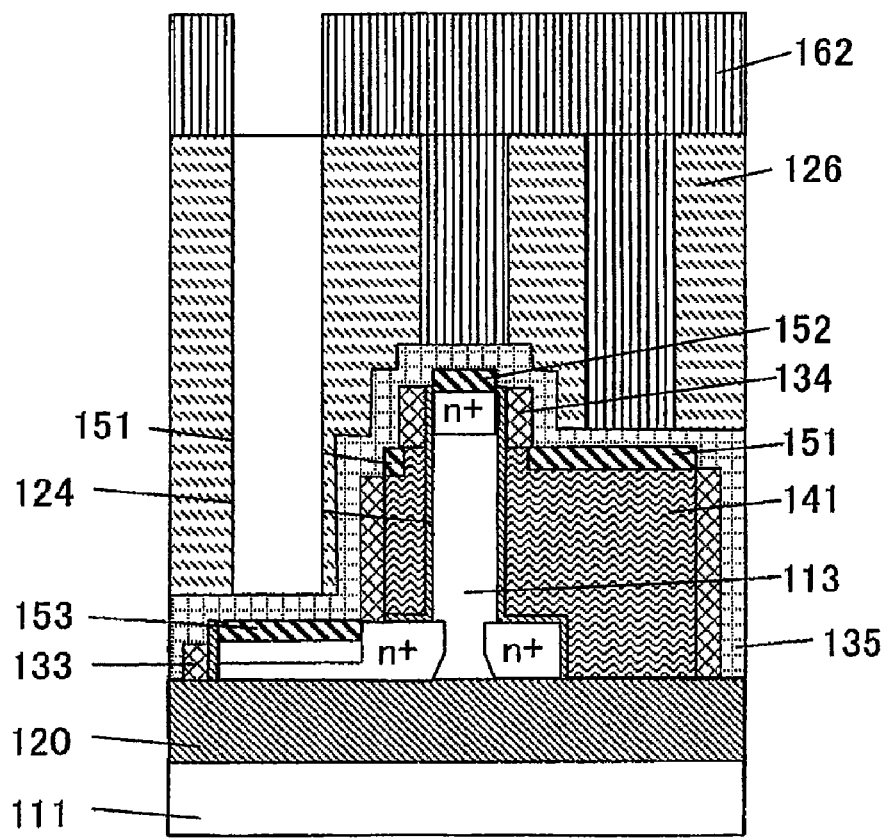
FIG. 41(b) is a sectional view showing the step of the semiconductor production method according to the embodiment, taken along the line A-A' in FIG. 41(a).
Figure 42A:
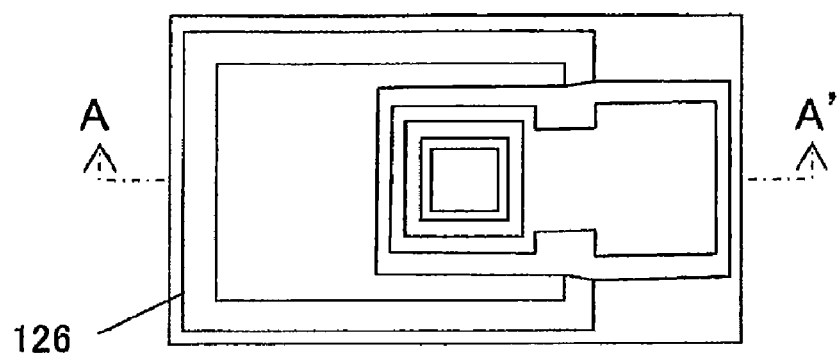
FIG. 42(a) is a top plan view showing a step of one modification of the semiconductor production method according to the embodiment
Figure 42B:
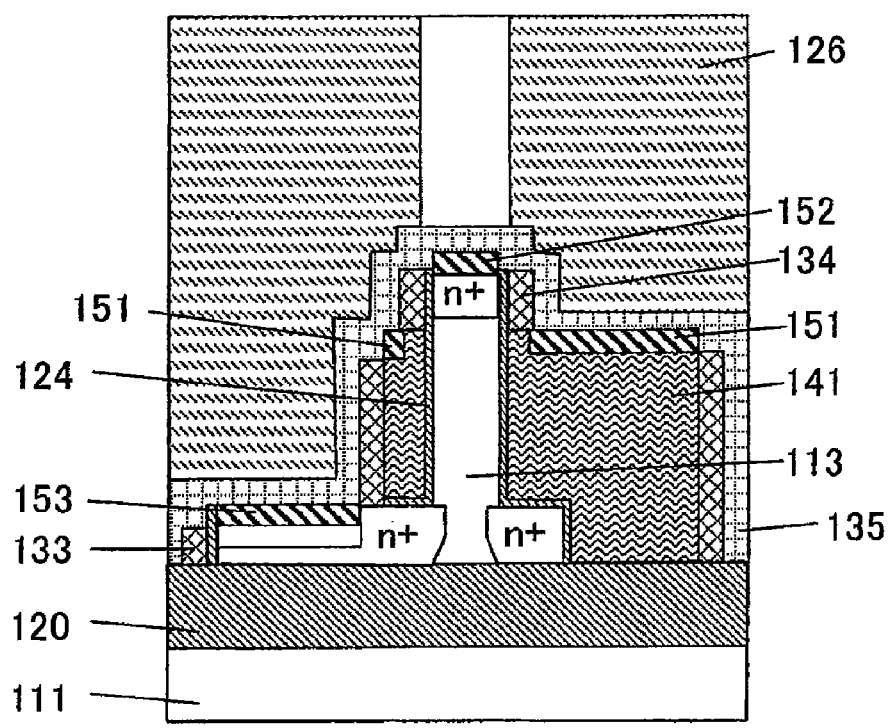
FIG. 42(b) is a sectional view showing the step of the modification of the semiconductor production method according to the embodiment, taken along the line A-A' in FIG. 42(a).
Figure 43A:
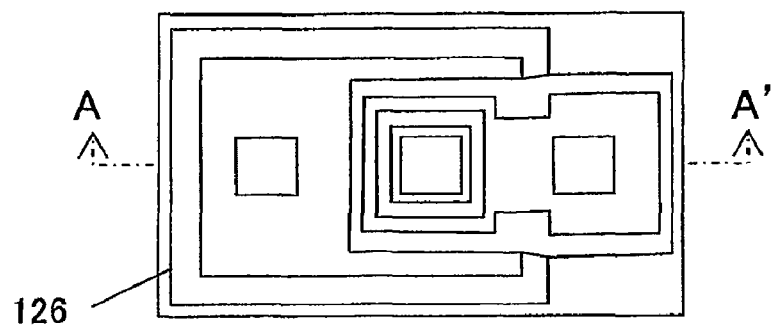
FIG. 43(a) is a top plan view showing a step of the modification of the semiconductor production method according to the embodiment
Figure 43B:
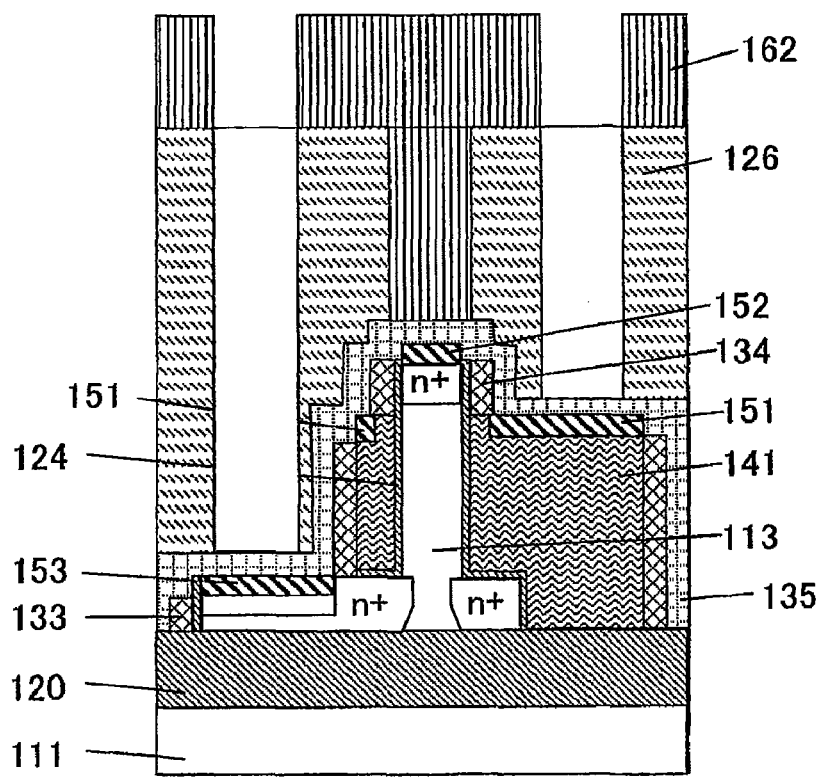
FIG. 43(b) is a sectional view showing the step of the modification of the semiconductor production method according to the embodiment, taken along the line A-A' in FIG. 43(a).

Respective etching depths of the contact hole on a top of the pillar-shaped silicon layer, the contact hole on the gate line, and the contact hole on the portion of the planar silicon layer underneath the pillar-shaped silicon layer, are different from each other. Thus, the etching for the contacts may be performed as follows. As shown in FIGS. 40(*a*) and 40(*b*), portions of the interlayer film for the contact hole on the top of the pillar-shaped silicon layer and the contact hole on the gate line are etched. Then, as shown in FIGS. 41(*a*) and 41(*b*), a portion of the interlayer film for the contact hole on the portion of the planar silicon layer underneath the pillar-shaped silicon layer is etched using a resist 163 as a mask. After the etching of the interlayer film, the contact stopper is etched. Alternatively, as shown in FIGS. 42(*a*) and 42(*b*), a portion of the interlayer film for the contact hole on the top of the pillar-shaped silicon layer is etched. Then, as shown in FIGS. 43(*a*) and 43(*b*), portions of the interlayer film for the contact hole on the gate line and the contact hole on the portion of the planar silicon layer underneath the pillar-shaped silicon layer are etched. After the etching of the interlayer film, the contact stopper is etched. In this case, the etching of the portion of the interlayer film for the contact hole on the pillar-shaped silicon layer is performed separately from the etching of the portions of the interlayer film for the contact hole on the gate line and the contact hole on the portion of the planar silicon layer underneath the pillar-shaped silicon layer. This makes it possible to optimize etching conditions for the contact hole on the pillar-shaped silicon layer, while optimizing etching conditions for the contact hole on the gate line and the contact hole on the portion of the planar silicon layer underneath the pillar-shaped silicon layer.

Figure 34A:
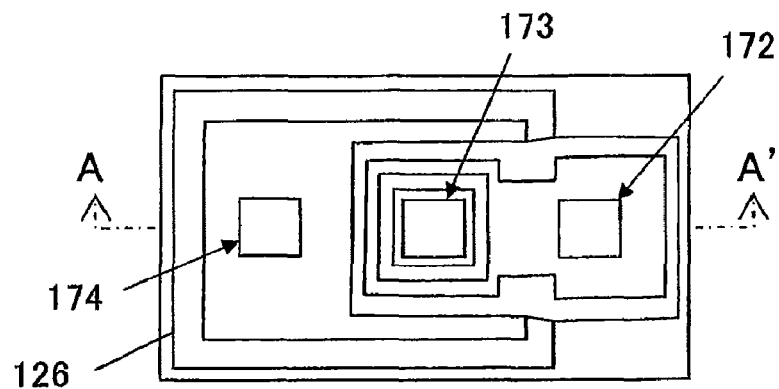
FIG. 34(a) is a top plan view showing one of the steps of the semiconductor production method according to the embodiment
Figure 34B:
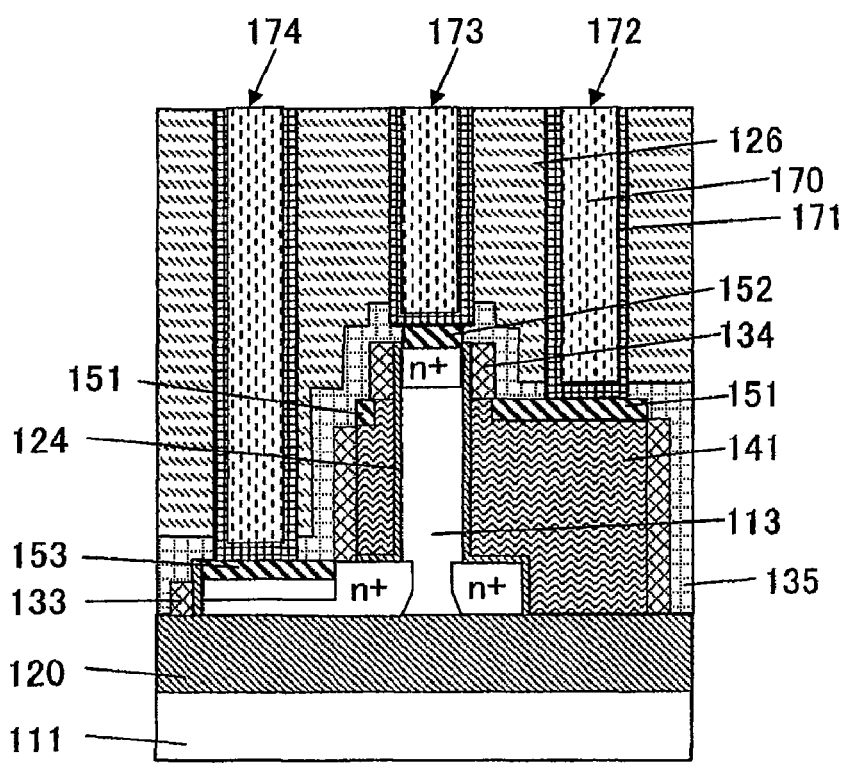
FIG. 34(b) is a sectional view showing the step of the semiconductor production method according to the embodiment, taken along the line A-A' in FIG. 34(a).

Referring to FIGS. 34(*a*) and 34(*b*), a film 171 made of a barrier metal, such as tantalum (Ta) or tantalum nitride (TaN), is formed on each of the contact holes. Then, a copper (Cu) film 170 is formed thereon by sputtering or plating, and subjected to CMP to form three contacts 172, 173, 174. As the barrier metal, titanium (Ti) or titanium nitride (TiN) may be used. Tungsten (W) may also be used. Alternatively, an alloy containing copper may be used. After the film formation, an under-surface surface treatment operation, a verification operation and a heat treatment operation may be performed. Further, after the CMP, a verification operation may be performed (Steps 108, 109, 110, 111, 112, 113, 114 in FIG. 1).

Referring to FIGS. 35(*a*) and 35(*b*), a silicon carbide (SiC) film 180 is formed as an etching stopper for first-layer interconnection lines, and then a Low-k film 190 is formed as an interlayer film of a first interconnection layer. After the film formation, a thickness measurement operation for the Low-k film and a verification operation may be performed (Steps 115, 116, 117, 118 in FIG. 1). Then, a patterning for the first-layer interconnection lines is performed, and a trench pattern is formed in the first interconnection layer. After the patterning, a dimension measurement operation, an overlay-error measurement operation and a verification operation may be performed. Further, after forming the trench pattern, a plasma-based resist stripping operation and a verification operation may be performed (Steps 119, 120, 121, 122, 123, 124, 125, 126 in FIG. 1). Subsequently, a film 175 made of a barrier metal, such as Ta or TaN, is formed on each of the trenches. Then, a Cu film 176 is formed thereon by sputtering or plating, and subjected to CMP to form the first-layer interconnection lines 177, 178, 179. As the barrier metal, titanium (Ti) or titanium nitride (TiN) may be used. Tungsten (W) may also be used. After the film formation, an under-surface surface treatment operation, a verification operation and a heat treatment operation may be performed. Further, after the CMP, a verification operation may be performed (Steps 127, 128, 129, 130, 131, 132, 133 in FIG. 1).

Then, a nitride-film deposition operation, and an interlayer-dielectric-film deposition operation and a thickness measurement operation for the interlayer dielectric film may be performed (Steps 134, 135, 136 in FIG. 1).

Further, a lithographic exposure operation using a pad-via mask, a dimension measurement operation, an overlay-error measurement operation, a verification operation, a pad-via etching operation, a plasma-based resist stripping operation, a post-etching cleaning operation, a dimension measurement operation, a thickness measurement operation for an oxide film, a verification operation, a pre-metalization cleaning operation, a wafer-container replacement operation, an aluminum deposition operation, an under-surface treatment operation, a lithographic exposure operation for pad aluminum, an overlay-error measurement operation, a dimension measurement operation, a verification operation, a pad-aluminum etching operation, a plasma-based resist stripping operation, a post-metal-etching cleaning operation, an optical inspection operation, an SEM inspection operation, a thickness measurement operation for the oxide film, an operation of depositing a dielectric film, a thickness measurement operation for the dielectric film, a lithographical exposure operation for the dielectric film, an optical inspection operation, an operation of etching the dielectric film, a plasma-based resist stripping operation, an operation of cleaning the dielectric film, a verification operation, and a heat treatment operation (Steps 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176 in FIG. 1).

Before the operation for the pad-via, multilayer interconnection may be performed.

As described above, the present invention provides a semiconductor device production method which comprises the steps of: forming a planar semiconductor layer on a substrate and then forming a pillar-shaped first-conductive-type semiconductor layer on the planar semiconductor layer; forming a second-conductive-type semiconductor layer in a portion of the planar semiconductor layer underneath the pillar-shaped first-conductive-type semiconductor layer; forming a gate dielectric film and a gate electrode around the pillar-shaped first-conductive-type semiconductor layer; forming a sidewall-shaped dielectric film on an upper region of a sidewall of the pillar-shaped first-conductive-type semiconductor layer and in contact with a top of the gate electrode; forming a sidewall-shaped dielectric film on a sidewall of the gate electrode; forming a second-conductive-type semiconductor layer in an upper portion of the pillar-shaped first-conductive-type semiconductor layer; forming a metal-semiconductor compound on the second-conductive-type semiconductor layer formed in the portion of the planar semiconductor layer underneath the pillar-shaped first-conductive-type semiconductor layer; forming a metal-semiconductor compound on the second-conductive-type semiconductor layer formed in the upper portion of the pillar-shaped first-conductive-type semiconductor layer; forming a metal-semiconductor compound on the gate electrode; forming a contact on the second-conductive-type semiconductor layer formed in the portion of the planar semiconductor layer underneath the pillar-shaped first-conductive-type semiconductor layer; and forming a contact on the second-conductive-type semiconductor layer formed in the upper portion of the pillar-shaped first-conductive-type semiconductor layer. This makes it possible to provide an SGT production method capable of obtaining a structure for reducing a resistance of a gate electrode, a desired gate length, desired source and drain configurations and a desired diameter of a pillar-shaped semiconductor.

In a preferred embodiment of the present invention, a distance between a central axis of the pillar-shaped first-conductive-type semiconductor layer and a lateral end of the planar semiconductor layer is greater than a sum of: a distance between the central axis and the sidewall of the pillar-shaped first-conductive-type semiconductor layer; a thickness of the gate dielectric film; a thickness of the gate electrode; and a thickness of the sidewall-shaped dielectric film formed on the sidewall of the gate electrode. This makes it possible to form a metal-semiconductor compound on the second-conductive-type semiconductor layer formed in the portion of the planar semiconductor layer underneath the pillar-shaped first-conductive-type semiconductor layer, so that a resistance of the second-conductive-type semiconductor layer formed in the portion of the planar semiconductor layer underneath the pillar-shaped first-conductive-type semiconductor layer can be reduced.

In a preferred embodiment of the present invention, a thickness of the gate electrode is greater than that of the sidewall-shaped dielectric film formed on the upper region of the sidewall of the pillar-shaped first-conductive-type semiconductor layer and in contact with the top of the gate electrode. This makes it possible to form a metal-semiconductor compound on the gate electrode, so that a resistance of the gate electrode can be reduced.

A preferred embodiment of the present invention may include: forming, on the substrate, an initial silicon layer for forming therefrom the pillar-shaped first-conductive-type silicon layer and the planar silicon layer, and then forming a pad oxide film on the initial silicon layer; implanting an impurity into the initial silicon layer through the pad oxide film to adjust a threshold, and then subjecting the initial silicon layer to annealing to activate and diffuse the impurity so as to promote uniform distribution of the impurity in the initial silicon layer; and forming a silicon nitride film for use as a mask during formation of the pillar-shaped first-conductive-type silicon layer. In this case, the pad oxide film for reducing a stress between a silicon layer and a silicon nitride film to be formed in the next step can be used as a screen oxide film during impurity injection. This makes it possible to reduce the number of production steps so as to reduce a production cost.

A preferred embodiment of the present invention may include: forming, on the substrate, an initial silicon layer for forming therefrom the pillar-shaped first-conductive-type silicon layer and the planar silicon layer, and then forming a pad oxide film on the initial silicon layer; forming a silicon nitride film for use as a first hard mask during formation of the pillar-shaped first-conductive-type silicon layer; forming a silicon oxide film on the silicon nitride film; applying a resist onto the silicon oxide film, forming a pattern having an inverted shape of a top view of the pillar-shaped first-conductive-type silicon layer, using the resist by lithography, and forming a hole in the silicon oxide film to penetrate through the silicon oxide film at a position for forming the pillar-shaped first-conductive-type silicon layer; forming an amorphous silicon or polysilicon film to fill the hole formed in the silicon oxide film; polishing and removing a portion of the amorphous silicon or polysilicon film on the silicon oxide film by chemical mechanical polishing; removing the silicon oxide film by etching, to form an amorphous silicon or polysilicon film-based mask serving as a second hard mask; sacrificially oxidizing the amorphous silicon or polysilicon film-based mask to reduce a size of the amorphous silicon or polysilicon film-based mask; and etching the amorphous silicon or polysilicon film-based mask to remove the sacrificial silicon oxide film on a surface thereof. This makes it possible to reduce a width of the pillar-shaped first-conductive-type silicon layer to be subsequently formed, to suppress short-channel effects in a transistor so as to reduce a leak current.

Alternatively, A preferred embodiment of the present invention may include: forming, on the substrate, an initial silicon layer for forming therefrom the pillar-shaped first-conductive-type silicon layer and the planar silicon layer, and then forming a pad oxide film on the initial silicon layer; forming a silicon nitride film for use as a first hard mask during formation of the pillar-shaped first-conductive-type silicon layer; forming a silicon oxide film on the silicon nitride film; applying a resist onto the silicon oxide film, forming a pattern having an inverted shape of a top view of the pillar-shaped first-conductive-type silicon layer, using the resist by lithography, and forming a hole in the silicon oxide film to penetrate through the silicon oxide film at a position for forming the pillar-shaped first-conductive-type silicon layer; depositing an oxide film and etching back the oxide film to reduce a diameter of the hole penetrating through the silicon oxide film; forming an amorphous silicon or polysilicon film to fill the hole formed in the silicon oxide film; polishing and removing a portion of the amorphous silicon or polysilicon film on the silicon oxide film by chemical mechanical polishing; and removing the silicon oxide film by etching, to form an amorphous silicon or polysilicon film-based mask serving as a second hard mask This also makes it possible to reduce a width of the pillar-shaped first-conductive-type silicon layer to be subsequently formed, to suppress short-channel effects in a transistor so as to reduce a leak current.

A preferred embodiment of the present invention may include: dry-etching a silicon nitride film and a pad oxide film deposited on an initial silicon layer, using a amorphous silicon or polysilicon film-based mask serving as the second hard mask, to form a silicon nitride film-based mask serving as the first hard mask; and forming the pillar-shaped first-conductive-type silicon layer by dry etching using the first hard mask and the second hard mask. In this case, when the amorphous silicon or polysilicon film-based mask serving as the second hard mask is fully etched away to cause a change in plasma emission intensity detectable by a dry etching apparatus, a dry-etching end-point detection process can be performed by detecting the change in the plasma emission intensity, to control a height dimension of the pillar-shaped first-conductive-type silicon layer.

In a preferred embodiment of the present invention, a thickness of the amorphous silicon or polysilicon film-based mask is less than a height dimension of the pillar-shaped first-conductive-type silicon layer. This makes it possible to effectively perform the dry-etching end-point detection process.

A preferred embodiment of the present invention may include: sacrificially oxidizing the pillar-shaped first-conductive-type silicon layer fabricated on the planar silicon layer to form a sacrificial oxide film as a means for reducing irregularities in a region of the sidewall of the pillar-shaped first-conductive-type silicon layer serving as a channel region, removing a silicon surface implanted with a foreign substance comprising carbon during the dry etching, and protecting the pillar-shaped first-conductive-type silicon layer from contaminations comprising by-products to be produced during dry etching in a subsequent step; applying a resist onto the planar silicon layer, and forming a pattern for the second-conductive-type silicon layer to be formed in the portion of the planar silicon layer underneath the pillar-shaped first-conductive-type silicon layer, using the resist by lithography; and dry-etching the planar silicon layer to form the portion of the planar silicon layer underneath the pillar-shaped first-conductive-type silicon layer, and then removing the resist. In this case, the oxide film formed by the sacrificial oxidation is used as a protective film for the pillar-shaped first-conductive-type silicon layer. This makes it possible to reduce the number of production steps so as to reduce a production cost.

A preferred embodiment of the present invention may include: introducing a second-conductive-type impurity into a surface of the portion of the planar silicon layer underneath the pillar-shaped first-conductive-type silicon layer on which there is a silicon nitride film-based mask by an impurity doping process comprising impurity implantation, using the sacrificial oxide film formed during the sacrificial oxidation of the pillar-shaped first-conductive-type silicon layer, as a screen oxide film. In this case, the oxide film formed by the sacrificial oxidation is used as not only a protective film for the pillar-shaped first-conductive-type silicon layer but also a screen oxide film during impurity implantation. This makes it possible to reduce the number of production steps so as to reduce a production cost.

In a preferred embodiment of the present invention, a diameter of the pillar-shaped first-conductive-type silicon layer is less than that of the silicon nitride film-based mask serving as the first hard mask. This makes it possible to prevent implantation of an imparity from the side of the sidewall of the pillar-shaped first-conductive-type silicon layer during the impurity implantation.

In a preferred embodiment of the present invention, an implantation angle during the impurity implantation for use in forming the second-conductive-type silicon layer in the portion of the planar silicon layer underneath the pillar-shaped first-conductive-type silicon layer is in the range of 0 to 6 degrees. This makes it possible to prevent implantation of an imparity from the side of the sidewall of the pillar-shaped first-conductive-type silicon layer during the impurity implantation.

In a preferred embodiment of the present invention, the second-conductive-type silicon layer is formed in the portion of the planar silicon layer underneath the pillar-shaped first-conductive-type silicon layer, without implanting the impurity into the upper portion of the pillar-shaped first-conductive-type semiconductor layer. This makes it possible to impurity implantation conditions for the upper portion of the pillar-shaped first-conductive-type silicon layer and the portion of the planar silicon layer underneath the pillar-shaped first-conductive-type silicon layer, to suppress short-channel effects in a transistor so as to reduce a leak current.

A preferred embodiment of the present invention may include: removing a sacrificial oxide film by etching from a pillar-shaped first-conductive-type semiconductor layer with a silicon nitride film-based mask and a sacrificial oxide film formed on the planar semiconductor layer and a planar semiconductor layer having a second-conductive-type semiconductor layer formed therein, forming a gate dielectric film such as a silicon oxide film or a silicon nitride film, and forming an amorphous silicon or polysilicon film as a material of the gate electrode to allow the pillar-shaped first-conductive-type silicon layer to be buried therein; and polishing the amorphous silicon or polysilicon film by chemical mechanical polishing to flatten an upper surface of the gate electrode material. In this case, the silicon nitride film-based mask serving as the first hard mask can be used as a stopper for the chemical mechanical polishing to control an amount of chemical mechanical polishing with high repeatability.

A preferred embodiment of the present invention may include: etching back the flattened gate electrode material of the amorphous silicon or polysilicon film to allow the resulting gate electrode material of the amorphous silicon or polysilicon film to have a desired gate length of the gate electrode; and oxidizing an upper surface of the etched-back amorphous silicon or polysilicon film to form a silicon oxide film thereon. In this case, the silicon oxide film can serve as a means to protect the upper surface of the amorphous silicon or polysilicon film from a wet or dry treatment to be performed in a subsequent step, so as to suppress a change in the gate length, or a variation in the gate length and damage of the gate dielectric film from the side of the upper surface thereof.

A preferred embodiment of the present invention may include: forming a silicon nitride film to have a film thickness greater than a desired film thickness of the gate electrode: etching back the silicon nitride film to form a silicon nitride film-based sidewall, wherein a film thickness of the silicon nitride film-based sidewall which determines a film thickness of the gate electrode to be formed is controlled by adjusting a film thickness of the silicon nitride film to be formed in the sub-step of forming a silicon nitride film, and conditions for the etching-back in the sub-step of etching back the silicon nitride film, so as to allow the gate electrode to have the desired film thickness; applying a bottom antireflective coating (BARC) layer and a resist, and forming a pattern for a gate line, using the resist by lithography; and etching the BARC layer and the amorphous silicon or polysilicon film, using the resist as a mask to form the gate electrode and the gate line; removing the silicon nitride film-based mask and the silicon nitride film-based sidewall on an upper portion of the pillar-shaped first-conductive-type silicon layer by dry etching or wet etching; and forming a silicon nitride film and etching back the silicon nitride film to expose an upper surface of the second-conductive-type silicon layer formed in the portion of the planar silicon layer underneath the pillar-shaped first-conductive-type silicon layer, and a top surface of the pillar-shaped first-conductive-type silicon layer, while forming a silicon nitride film-based sidewall serving as the sidewall-shaped dielectric film, on the upper region of the sidewall of the pillar-shaped first-conductive-type silicon layer and in contact with the top of the gate electrode, through the gate dielectric film, and forming a silicon nitride film-based sidewall serving as the sidewall-shaped dielectric film on the sidewall of the gate electrode; introducing a second-conductive-type impurity into an upper portion of the pillar-shaped first-conductive-type silicon layer through an impurity doping process comprising impurity implantation, to form the second-conductive-type silicon layer in the upper portion of the pillar-shaped first-conductive-type silicon layer; and subjecting each of the upper surface of the second-conductive-type silicon layer formed in the portion of the planar silicon layer underneath the pillar-shaped first-conductive-type silicon layer, and an upper surface of the second-conductive-type silicon layer formed in the upper portion of the pillar-shaped first-conductive-type silicon layer, to sputtering of a metal such as nickel (Ni) or cobalt (Co), and a heat treatment, and removing an unreacted metal film, to form the metal-semiconductor compound on each of the second-conductive-type silicon layer formed in the portion of the planar silicon layer underneath the pillar-shaped first-conductive-type silicon layer and the second-conductive-type silicon layer formed in the upper portion of the pillar-shaped first-conductive-type silicon layer. In this case, the silicon nitride film-based sidewalls can serve as means to isolate the gate electrode from each of the second-conductive-type silicon layer formed in the portion of the planar silicon layer underneath the pillar-shaped first-conductive-type silicon layer and the second-conductive-type silicon layer formed in the upper portion of the pillar-shaped first-conductive-type silicon layer, so as to prevent short-circuiting between the gate electrode and each of the second-conductive-type silicon layer formed in the portion of the planar silicon layer underneath the pillar-shaped first-conductive-type silicon layer and the second-conductive-type silicon layer formed in the upper portion of the pillar-shaped first-conductive-type silicon layer, due to the metal-semiconductor compounds, and the silicon nitride film-based sidewall covering the upper region of the sidewall of the pillar-shaped first-conductive-type silicon layer can serve as a means to control formation of a metal-semiconductor compound from the side of the sidewall of the pillar-shaped first-conductive-type silicon layer.

A preferred embodiment of the present invention may include: forming a film comprising a silicon nitride film to serve as a contact stopper; forming a silicon oxide film to serve as an interlayer film and then flattening the silicon oxide film by chemical mechanical polishing; forming contact holes on respective ones of the second-conductive-type silicon layer formed in the portion of the planar silicon layer underneath the pillar-shaped first-conductive-type silicon layer, a gate line extending from the gate electrode, and the second-conductive-type silicon layer formed in the upper portion of the pillar-shaped first-conductive-type silicon layer, by etching. This makes it possible to reduce a resistance of each of the contacts.

A preferred embodiment of the present invention may include: etching respective portions of the interlayer film for the contact hole on a top of the second-conductive-type silicon layer formed in the upper portion of the pillar-shaped first-conductive-type silicon layer and the contact hole on the gate line, and then etching a portion of the interlayer film for the contact hole on the portion of the second-conductive-type silicon layer formed in the portion of the planar silicon layer underneath the pillar-shaped first-conductive-type silicon layer, whereafter respective portions of the contact stopper corresponding to the contact hole on the top of the second-conductive-type silicon layer formed in the upper portion of the pillar-shaped first-conductive-type silicon layer, the contact hole on the gate line, and the contact hole on the portion of the second-conductive-type silicon layer formed in the portion of the planar silicon layer underneath the pillar-shaped first-conductive-type silicon layer, are etched away. This makes it possible to optimize etching conditions for the contact hole on the contact hole on the top of the second-conductive-type silicon layer formed in the upper portion of the pillar-shaped first-conductive-type silicon layer and the contact hole on the gate line, while optimizing etching conditions for the contact hole on the portion of the second-conductive-type silicon layer formed in the portion of the planar silicon layer underneath the pillar-shaped first-conductive-type silicon layer.

Alternatively, A preferred embodiment of the present invention may include: etching a portion of the interlayer film for the contact hole on the portion of the second-conductive-type silicon layer formed in the portion of the planar silicon layer underneath the pillar-shaped first-conductive-type silicon layer, and then etching respective portions of the interlayer film for the contact hole on a top of the second-conductive-type silicon layer formed in the upper portion of the pillar-shaped first-conductive-type silicon layer and the contact hole on the gate line, whereafter respective portions of the contact stopper corresponding to the contact hole on the top of the second-conductive-type silicon layer formed in the upper portion of the pillar-shaped first-conductive-type silicon layer, the contact hole on the gate line, and the contact hole on the portion of the second-conductive-type silicon layer formed in the portion of the planar silicon layer underneath the pillar-shaped first-conductive-type silicon layer, are etched away. This makes it possible to optimize etching conditions for the contact hole on the contact hole on the top of the second-conductive-type silicon layer formed in the upper portion of the pillar-shaped first-conductive-type silicon layer and the contact hole on the gate line, while optimizing etching conditions for the contact hole on the portion of the second-conductive-type silicon layer formed in the portion of the planar silicon layer underneath the pillar-shaped first-conductive-type silicon layer.

Alternatively, a preferred embodiment of the present invention may include: etching a portion of the interlayer film for the contact hole on a top of the second-conductive-type silicon layer formed in the upper portion of the pillar-shaped first-conductive-type silicon layer, and then etching respective portions of the interlayer film for the contact hole on the gate line and the contact hole on the portion of the second-conductive-type silicon layer formed in the portion of the planar silicon layer underneath the pillar-shaped first-conductive-type silicon layer, whereafter respective portions of the contact stopper corresponding to the contact hole on the top of the second-conductive-type silicon layer formed in the upper portion of the pillar-shaped first-conductive-type silicon layer, the contact hole on the gate line, and the contact hole on the portion of the second-conductive-type silicon layer formed in the portion of the planar silicon layer underneath the pillar-shaped first-conductive-type silicon layer, are etched away. This makes it possible to optimize etching conditions for the contact hole on the contact hole on the top of the second-conductive-type silicon layer formed in the upper portion of the pillar-shaped first-conductive-type silicon layer, while optimizing etching conditions for and the contact hole on the gate line and the contact hole on the portion of the second-conductive-type silicon layer formed in the portion of the planar silicon layer underneath the pillar-shaped first-conductive-type silicon layer.

Alternatively, A preferred embodiment of the present invention may include: etching respective portions of the interlayer film for the contact hole on the gate line and the contact hole on the portion of the second-conductive-type silicon layer formed in the portion of the planar silicon layer underneath the pillar-shaped first-conductive-type silicon layer, and then etching a portion of the interlayer film for the contact hole on a top of the second-conductive-type silicon layer formed in the upper portion of the pillar-shaped first-conductive-type silicon layer, whereafter respective portions of the contact stopper corresponding to the contact hole on the top of the second-conductive-type silicon layer formed in the upper portion of the pillar-shaped first-conductive-type silicon layer, the contact hole on the gate line, and the contact hole on the portion of the second-conductive-type silicon layer formed in the portion of the planar silicon layer underneath the pillar-shaped first-conductive-type silicon layer, are etched away. This makes it possible to optimize etching conditions for the contact hole on the contact hole on the top of the second-conductive-type silicon layer formed in the upper portion of the pillar-shaped first-conductive-type silicon layer, while optimizing etching conditions for and the contact hole on the gate line and the contact hole on the portion of the second-conductive-type silicon layer formed in the portion of the planar silicon layer underneath the pillar-shaped first-conductive-type silicon layer.

The present invention also provides a semiconductor device which comprises: a planar semiconductor layer formed on a substrate, wherein the planar semiconductor layer has a second-conductive-type semiconductor layer formed therein and a metal-semiconductor compound formed on the second-conductive-type semiconductor layer; a pillar-shaped first-conductive-type semiconductor layer formed on the planar semiconductor layer, wherein the pillar-shaped first-conductive-type semiconductor layer has a second-conductive-type semiconductor layer formed in an upper portion thereof and a metal-semiconductor compound formed on the second-conductive-type semiconductor layer; a gate dielectric film formed around the pillar-shaped first-conductive-type semiconductor layer; a gate electrode formed to surround the gate dielectric film, the gate electrode having a metal-semiconductor compound formed thereon; and a sidewall-shaped dielectric film formed on each of an upper region of a sidewall of the pillar-shaped first-conductive-type semiconductor layer and in contact with a top of the gate electrode, and a sidewall of the gate electrode. Thus, different voltages can be applied to respective ones of the second-conductive-type semiconductor layer formed in a portion of the planar semiconductor layer underneath the pillar-shaped first-conductive-type semiconductor layer, the gate electrode and the second-conductive-type semiconductor layer formed in the upper portion of the pillar-shaped first-conductive-type semiconductor layer. This makes it possible to reduce a resistance of each of the second-conductive-type semiconductor layer formed in a portion of the planar semiconductor layer underneath the pillar-shaped first-conductive-type semiconductor layer, the gate electrode and the second-conductive-type semiconductor layer formed in the upper portion of the pillar-shaped first-conductive-type semiconductor layer.

In a preferred embodiment of the present invention, a distance between a central axis of the pillar-shaped first-conductive-type semiconductor layer and a lateral end of the planar semiconductor layer is greater than a sum of: a distance between the central axis and the sidewall of the pillar-shaped first-conductive-type semiconductor layer; a thickness of the gate dielectric film; a thickness of the gate electrode; and a thickness of the sidewall-shaped dielectric film formed on the sidewall of the gate electrode. This makes it possible to form a metal-semiconductor compound on the second-conductive-type semiconductor layer formed in the portion of the planar semiconductor layer underneath the pillar-shaped first-conductive-type semiconductor layer, so that a resistance of the second-conductive-type semiconductor layer formed in the portion of the planar semiconductor layer underneath the pillar-shaped first-conductive-type semiconductor layer can be reduced.

In a preferred embodiment of the present invention, a thickness of the gate electrode is greater than that of the sidewall-shaped dielectric film formed on the upper region of the sidewall of the pillar-shaped first-conductive-type semiconductor layer and in contact with the top of the gate electrode. This makes it possible to form a metal-semiconductor compound on the gate electrode, so that a resistance of the gate electrode can be reduced.

What is claimed is:

1. A semiconductor device comprising:
   a planar semiconductor layer on a substrate, the planar semiconductor layer having a second-conductive-type semiconductor layer therein and a metal-semiconductor compound on the second-conductive-type semiconductor layer;
   a pillar-shaped first-conductive-type semiconductor layer in contact with the substrate and extending from the planar semiconductor layer, the pillar-shaped first-conductive-type semiconductor layer having a second-conductive-type semiconductor layer in an upper portion thereof and a metal-semiconductor compound on the second-conductive-type semiconductor layer;
   a gate dielectric film in contact with the pillar-shaped first-conductive-type semiconductor layer;
   a gate electrode surrounding the pillar-shaped first-conductive-type semiconductor layer and separated therefrom by the gate dielectric film, the gate electrode having a metal-semiconductor compound thereon; and
   a sidewall-shaped dielectric film on each of an upper region of a sidewall of the pillar-shaped first-conductive-type semiconductor layer and in contact with a top of the gate electrode, and a sidewall of the gate electrode.

2. The semiconductor device as defined in claim 1, wherein a distance between a central axis of the pillar-shaped first-conductive-type semiconductor layer and a lateral end of the planar semiconductor layer is greater than a sum of: a distance between the central axis and the sidewall of the pillar-shaped first-conductive-type semiconductor layer; a thickness of the gate dielectric film; a thickness of the gate electrode; and a thickness of the sidewall-shaped dielectric film formed on the sidewall of the gate electrode.

3. The semiconductor device as defined in claim 1, wherein a thickness of the gate electrode is greater than that of the sidewall-shaped dielectric film formed on the upper region of the sidewall of the pillar-shaped first-conductive-type semiconductor layer and in contact with the top of the gate electrode.

* * * * *